(12) United States Patent
DeHaven

(10) Patent No.: US 7,538,557 B2
(45) Date of Patent: May 26, 2009

(54) ARC FAULT AND GROUND FAULT CIRCUIT INTERRUPTER TESTER APPARATUS AND METHOD

(76) Inventor: Jeffrey L. DeHaven, 16121 Tonkel Rd., Leo, IN (US) 46765

( * ) Notice: Subject to any disclaimer, the term of this patent is extended or adjusted under 35 U.S.C. 154(b) by 0 days.

(21) Appl. No.: 11/928,637

(22) Filed: Oct. 30, 2007

(65) Prior Publication Data

US 2008/0169824 A1    Jul. 17, 2008

Related U.S. Application Data

(63) Continuation of application No. 11/347,992, filed on Feb. 6, 2006, now Pat. No. 7,345,489.

(60) Provisional application No. 60/650,684, filed on Feb. 7, 2005.

(51) Int. Cl.
    *G01R 31/08*    (2006.01)
    *H01H 9/50*     (2006.01)

(52) U.S. Cl. .......................... 324/509; 324/536; 361/42
(58) Field of Classification Search ................. 324/509, 324/536; 361/42
    See application file for complete search history.

(56) References Cited

U.S. PATENT DOCUMENTS

| 5,515,218 | A | 5/1996 | DeHaven |
| 6,128,169 | A * | 10/2000 | Neiger et al. .................. 361/42 |
| 6,731,217 | B1 | 5/2004 | Warner |
| 2005/0286184 | A1 | 12/2005 | Campolo |

* cited by examiner

*Primary Examiner*—Vincent Q Nguyen
(74) *Attorney, Agent, or Firm*—Baker & Daniels LLP

(57) ABSTRACT

Circuit tester apparatuses for identifying arc fault and/or ground fault current leakage on an electrical circuit. The circuit tester apparatuses may have two or three pairs of tester lead wires for connection to the electrical circuit. The tester lead wires are mounted in a housing and are connected in series.

15 Claims, 82 Drawing Sheets

FIG_8

Ground Faults on Neutral Are Not Detectable Unless Neutral is Opened

5 mA ground fault on neutral

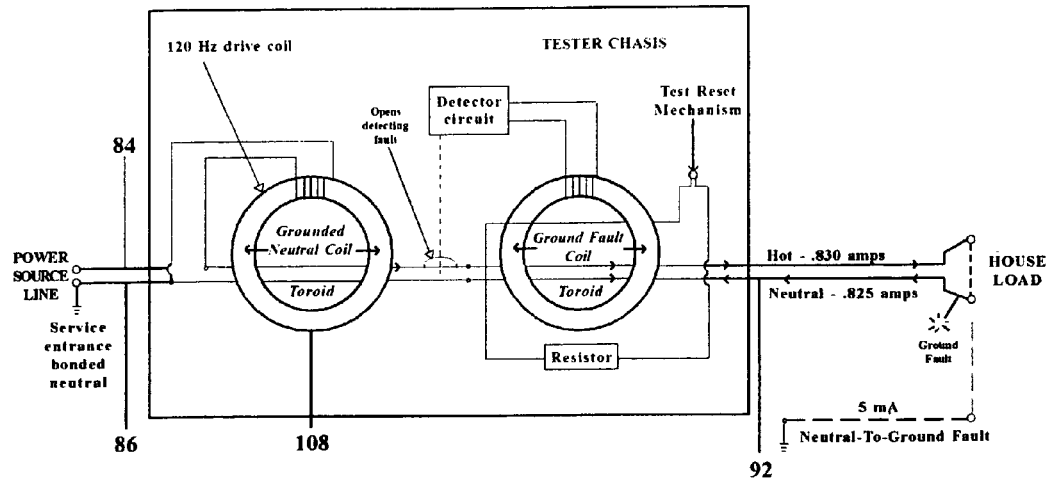

EXAMPLE:
120 volts on neutral
5 mA ground fault
100' foot circuit
12 copper wire @ 2 ohms per thousand feet
100 watt light bulb MATH:
120 volts ÷ 33 ohms = 3.6 amps 120 volts ÷ 0.005 milliamperes = 24,000 ohms

IMPORTANT FACTS:

1- A 0-34 ohm ground fault on the neutral cannot be detected unless circuit neutral is opened.

2- A ground fault on neutral must be 727 times as large as a ground fault on hot to be detected.

3- Voltage drop through a load makes ground faults on the neutral appear much smaller than they are due to lower resistance created from arc tracking. Whereas, a ground fault on the neutral will not show until the resistance reaches 33 ohms or greater or 3.6 amps.

4- Lightning / power surges typically discharge through the neutral conductor because its grounded to earth.

5- With or without a load present on the neutral, a 1000 volt power surge increases the size of a 33 ohm - 5mA ground fault by 6,024 times or 30 amps.

6- With a load present on the hot, a 1000 volt power surge reduces its size and amperage through the load.

FIG.11

STANDARD OR TYPICAL ELECTRICAL SYSTEM CIRCUITRY

FIG_13

FIG_14

STANDARD OR TYPICAL BREAKER PANEL

AND

TEST #1 - ARC FAULT CIRCUIT TESTER & METHOD

Four Lead Circuit Test

FIG_15

TEST #1 SUPPLEMENT A
ARC FAULT CIRCUIT TESTER & METHOD

Characteristics

LINE Hot     (Black) Power Source
LINE Neutral (Green) Power Source

LOAD Hot -     Tester Lead (Red)
LOAD Neutral - Tester Lead (White)

LOAD Hot -     House Circuit
LOAD Neutral - House Circuit
GROUND -       House Circuit

Four Lead Circuit Test

Instructions:

Attach four test leads:

Power Source
- LINE - Hot
- LINE - Neutral
- Ground

Test Loads
- LOAD - Hot (red) — — — — —
- LOAD - Neutral (white) — —

House Loads
- House LOAD - Hot — — — —
- House LOAD - Neutral —

FIG. 15A

TEST #1 - SUPPLEMENT B
ARC FAULT CIRCUIT TESTER & METHOD

*Purpose:*           *Purpose:*

30 mA
PRIMARY ARC FAULT TEST

Tests For Ground Faults:

30 mA & Above (0-4000 ohms)

1- on circuit load hot
2- on appliance hot
3- on switch leg hot
4- on circuit load neutral
5- on appliance neutral

Tests For Arc Faults:

(50 amps and above)

1- Line to line (parallel) arcing
2- 30 mA hot/neutral arcing to ground
3- 1 & 2 anywhere on circuit

---

50 mA
SECONDARY ARC FAULT TEST

Tests For Ground Faults:

50 mA & Above (0-2400 ohms)

1- on circuit load hot
2- on appliance hot
3- on switch leg hot
4- on circuit load neutral
5- on appliance neutral

Tests For Arc Faults:

(70 amps and above)

1- Line to line (parallel) arcing
2- 50 mA hot/neutral arcing to ground
3- 1 & 2 anywhere on circuit

*Criteria:*

1- Recommended test load is 75 to 100 watts for 30 + seconds.
2- Switches must be on.
3- 3-ways must be tested twice (both ends).
4- 4-ways must be tested three times (all ends).

FIG. 15B

STANDARD OR TYPICAL BREAKER PANEL

AND

<u>TEST #2</u> - ARC FAULT CIRCUIT TESTER & METHOD

Open Neutral Test

TEST #2 SUPPLEMENT A
ARC FAULT CIRCUIT TESTER & METHOD

Characteristics

LINE Hot (Black) Power Source
LINE Neutral (Green) Power Source

LOAD Hot - Tester Lead (Red)
LOAD Neutral - Tester Lead (White)

LOAD Hot - House Circuit
LOAD Neutral - House Circuit
GROUND - House Circuit

Open Neutral Test

Instructions:

Remove LOAD <u>neutral</u> test lead
(white) from house circuit neutral.

Power Source
- LINE - Hot
- LINE - Neutral -
- Ground

Detach Tester Neutral
- LOAD -Hot (red) — — — — —
- ~~LOAD Neutral (white)~~

Detach House Neutral
- House LOAD - Hot — — — — —
- ~~House LOAD - Neutral~~

FIG. 16A

TEST #2 - SUPPLEMENT B
ARC FAULT CIRCUIT TESTER & METHOD

*Purpose:*

30 mA
PRIMARY ARC FAULT TEST

Tests For Ground Faults:

30 mA & Above 1- on load hot
2- on load neutral

Switch must be on
- 3- on switched neutral
- 4- on switched hot
- 5- on appliance hot
- 6- on appliance neutral

Tests For Arc Faults:

(50 amps and above)

1- Line to line (parallel) arcing
2- 30 mA hot/neutral arcing to ground
3- 1 & 2 anywhere on circuit

*Purpose:*

50 mA
SECONDARY ARC FAULT TEST

Tests For Ground Faults:

50 mA & Above 1- on load hot
2- on load neutral

Switch must be on
- 3- on switched neutral
- 4- on switched hot
- 5- on appliance hot
- 6- on appliance neutral

Tests For Arc Faults:

(70 amps and above)

1- Line to line (parallel) arcing
2- 50 mA hot/neutral arcing to ground
3- 1 & 2 anywhere on circuit

*Criteria:*

1- Recommended test load is 75 to 100 watts for 30 + seconds.
2- Switches must be on.
3- 3-ways must be tested twice (both ends).
4- 4-ways must be tested three times (all ends).

FIG_16B

STANDARD OR TYPICAL BREAKER PANEL

AND

<u>TEST #3</u> - ARC FAULT CIRCUIT TESTER & METHOD

Reverse Polarity Test

TEST #3 SUPPLEMENT A
ARC FAULT CIRCUIT TESTER & METHOD

Characteristics

LINE Hot     (Black)  Power Source
LINE Neutral (Green)  Power Source

LOAD Hot -     Tester Lead (Red)
LOAD Neutral - Tester Lead (White)

LOAD Hot -       House Circuit
LOAD Neutral -   House Circuit
GROUND -         House Circuit

Reverse Polarity Test

Instructions:

Reverse test leads on house load circuit.

Power Source
- LINE - Hot
- LINE - Neutral -
  - Ground

Reverse Leads
- LOAD - Neutral (white) — — — ┐
- LOAD - Hot (red) — — — ┐ │

Reverse Leads
- House LOAD - Neutral — ┘ │
- House LOAD - Hot — — — — ┘

FIG.17A

TEST #3 - SUPPLEMENT B
ARC FAULT CIRCUIT TESTER & METHOD

*Purpose:*

30 mA
PRIMARY ARC FAULT TEST

Tests For Ground Faults:

30 mA & Above 1- on load hot
2- on load neutral

Switch must be on
- 3- on switch hot
- 4- on appliance hot
- 5- on switched load neutral
- 6- on appliance neutral

Tests For Arc Faults:

(50 amps and above)

1- Line to line (parallel) arcing.
2- 30 mA hot/neutral arcing to ground.
3- 1 & 2 anywhere on circuit.
4- Series arcing over 50amps.

*Purpose:*

50 mA
SECONDARY ARC FAULT TEST

Tests For Ground Faults:

50 mA & Above 1- on load hot
2- on load neutral

Switch must be on
- 3- on switch hot
- 4- on appliance hot
- 5- on switched load neutral
- 6- on appliance neutral

Tests For Arc Faults:

(70 amps and above)

1- Line to line (parallel) arcing.
2- 50 mA hot/neutral arcing to ground.
3- 1 & 2 anywhere on circuit.
4- Series arcing over 50amps.

*Criteria:*

1- Recommended test load is 75 to 100 watts for 30 + seconds.
2- Switches must be on.
3- 3-ways must be tested twice (both ends).
4- 4-ways must be tested three times (all ends).

FIG_17B

STANDARD OR TYPICAL BREAKER PANEL

AND

TEST # 4 - ARC FAULT CIRCUIT TESTER & METHOD

Grounded Hot Test

TEST #4 SUPPLEMENT-A
ARC FAULT CIRCUIT TESTER & METHOD

Characteristics

LINE Hot     (Black)  Power Source
LINE Neutral (Green)  Power Source

LOAD Hot -     Tester Lead (Red)
LOAD Neutral - Tester Lead (White)

LOAD Hot -     House Circuit
LOAD Neutral - House Circuit
GROUND -       House Circuit

Grounded Hot Test

Instructions:

1- Detach neutral house load.
2- Drop (red) test lead.
3- Attach test lead (white) load neutral to house load hot.

Power Source
 ⌐ LINE 1- Hot
 ⌊ LINE 2- Neutral
         - Ground

Tester Loads
 ⌐ —Tester Lead - Neutral
 |  ~~Tester Lead - Hot~~

House Load
 |  ~~House LOAD -Neutral~~
 ⌊ — House LOAD -Hot

FIG_18A

TEST #4 - SUPPLEMENT B
ARC FAULT CIRCUIT TESTER & METHOD

*Purpose:*

30 mA
PRIMARY ARC FAULT TEST

Tests For Ground Faults:

30 mA & Above 1- on load hot

Switch must be on
- 2- on appliance load hot
- 3- on switched load hot

Tests For Arc Faults:

(50 amps and above)

1- Line to line (parallel) arcing
2- 30 mA hot/neutral arcing to ground
3- 1 & 2 anywhere on circuit

*Purpose:*

50 mA
SECONDARY ARC FAULT TEST

Tests For Ground Faults:

50 mA & Above 1- on load hot

Switch must be on
- 2- on appliance load hot
- 3- on switched load hot

Tests For Arc Faults:

(70 amps and above)

1- Line to line (parallel) arcing
2- 50 mA hot/neutral arcing to ground
3- 1 & 2 anywhere on circuit

*Criteria:*

1- Recommended test load is 75 to 100 watts for 30 + seconds.
2- Switches must be on.
3- 3-ways must be tested twice (both ends).
4- 4-ways must be tested three times (all ends).

FIG.18B

STANDARD OR TYPICAL BREAKER PANEL

AND

<u>TEST #5</u> - ARC FAULT CIRCUIT TESTER & METHOD

Grounded Neutral Test

TEST #5 SUPPLEMENT - A
ARC FAULT CIRCUIT TESTER & METHOD

*Characteristics*

LINE Hot     (Black) Power Source
LINE Neutral (Green) Power Source

LOAD Hot -     Tester Lead (Red)
LOAD Neutral - Tester Lead (White)

LOAD Hot -     House Circuit
LOAD Neutral - House Circuit
GROUND -       House Circuit

Grounded Neutral Test

*Instructions:*

1- Attach tester load hot (red lead) to house neutral load.
2- <u>Do not</u> attach tester load neutral (white lead) or house load hot for this test.

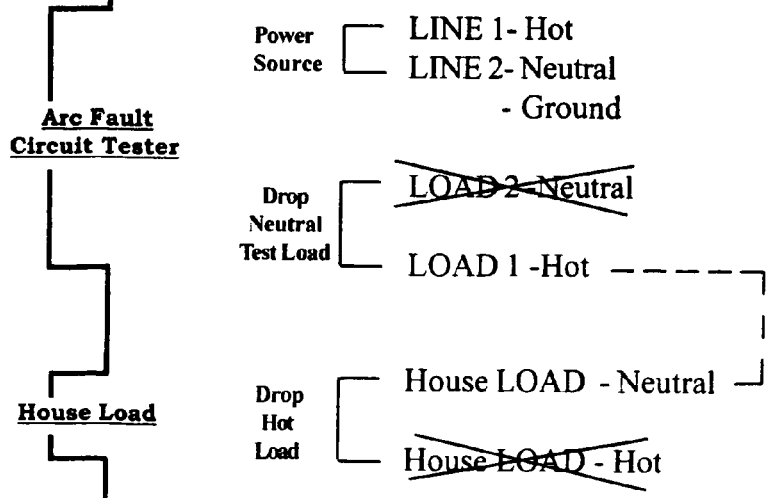

FIG.19A

TEST #5 - SUPPLEMENT B
ARC FAULT CIRCUIT TESTER & METHOD

*Purpose:*

30 mA
PRIMARY ARC FAULT TEST

Tests For Ground Faults:

30 mA & Below 1- on load neutral / hot

Switch must be on
- 2- on appliance neutral / hot
- 3- on switched neutral / hot

Tests For Arc Faults:

(50 amps and above)

1- Line to line (parallel) arcing
2- 30 mA hot/neutral arcing to ground
3- 1 & 2 anywhere on circuit

*Purpose:*

50 mA
SECONDARY ARC FAULT TEST

Tests For Ground Faults:

50 mA & Below 1- on load neutral / hot

Switch must be on
- 2- on appliance neutral / hot
- 3- on switched neutral / hot

Tests For Arc Faults:

(70 amps and above)

1- Line to line (parallel) arcing
2- 50 mA hot/neutral arcing to ground
3- 1 & 2 anywhere on circuit

*Criteria:*

1- Recommended test load is 75 to 100 watts for 30 + seconds.
2- Switches must be on.
3- 3-ways must be tested twice (both ends).
4- 4-ways must be tested three times (all ends).

FIG.19B

STANDARD OR TYPICAL BREAKER PANEL

AND

TEST # 6 - (ARC FAULT) CIRCUIT TESTER & METHOD

Closed Circuit Test

TEST #6 SUPPLEMENT - A
ARC FAULT CIRCUIT TESTER & METHOD

Characteristics

LINE Hot      (Black)  Power Source
LINE Neutral  (Green)  Power Source

LOAD Hot -    Tester Lead (Red)
LOAD Neutral - Tester Lead (White)

LOAD Hot -    House Circuit
LOAD Neutral - House Circuit
GROUND -      House Circuit

Closed Circuit Test

Instructions:

1- Attach tester load hot (red lead) to house load (neutral) and house load (hot), simultaneously.

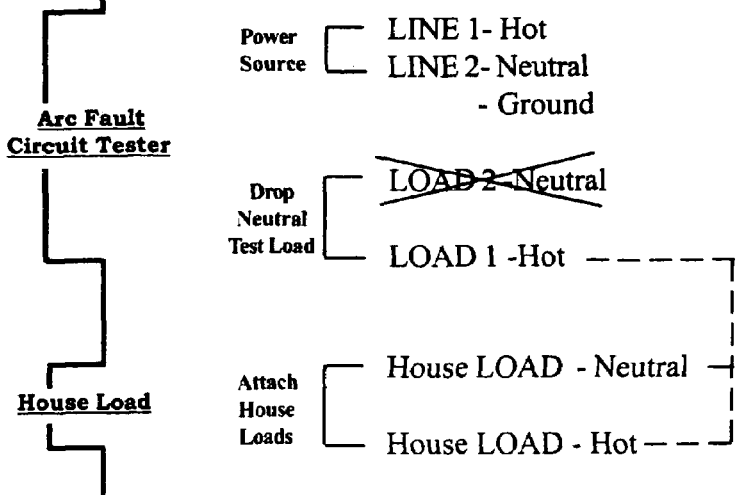

FIG_20A

TEST #6 - SUPPLEMENT B
ARC FAULT CIRCUIT TESTER & METHOD

*Purpose:*                                       *Purpose:*

| 30 mA<br>PRIMARY ARC FAULT TEST | 50 mA<br>SECONDARY ARC FAULT TEST |
|---|---|
| Tests For Ground Faults:<br>30 mA & Above<br><br>1- on circuit load hot<br>2- on appliance hot<br>3- on switch leg hot<br>4- on circuit load neutral<br>5- on appliance neutral<br><br>Tests For Arc Faults:<br>(50 amps and above)<br><br>1- Line to line (parallel) arcing<br>2- 30 mA hot/neutral arcing to ground<br>3- 1 & 2 anywhere on circuit | Tests For Ground Faults:<br>50 mA & Above<br><br>1- on circuit load hot<br>2- on appliance hot<br>3- on switch leg hot<br>4- on circuit load neutral<br>5- on appliance neutral<br><br>Tests For Arc Faults:<br>(70 amps and above)<br><br>1- Line to line (parallel) arcing<br>2- 50 mA hot/neutral arcing to ground<br>3- 1 & 2 anywhere on circuit |

*Criteria:*

1- Recommended test load is 75 to 100 watts for 30 + seconds.
2- Switches must be on.
3- 3-ways must be tested twice (both ends).
4- 4-ways must be tested three times (all ends).

FIG. 20B

**ARC FAULT AND GROUND FAULT
CIRCUIT TEST MONITORING SYSTEM (CTMS)**
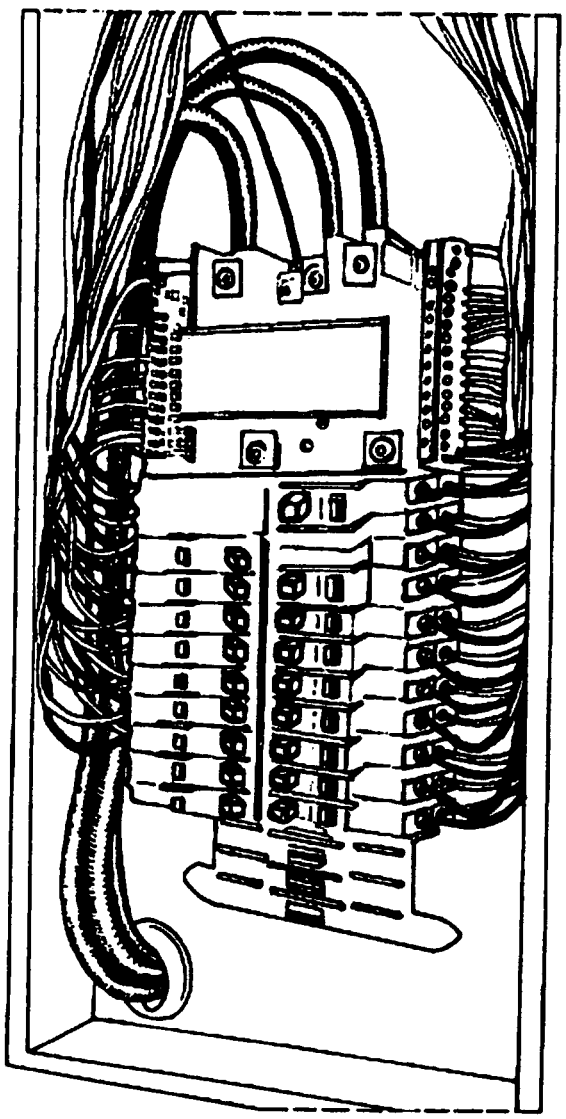
FIG_22A

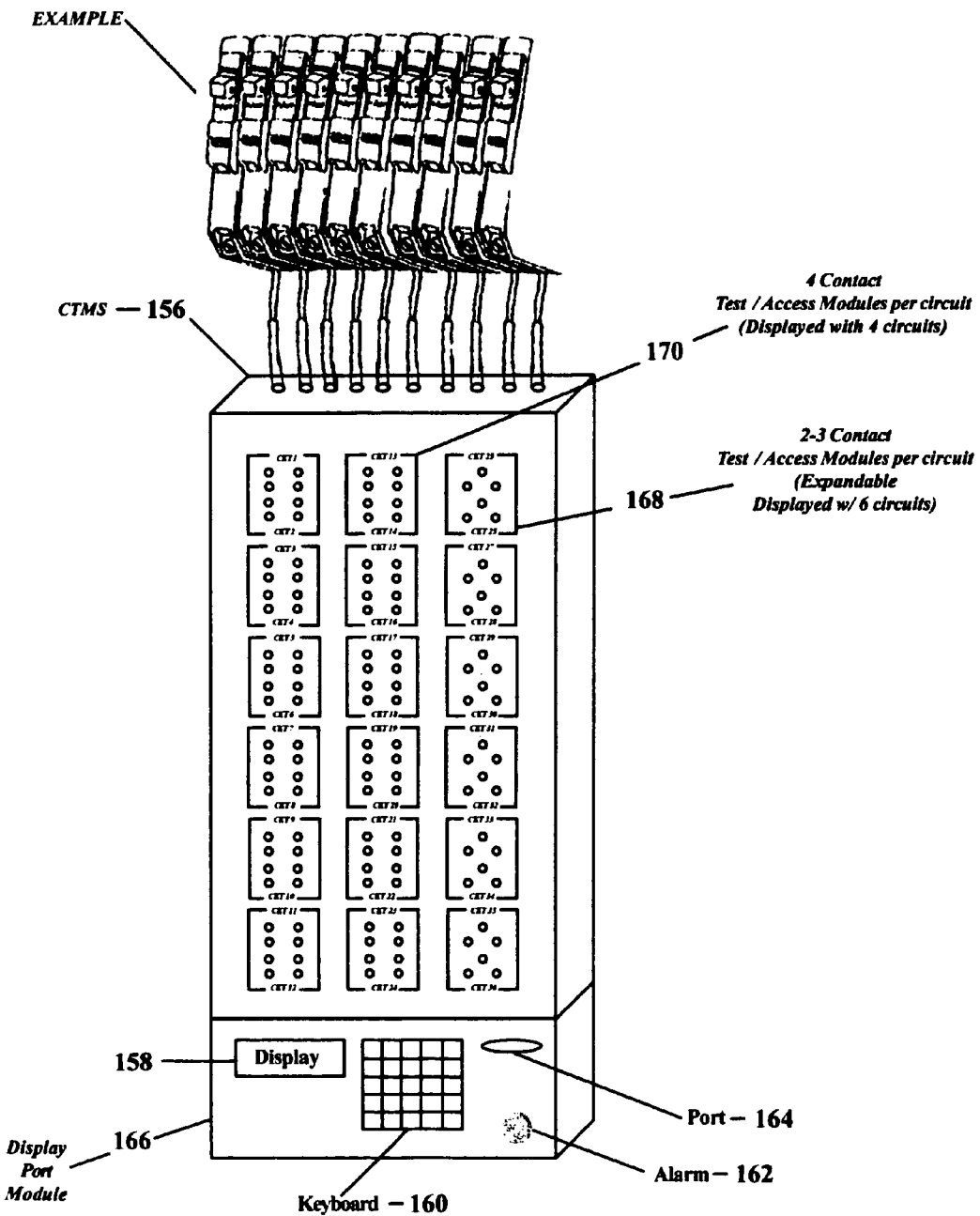
AXILLARY
CIRCUIT TEST MONITORING STATION (CTMS)
FIG_22B (CTMS) SIGNAL TEST INJECTORS

(CTMS) SIGNAL TEST INJECTOR

(CTMS) ACCESSORIES

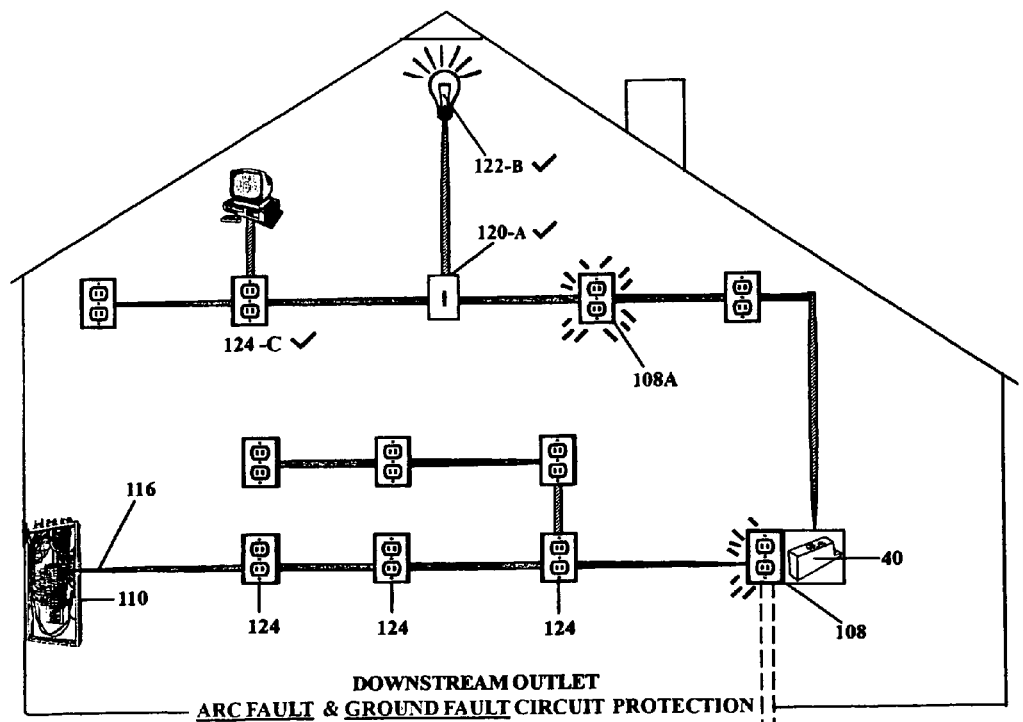
FIG_24
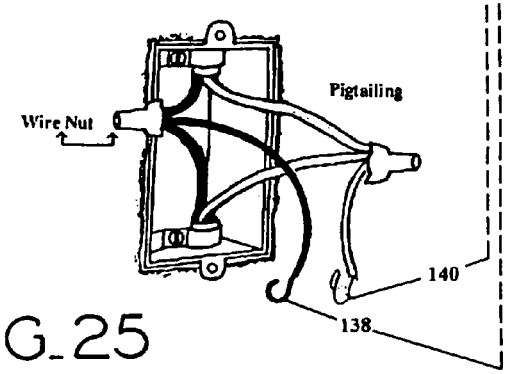
FIG_25

TROUBLESHOOTING METHOD OF INVENTION

STANDARD OR TYPICAL BREAKER PANEL

AND

TEST #7 - (GROUND FAULT) CIRCUIT TESTER & METHOD

Four Lead Circuit Test

TEST # 7 SUPPLEMENT A
GROUND FAULT CIRCUIT TESTER & METHOD

Characteristics

LINE Hot (Black) Power Source
LINE Neutral (Green) Power Source

LOAD Hot - Tester Lead (Red)
LOAD Neutral - Tester Lead (White)

LOAD Hot - House Circuit
LOAD Neutral - House Circuit
GROUND - House Circuit

Closed Circuit Test

*Instructions:*

Attach four test leads:

Power Source:
- LINE - Hot
- LINE - Neutral
  - Ground

Test Loads:
- LOAD - Hot (red) — — — — — ┐
- LOAD - Neutral (white) — — ┐ |

House Loads:
- House LOAD - Hot — — — — ┘ |
- House LOAD - Neutral — — ┘

FIG. 28A

TEST # 7 - SUPPLEMENT B
GROUND FAULT CIRCUIT TESTER & METHOD

*Purpose:*                        *Purpose:*

PRIMARY GROUND FAULT TEST

(5 mA & Above)

Tests For Ground Faults:

1- on circuit load hot
2- on appliance hot
3- on switch leg hot
4- on circuit load neutral
5- on appliance neutral

Tests For Hot To Hot Faults:

(4 ohms or less)

1- on circuit load hot

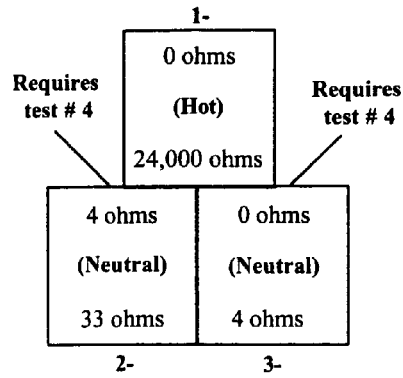

SECONDARY GROUND FAULT TEST

(20 mA & Above)

Tests For Ground Faults:

1- on circuit load hot
2- on appliance hot
3- on switch leg hot
4- on circuit load neutral
5- on appliance neutral

Tests For Hot To Hot Faults:

(4 ohms or less)

1- on circuit load hot

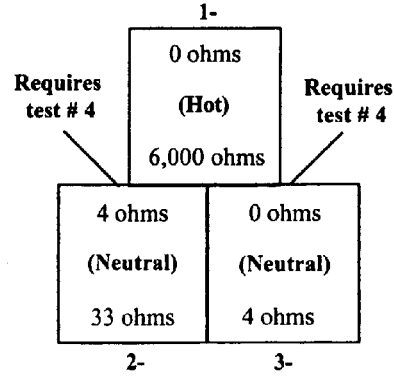

*Specifics:*

1 - Circuit tester contains ONE toroids for hot conductor & ONE toroid for neutral conductor.

2- Neutral load increases ground fault potential.
3- Ground fault resistance remains constant.
4- Switches must be turned on.
5- 3-ways & 4-ways are tested at both ends.

FIG. 28B

STANDARD OR TYPICAL BREAKER PANEL
AND
TEST #8 - (GROUND FAULT) CIRCUIT TESTER & METHOD
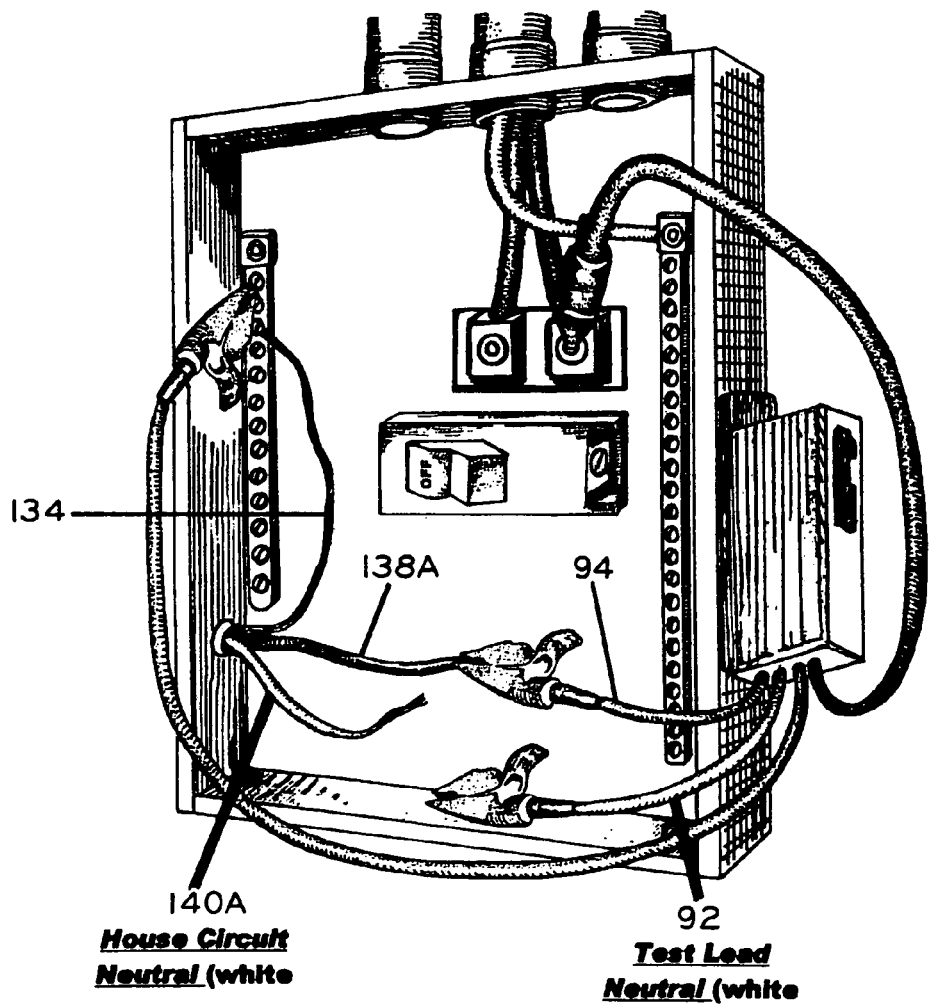
FIG_29

TEST # 8 SUPPLEMENT A
GROUND FAULT CIRCUIT TESTER & METHOD

Characteristics

LINE Hot     (Black) Power Source
LINE Neutral (Green) Power Source

LOAD Hot -     Tester Lead (Red)
LOAD Neutral - Tester Lead (White)

LOAD Hot -     House Circuit
LOAD Neutral - House Circuit
GROUND -     House Circuit

Open Neutral Test

*Instructions:*

Remove LOAD neutral test lead (white) from house circuit neutral.

TEST # 8 - SUPPLEMENT B
GROUND FAULT CIRCUIT TESTER & METHOD

*Purpose:*  *Purpose:*

GROUND FAULT TEST
(5 mA & Above)

Tests For Ground Faults:

1- on load hot
2- on load neutral

Switch must be on:
  3- on switched neutral
  4- on switched hot
  5- on appliance hot
  6- on appliance neutral

Tests For Hot To Hot Faults:

(4 ohms or less)

1- on circuit load hot

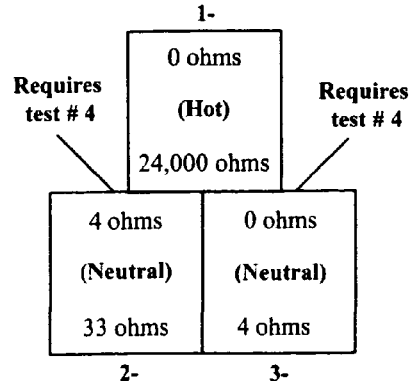

Requires test # 4 — 0 ohms (Hot) 24,000 ohms — Requires test # 4

| 4 ohms (Neutral) 33 ohms | 0 ohms (Neutral) 4 ohms |
| 2- | 3- |

GROUND FAULT TEST
(20 mA & Above)

Tests For Ground Faults:

1- on load hot
2- on load neutral

Switch must be on:
  3- on switched neutral
  4- on switched hot
  5- on appliance hot
  6- on appliance neutral

Tests For Hot To Hot Faults:

(4 ohms or less)

1- on circuit load hot

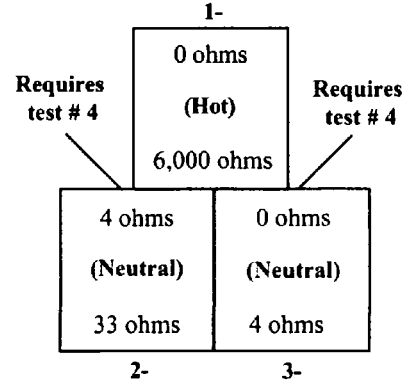

Requires test # 4 — 0 ohms (Hot) 6,000 ohms — Requires test # 4

| 4 ohms (Neutral) 33 ohms | 0 ohms (Neutral) 4 ohms |
| 2- | 3- |

FIG. 29B

STANDARD OR TYPICAL BREAKER PANEL

AND

TEST #9 - (GROUND FAULT) CIRCUIT TESTER & METHOD

Open HOT Test

TEST # 9 SUPPLEMENT A
GROUND FAULT CIRCUIT TESTER & METHOD

Characteristics

LINE Hot     (Black)  Power Source
LINE Neutral (Green)  Power Source

LOAD Hot -    Tester Lead (Red)
LOAD Neutral - Tester Lead (White)

LOAD Hot -       House Circuit
LOAD Neutral - House Circuit
GROUND -         House Circuit

Open HOT Test

Instructions:

1- Detach LOAD <u>hot</u> tester lead (red) from house circuit hot.

Power Source
- LINE - Hot
- LINE - Neutral
- Ground

Detach Tester Hot
- ~~LOAD - Hot (red)~~
- LOAD - Neutral (white) - - - -

Detach House Hot
- ~~House LOAD - Hot~~
- House LOAD - Neutral - - - -

FIG. 30A

TEST # 9 - SUPPLEMENT B
GROUND FAULT CIRCUIT TESTER & METHOD

*Purpose:*                  *Purpose:*

GROUND FAULT TEST
(5 mA & Above)

Tests For Ground Faults:

1- on load neutral

Switch must be on
- 2- on appliance neutral
- 3- on switch load neutral

Tests For Hot To Hot Faults:

(4 ohms or less)

1- on circuit load hot

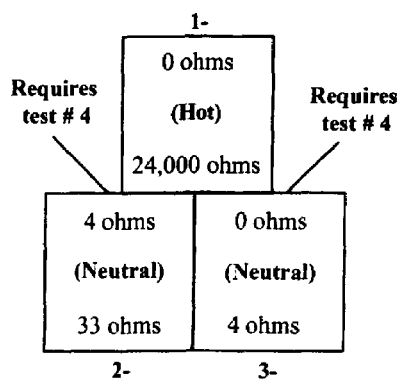

GROUND FAULT TEST
(20 mA & Above)

Tests For Ground Faults:

1- on load neutral

Switch must be on
- 2- on appliance neutral
- 3- on switch load neutral

Tests For Hot To Hot Faults:

(4 ohms or less)

1- on circuit load hot

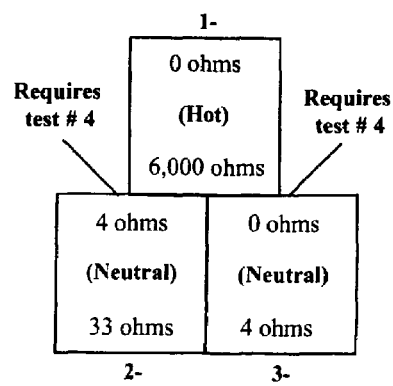

FIG. 30B

STANDARD OR TYPICAL BREAKER PANEL

AND

TEST # 10 - (GROUND FAULT) CIRCUIT TEST & METHOD

FIG_31

TEST # 10 SUPPLEMENT A
GROUND FAULT CIRCUIT TESTER & METHOD

Characteristics

LINE Hot     (Black)  Power Source
LINE Neutral (Green) Power Source

LOAD Hot -    Tester Lead (Red)
LOAD Neutral - Tester Lead (White)

LOAD Hot -    House Circuit
LOAD Neutral - House Circuit
GROUND -     House Circuit

Reverse Polarity Test

Instructions:

Reverse test leads on house _load_ circuit.

Power Source
- LINE - Hot
- LINE - Neutral -
  - Ground

Reverse Leads
- LOAD - Neutral (white) -----
- LOAD - Hot (red) -----

Reverse Leads
- House LOAD - Neutral ---
- House LOAD - Hot -----

FIG.31A

TEST # 10 - SUPPLEMENT B
GROUND FAULT CIRCUIT TESTER & METHOD

*Purpose:*

GROUND FAULT TEST
(5 mA & Above)

Tests For Ground Faults:

1- on load hot
2- on appliance neutral

Switch must be on
- 3- on switched load neutral
- 4- on switch hot
- 5- on appliance hot
- 6- on appliance neutral

Tests For Hot To Hot Faults:

(4 ohms or less)

1- on circuit load hot

```
              1-
        ┌─────────────┐
        │   0 ohms    │
Requires│             │Requires
test # 4│   (Hot)     │test # 4
        │             │
        │ 24,000 ohms │
        └─────────────┘
   ┌──────────┬──────────┐
   │ 4 ohms   │ 0 ohms   │
   │(Neutral) │(Neutral) │
   │ 33 ohms  │ 4 ohms   │
   └──────────┴──────────┘
       2-          3-
```

*Purpose:*

GROUND FAULT TEST
(20 mA & Above)

Tests For Ground Faults:

1- on load hot
2- on appliance neutral

Switch must be on
- 3- on switched load neutral
- 4- on switch hot
- 5- on appliance hot
- 6- on appliance neutral

Tests For Hot To Hot Faults:

(4 ohms or less)

1- on circuit load hot

```
              1-
        ┌─────────────┐
        │   0 ohms    │
Requires│             │Requires
test # 4│   (Hot)     │test # 4
        │             │
        │ 6,000 ohms  │
        └─────────────┘
   ┌──────────┬──────────┐
   │ 4 ohms   │ 0 ohms   │
   │(Neutral) │(Neutral) │
   │ 33 ohms  │ 4 ohms   │
   └──────────┴──────────┘
       2-          3-
```

FIG. 31B

STANDARD OR TYPICAL BREAKER PANEL

AND

TEST # 11 - GROUND FAULT CIRCUIT TESTER & METHOD

Grounded Hot Test

TEST # 11 SUPPLEMENT -A
GROUND FAULT CIRCUIT TESTER & METHOD

Characteristics

LINE Hot (Black) Power Source
LINE Neutral (Green) Power Source

LOAD Hot - Tester Lead (Red)
LOAD Neutral - Tester Lead (White)

LOAD Hot - House Circuit
LOAD Neutral - House Circuit
GROUND - House Circuit

Grounded Hot Test

Instructions:

1- Detach neutral house load.
2- Drop (red) test lead.
3- Attach test lead (white) load neutral to house load hot.

Power Source ⌐ LINE 1- Hot
          └ LINE 2- Neutral
                    - Ground Tester Loads ⌐ —Tester Lead - Neutral
             | ~~Tester Lead~~ - Hot House Load ⌐ ~~House LOAD~~ -Neutral
           └ — House LOAD -Hot

FIG.32A

TEST # 11 - SUPPLEMENT B
GROUND FAULT CIRCUIT TESTER & METHOD
*Purpose:*  *Purpose:*
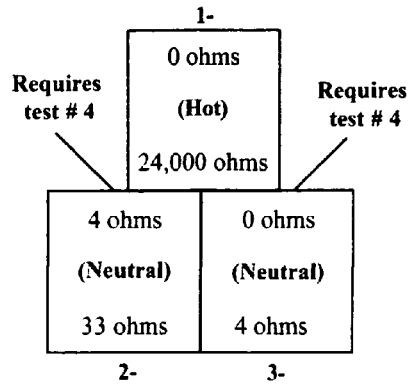
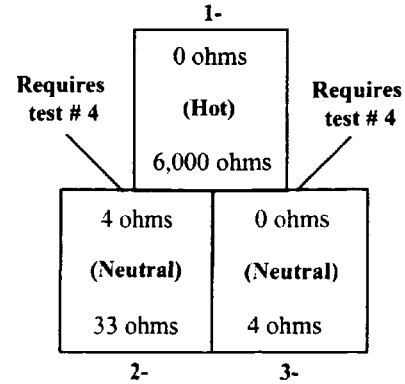
FIG. 32B

STANDARD OR TYPICAL BREAKER PANEL

AND

TEST # 12 - (GROUND FAULT) CIRCUIT TESTER & METHOD

Closed Circuit Test

TEST #12 SUPPLEMENT - A
ARC FAULT CIRCUIT TESTER & METHOD

Characteristics

LINE Hot     (Black)  Power Source
LINE Neutral (Green)  Power Source

LOAD Hot -     Tester Lead (Red)
LOAD Neutral - Tester Lead (White)

LOAD Hot -     House Circuit
LOAD Neutral - House Circuit
GROUND -       House Circuit

Closed Circuit Test

Instructions:

1- Attach tester load hot (red lead) to house load (neutral) and house load (hot), simultaneously.

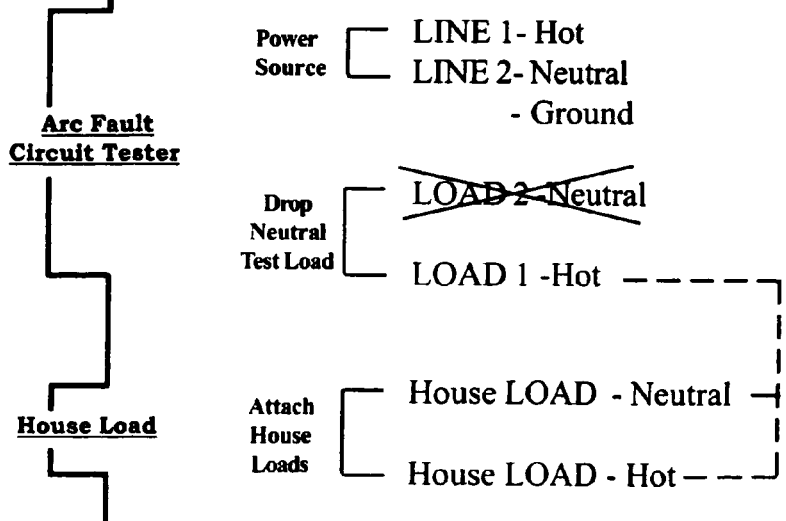

FIG. 33A

TEST #12 - SUPPLEMENT B
GROUND FAULT CIRCUIT TESTER & METHOD
*Purpose:*                                                           *Purpose:*
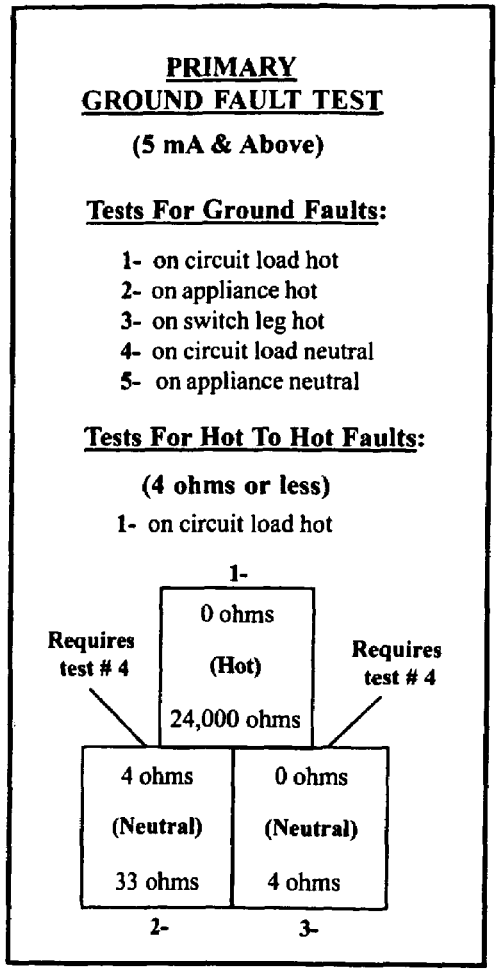
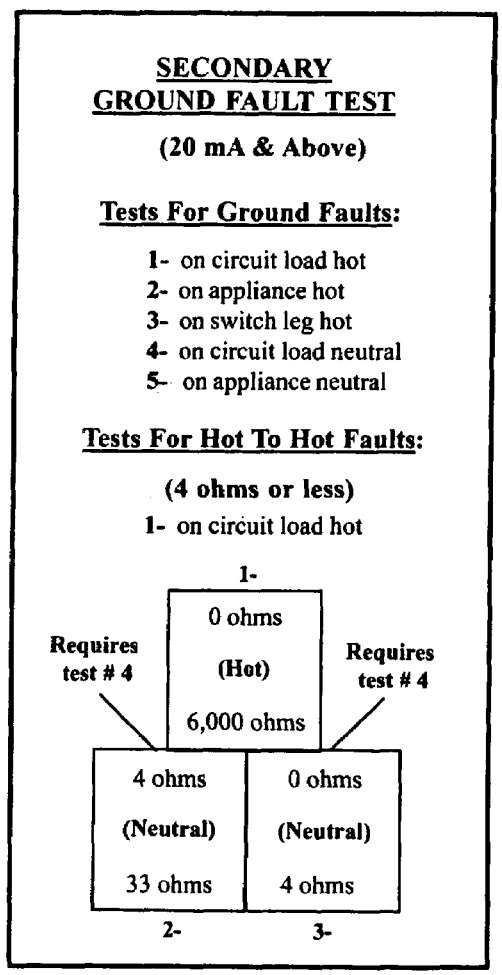
*Specifics:*
1 - Circuit tester contains ONE toroids for hot conductor & ONE toroid for neutral conductor.
2- Neutral load increases ground fault potential.
3- Ground fault resistance remains constant.
4- Switches must be turned on.
5- 3-ways & 4-ways are tested at both ends.
FIG. 33B

STANDARD OR TYPICAL BREAKER PANEL

AND

TEST #13 - (GROUND FAULT) CIRCUIT TESTER & METHOD

Grounded Neutral Test

TEST # 13 SUPPLEMENT - A
GROUND FAULT CIRCUIT TESTER & METHOD

Characteristics

LINE Hot     (Black) Power Source
LINE Neutral (Green) Power Source

LOAD Hot -     Tester Lead (Red)
LOAD Neutral - Tester Lead (White)

LOAD Hot -     House Circuit
LOAD Neutral - House Circuit
GROUND -        House Circuit

Grounded Neutral Test

Instructions:

1- Reverse test leads on house loads.

2- Detach (white) test lead neutral from house circuit (hot) load

Power Source
- LINE 1- Hot
- LINE 2- Neutral
- Ground

Neutral Lead Dropped
- ~~LOAD 2-Neutral~~
- LOAD 1 -Hot — — — — ┐

House Hot Load Dropped
- House LOAD - Neutral ─┘
- ~~House LOAD - Hot~~

FIG. 34A

TEST # 13 - SUPPLEMENT B
GROUND FAULT CIRCUIT TESTER & METHOD

*Purpose:*  *Purpose:*

GROUND FAULT TEST
(5 mA & Above)

Tests For Ground Faults:

1- on load neutral

Switch must be on
2- on appliance neutral
3- on switched neutral

Tests For Hot To Hot Faults:

(4 ohms or less)
1- on circuit load hot

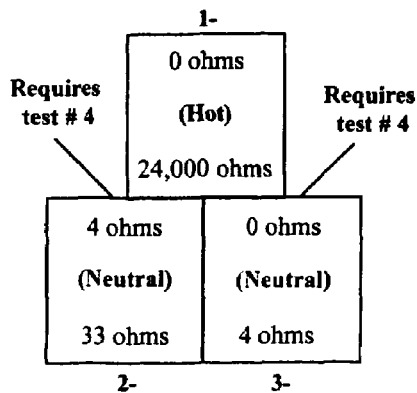

GROUND FAULT TEST
(20 mA & Above)

Tests For Ground Faults:

1- on load neutral

Switch must be on
2- on appliance neutral
3- on switched neutral

Tests For Hot To Hot Faults:

(4 ohms or less)
1- on circuit load hot

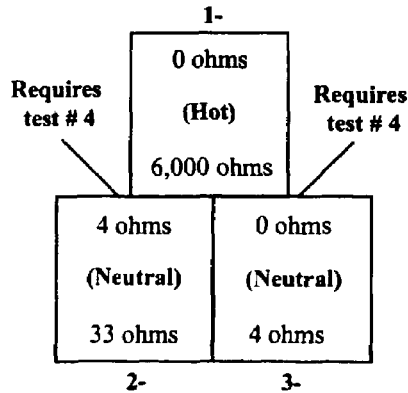

FIG. 34B

STANDARD OR TYPICAL BREAKER PANEL

AND

TEST # 14 - (GROUND FAULT) CIRCUIT TEST

Open Ground Test

TEST #14 SUPPLEMENT - A
GROUND FAULT CIRCUIT TESTER & METHOD
Open Ground Test
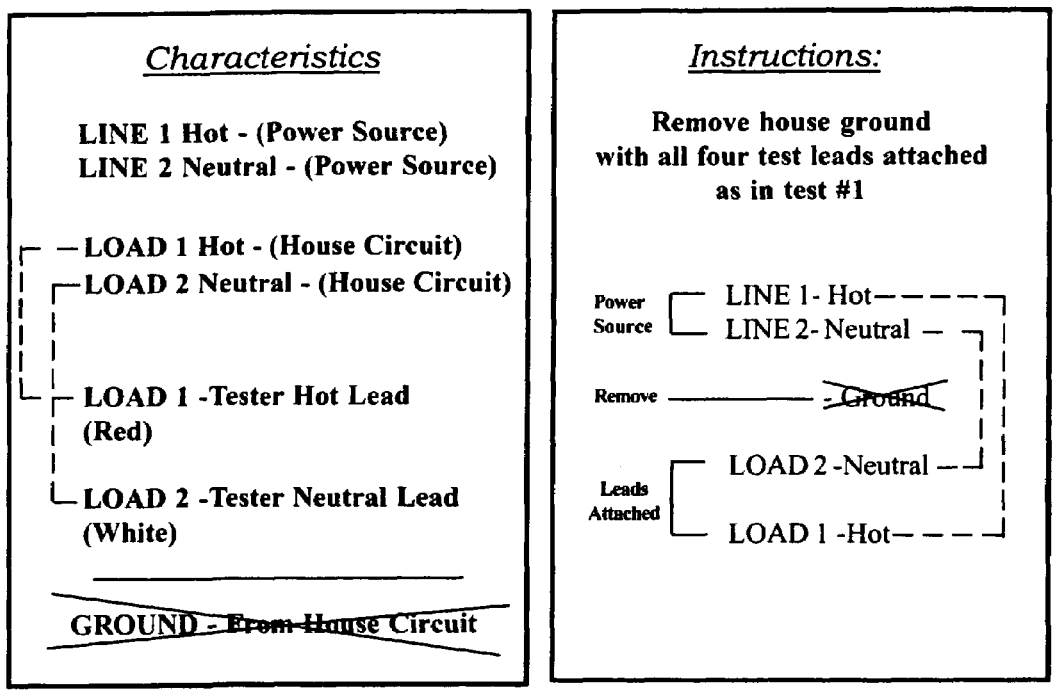
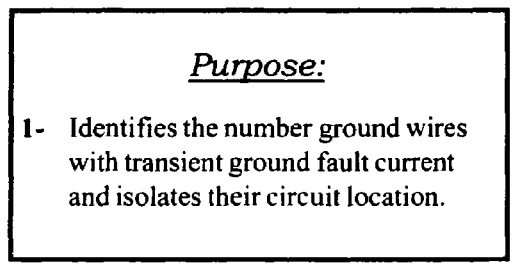
Purpose:
1- Identifies the number ground wires with transient ground fault current and isolates their circuit location.
FIG.35A

STANDARD OR TYPICAL BREAKER PANEL

AND

TEST # 15 - (GROUND FAULT) CIRCUIT TESTER & METHOD

Ungrounded Neutral Test

MATH SUPPLEMENT A

GFCI TESTS (Fig 28 -62)

Figure 38 shows how a 5 - milliampere ground fault does not change in size on the hot conductor regardless of the load amount.
(page 1 of 2 - 100 watt bulb)

MATH SUPPLEMENT B

GFCI TESTS (Fig 28 -62)

Figure 39 shows how 5 - milliampere ground fault
does not change a ground fault on the hot conductor
regardless of load size.
(page 2 of 2 - 300 watt bulb)

FIG_39

FIG_40

MATH SUPPLEMENT D
*Figure 41 shows an example of how a ground fault on neutral is load dependent.*
*(page 2 of 2)*
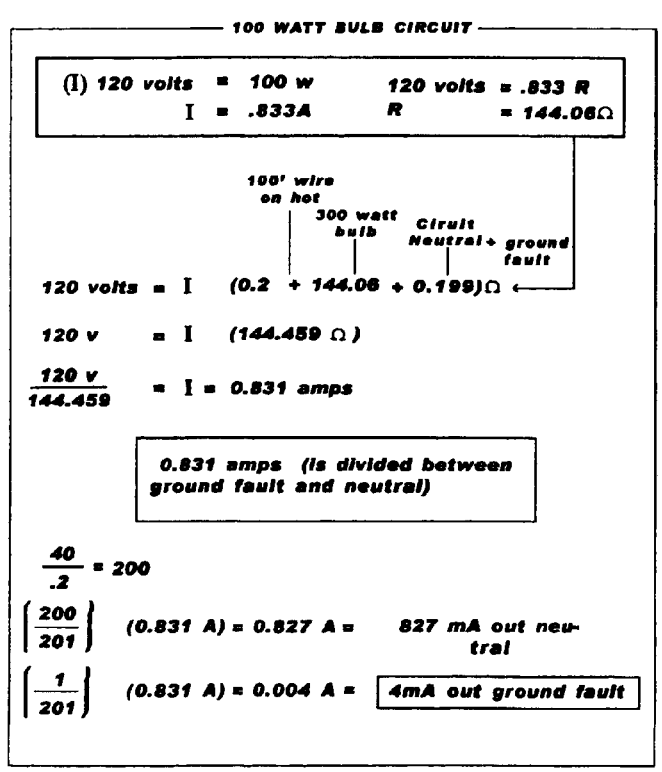
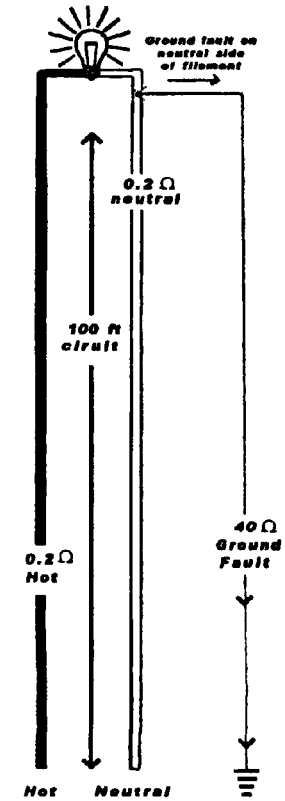
FIG. 41

MATH SUPPLEMENT E

*Figure 42 shows how the current is divided between the neutral conductor and a ground fault.*

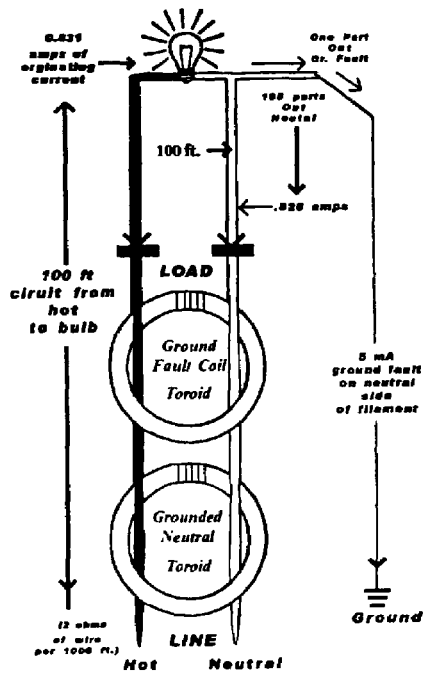

$E = IR$ $EI$ = power (watts)

$(120 \text{ volts})(I) = 100 \text{ watts}$ $I = \dfrac{100 \text{ watts}}{120 \text{ volts}}$ 100w bulb $I = .833$ amps $E = IR$ $120v = .833(R)$ $\dfrac{120v}{.833} =$ amps $144.06 \,\Omega = R$ of 100w bulb

CIRCUIT:

$E = IR$ $120 v = I (0.2 + 144.06 + R_s)$ $\dfrac{1}{R_s} = \dfrac{1}{0.2} + \dfrac{1}{33}$ $\dfrac{1}{R_s} = 5.0 + .0303$ $\dfrac{1}{R_s} = 5.0303$ $R_s = 0.199\,\Omega$ $120 v = I (0.2 + 144.06 + 0.199)\,\Omega$ $120 v = I (144.459)\,\Omega$ $120 v = I = 0.8307 = .831 A$
$\overline{144.459\,\Omega}$ The amount of ground fault current & neutral current is inversely proportional to the respective resistance. The larger the resistance the smaller the current flow through the neutral or ground fault.

$\dfrac{33.0\,\Omega}{0.2\,\Omega} = 165/_1$ on neutral — $\dfrac{165}{166}$ x .831A = 826 mA on Gr. Fault — $\dfrac{1}{166}$ x .831A = 5 mA

FIG. 42

MATH SUPPLEMENT F

*Figure 43 shows an example of how
19 - milliampere ground fault on neutral is detected
by utilizing GFCI Tests in Figures 28 - 62*

**NORMAL CIRCUIT POLARITY
WITH A 19mA ON NEUTRAL**

120 v/ 14 amps = 8.57 Ω on the hot 100 watt bulb ———— 144.06 Ω R

SEE SUPPLEMENT G (POLARITY REVERSED)

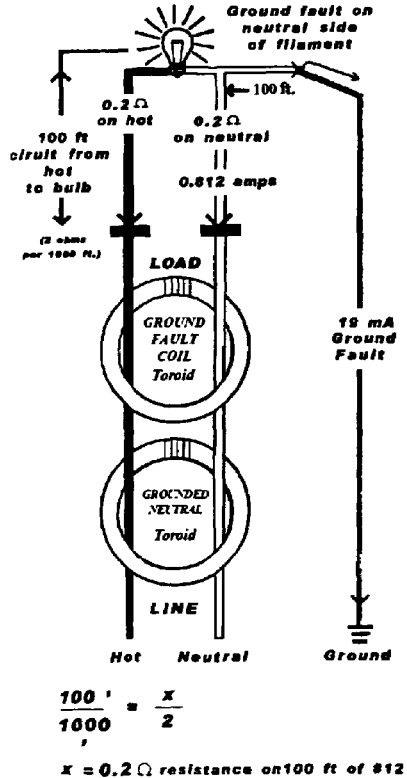

$$\frac{100'}{1000} = \frac{x}{2}$$

$x = 0.2\,\Omega$ resistance on 100 ft of #12 wire

Current in circuit splits
between ground fault and neutral

RESISTANCE IN A CIRCUIT

$R_C = 0.2 + 144.06 + R_{N + GF}$ bulb $\frac{1}{R_{N+GF}} = \frac{1}{0.2} + \frac{1}{8.57}$ $\frac{1}{R_{N+GF}} = 5.0 + 0.1167$ $\frac{1}{R_{N+GF}} = 5.1167$ $R_{N+GF} = 0.1954\,\Omega$ $R_C = (0.2 + 144.06 + 0.1954)\,\Omega$ $R_C = 144.46\,\Omega$ $I_C = \frac{120V}{144.46\,\Omega} = 0.831\,amps$ $\frac{8.57}{0.2} = \frac{42.85}{1}$ $\frac{42.85}{43.85} \times 0.831A = 812mA$ Through Neutral $\frac{1}{43.85} \times 0.831A = 19\,mA$ Through Gr. Fault = 19 mA

FIG. 43

MATH SUPPLEMENT G

*Figure 44 shows an example of how a 19 - milliampere ground fault on neutral increases to a 14 amp ground fault when polarity is reversed.*

MATH SUPPLEMENT H

GFCI Test Test # 8 (Fig 29)

*Figure 45 shows an example of how a
5 - milliampere ground fault <u>on neutral</u> produces a
<u>677 mA ground fault</u> when the neutral is disconnected or broken.*

$$\frac{120 \text{ v}}{177.26 \text{ }\Omega} = I = 0.677 \text{ amps on neutral}$$

100 watt bulb ——————144.06 Ω R

BROKEN NEUTRAL

```
                        100' wire
                              100w bulb
E = I R                               Gr. Fault 120 volts  =   I   (0.2 + 144.06 + 33.0) Ω

120 volts  =   I   (177.26) Ω

120 volts  =   I  = 677 milliamperes
177.26 Ω
```

MATH SUPPLEMENT I

*Figure 46 shows an example of how a 5 - milliampere ground fault <u>on shared neutral circuit</u> produces a ground fault of <u>677 milliamps</u> when the neutral is opened or broken.*

$\dfrac{120\,v}{177.26} = I = 0.677$ amps on neutral 100 watt bulb ——————— 144.06 Ω R

OPEN / BROKEN NEUTRAL

$E = IR$ 120 volts = I (0.2 + 144.06 + 33.0) Ω  
        ↑         ↑         ↑
    100' wire  100w bulb  Gr. Fault 120 volts = I (177.26) Ω

$\dfrac{120\ volts}{177.26\ \Omega}$ = I = 0.677 amps = 677 mA

MATH SUPPLEMENT J

Figure 47 shows an example of how a voltage spike through the _hot_ increases the $I^2R$ heating factor and carbon tracking of a ground fault.

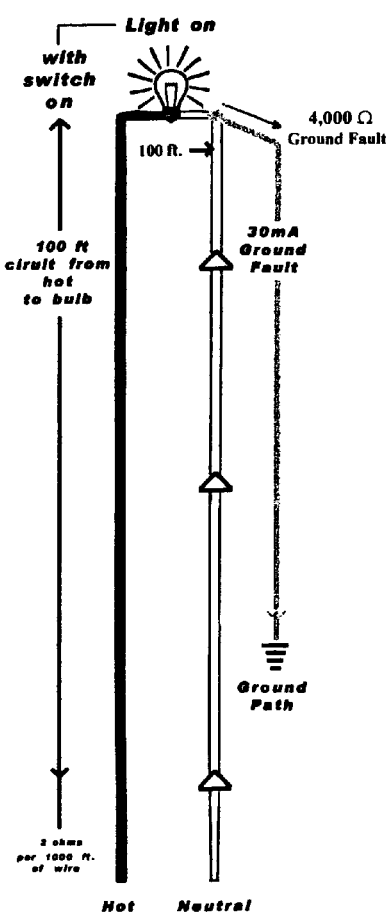

$\dfrac{120\,v}{177.26} = I = 0.677$ amps on neutral
(see Fig. 40)

$I^2R$ Heating of a 30 mA Ground Fault on hot

Heating with 120 volts and a 100w load:

$E = IR$ $R = 120\,v \div 30\,mA = 4000$ ohms $W = I^2R$ $W = (30mA)^2\ (4000\,\Omega)$ $W = (.030)^2\ (4000\,\Omega)$ $W = 3.6$ watts

Heating with 500 volt surge:

$I^2R$ heating produces 17.36 times more heat $R = 4000$ ohms $E = 500$ volts $I = 500\,v \div 4000$ ohms $= 125\,mA$ $I = 125\,mA$ $W = I^2R$ $W = 125\,mA \times 125mA \times 4000\,\Omega = 62.5$ watts $W = 62.5$ watts 1- Lightning and resulting power surges typically discharge into the house neutral conductor because the neutral is grounded to earth.

2- With or without a connected load on neutral, a 1000 volt surge/spike increases the size of a 30mA ground fault by 6,024 times or 30amps.

3- With a connected load present on hot, a 1000 volt power surge/spike reduces the size and amperage of the surge through the load.

FIG_47

UNDERSTANDING MATH SUPPLEMENTS A THROUGH N

1- Is ground fault on hot, neutral or both conductors?
2- What is the size of the electrical fault?

3- How large is the fault?

4- What is the size of the connected load?

5- Where is the location of the fault in relation to the load?

6- What is the length of the circuit?

7- What is the wire size?

8- How much voltage was present at the time of event?

Approximate Ground Fault Values On Hot Wire

5mA Ground Fault = 24,000 ohms

20mA Ground Fault = 6000 ohms

30mA Ground Fault = 4000 ohms

50mA Ground Fault = 2,400 ohms

Approximate Ground Fault Values On Neutral Wire

5mA Ground Fault = 33.0 ohms

20mA Ground Fault = 8.0 ohms

30mA Ground Fault = 5.5 ohms

50mA Ground Fault = 3.2 ohms

FIG. 47A

Note: 1-8 is information and constant mathematical values which can be written for CTMS computer programming on pages 22A, 22B, 22C.

MATH SUPPLEMENT K

*Figure 48 shows an example of how a voltage spike through the hot increases the $I^2R$ heating factor and carbon tracking of a ground fault.*

$$\frac{120\ v}{177.26} = I = 0.677\ amps\ on\ neutral$$
*(see Fig. 40)*

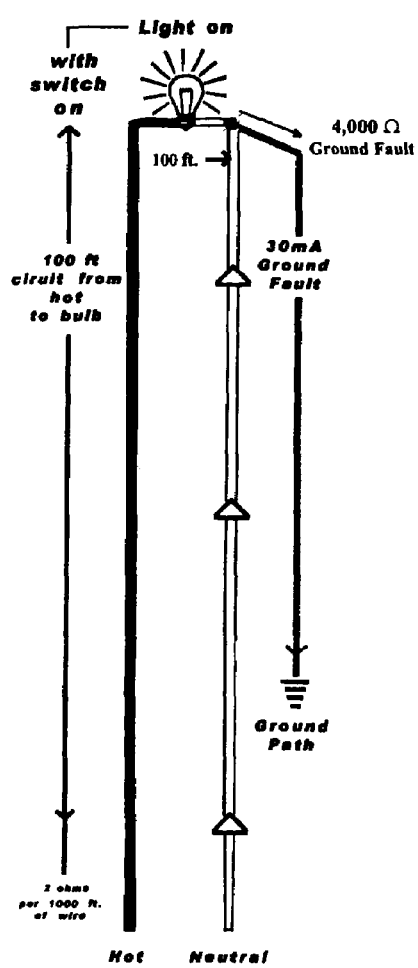

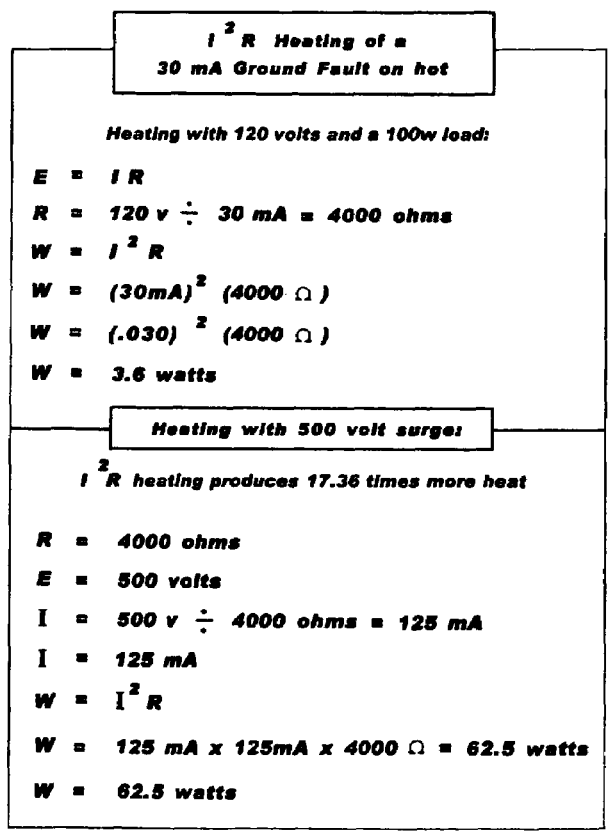

$I^2R$ Heating of a 30 mA Ground Fault on hot

Heating with 120 volts and a 100w load:

$E = IR$ $R = 120\ v \div 30\ mA = 4000\ ohms$ $W = I^2R$ $W = (30mA)^2\ (4000\ \Omega)$ $W = (.030)^2\ (4000\ \Omega)$ $W = 3.6\ watts$

Heating with 500 volt surge:

$I^2R$ heating produces 17.36 times more heat $R = 4000\ ohms$ $E = 500\ volts$ $I = 500\ v \div 4000\ ohms = 125\ mA$ $I = 125\ mA$ $W = I^2R$ $W = 125\ mA \times 125mA \times 4000\ \Omega = 62.5\ watts$ $W = 62.5\ watts$ 1- Lightning and resulting power surges typically discharge into the house neutral conductor because the neutral is grounded to earth.

2- With or without a connected load on neutral, a 1000 volt surge/spike increases the size of a 30mA ground fault by 6,024 times or 30amps.

3- With a connected load present on hot, a 1000 volt power surge/spike reduces the size and amperage of the surge through the load.

FIG. 48

TEST #1 - 240 VOLT GROUND FAULT CIRCUIT TESTER

AND

240 VOLT - 3 WIRE CIRCUIT TESTER HOOKUP WITH NO NEUTRAL

TEST #2 - 240 VOLT GROUND FAULT CIRCUIT TESTER

AND

240 VOLT - 4 WIRE CIRCUIT TESTER HOOKUP WITH NEUTRAL

ARC FAULT AND GROUND FAULT CIRCUIT INTERRUPTER TESTER APPARATUS AND METHOD

CROSS-REFERENCE TO RELATED APPLICATION

This application is a continuation of co-pending U.S. patent application Ser. No. 11/347,992, filed Feb. 6, 2006, entitled ARC FAULT AND GROUND FAULT CIRCUIT INTERRUPTER TESTER APPARATUS AND METHOD, the disclosure of which is hereby expressly incorporated herein by reference.

BACKGROUND

1. Field of the Invention

The present invention relates to electrical circuits and circuit testing, and, in particular, to a method and apparatus for testing electrical circuits for arc fault current and ground fault current anomalies.

2. Description of Related Art

A modern electrical system has a plurality of circuits connected to a circuit overload device such as a circuit breaker or a fuse box. The circuit overload device is connected to a line voltage. The National Electrical Code (NEC) requires all such circuits to be protected from shorts and circuit overloads by a circuit overload device. Conventional circuit breakers and fuse boxes can only isolate a circuit from the line voltage at an appreciable number of amperes (A). Therefore, the danger of fire and electrocution is often present in these circuits, even when properly grounded, because of electrical faults, such as ground fault current leakage or arc fault current leakage, associated with the circuits.

Typically, ground fault or arc fault current leakage occurs when the hot or neutral conductor of the circuit becomes grounded in some manner, i.e., via contact with another wire, mechanical ground wire, pipe, heat ducts, etc. When the electrical fault is not detected by the circuit breaker, a potentially dangerous situation exists. Because arc fault and/or ground fault current does not stay in one location for an extended period of time, the fault current can form an undetected parallel circuit path on a foreign surface and enter a building's grounding system.

Moreover, any increased line voltage from lightning or power surges can worsen a preexisting ground fault or arc fault damage condition. When lightning strikes near a power line it can induce a surge into the utility company main phase conductors serving many homes and buildings. Without notice, the surge can thermally degrade or damage electrical system wiring and components. The increased circuit voltage can start a slow burning process called pyrolysis. When the size of the electrical fault increases many times, the resistance of the circuit is lowered and there is a subsequent rise in current, increased $I^2R$ heating, accelerated carbon tracking, and charcoal formation prior to fire ignition.

The mechanical ground wires of a typical electrical system were originally designed for human protection against electrical shock. However, grounding has had an opposite safety effect in modern electrical systems. In approximately 1963, the NEC incorporated a mechanical ground wire system into all types of buildings to protect people against electrical shock. The system tied all metallic building materials in parallel with copper and aluminum grounded circuit wires. Such a system typically encounters multiple ground fault and arc fault current leakage problems.

In approximately 1953, the first bimetallic circuit breaker was introduced. These bimetallic circuit breakers, still in use today, function to shut off the current supply when the breaker's bimetal strip heats up to a temperature of 125% of its trip rated capacity, e.g., 25 A for a 20 A breaker. However, the standard bimetallic circuit breaker will not detect thermal damage or breakdowns from high resistance series or parallel arcing, current leakage from hot or neutral conductors, and/or current leakage from a faulty appliance which occur in wiring downstream of the electrical panel in which the breaker is situated. Additionally, standard circuit breakers will not detect electrical anomalies occurring from exposed wires, loose wire connections, unbalanced multiple neutral wires sharing a single circuit, and unbalanced multiple breaker circuit feeds. Thus, hysteresis makes the window of safe operation for a conventional circuit breaker highly questionable. Conventional circuit breakers will not detect ground fault or arc fault current leakage due to their limited trip capacity of about 15 A or more. Therefore, electrical anomalies occur and can be undetected in any home or building.

While ground fault circuit interrupters (GFCIs) have been made available since 1973, installers have mistaken ground fault current leakage for nuisance tripping, while compromising millions of installed GFCI devices. GFCIs can detect current leakage from a hot conductor, but they fail to provide the same protection on a neutral conductor. Thus, GFCI protected circuits and appliances are unknowingly leaking ground fault current at dangerous levels and are susceptible to fire if a neutral is opened, polarity is reversed, or $I^2R$ heating occurs.

While arc fault circuit interrupters (AFCIs) have been made available since 2002, their use is still in the experimental phase. The 2002 edition of the NEC requires only limited AFCI protection in new construction for bedroom outlet circuits. Thus, many homes and buildings have electrical circuits and appliances which are unprotected or are presently leaking arc fault current at dangerous levels.

Typically, ground fault or arc fault current leakage or arc fault or ground fault arcing occurs when the hot or neutral conductor of a circuit becomes grounded in some manner, (i.e., via contact with another wire, mechanical ground wire, grounded building materials such as wire mesh, aluminum siding, pipes and heat ducts, etc). In other words, an energized (parallel) current path forms on a foreign surface compromising the originating circuit conductor and a building's electrical grounding system. Alternately, an in-series arc fault can occur when a single conductor is broken within a single wire.

Moreover, one result of an energized foreign surface/object is arc tracking and increased carbonization, a major cause of electrical fires. Whereas, carbon is produced from the charcoaling of woods, by graphite brushes or dust in motors and by diamond dust from other sources, the heating from an electrical arc simultaneously leaves a carbon residue on wood, metallic or other conductive surfaces. All three forms of carbon are conductive current carrying conductors.

Whereas, arc tracking and carbonization is a result of pyrolsis from I (squared) R heating, carbon is a consequence of circuit voltage and ground fault or arc fault current leakage/arcing. Therefore, fires occur when circuit heating is sufficient to produce carbon and a temperature near ignition point after voltage is increased at a preexisting ground fault or arc fault, via power surges, lightning or broken neutral service entrance cable. Further, there also should be great concern for reversed circuit polarity.

When circuit voltage is increased from its normal 120 volts to 240 volts, I (squared) R heating becomes four times as great as the normal circuit heating at an electrical fault. Therefore, if 120 volts increases to 480 volts, heating goes up sixteen times, if voltage increases to 960 volts, heating accelerates sixty-four times, and if circuit voltage goes to 1920 volts, heating at an electrical fault increases 256 times and so on.

A 120-volt Ground Fault Circuit Interrupter (GFCI) circuit tester and method as described detects electrical circuit and/or appliance, equipment, and machinery ground fault current leakage and/or parallel ground fault arcing in an amount greater than 5 milliampere.

A 120-volt Arc Fault Circuit Interrupter (AFCI) circuit tester and method detects current leakage and/or parallel arcing on electrical circuits appliances, equipment, and machinery in an amount greater than 50 amperes.

In addition, an approximate 120-volt circuit load and a 120 volt power source also detects in-series arcing in electrical circuits and/or appliances, equipment, and machinery in an amount greater than 5 amperes.

A ground fault measuring 5 milliampere on a conventional circuit of approximately 240 volts will measure 2.5 milliampere if tested with a 120 volt circuit tester and method of the invention. It is therefore necessary to utilize a 240-volt circuit tester and method of the invention in series with a 240-volt circuit being tested.

SUMMARY

The present invention provides a circuit tester including an AFCI with ground fault circuit technology capabilities having two pairs of leads connected in series to opposite ends of each circuit tester for connecting the AFCI between an electrical circuit load and a power source to detect electrical circuit and/or appliance ground fault current leakage in an amount greater than approximately 30 mA and/or 50 A, as well as to detect parallel arcing on an electrical circuit or appliance in an amount greater than approximately 50 A and/or 70 A. Furthermore, the invention provides a circuit tester including two AFCIs each having three pairs of leads connected in series to opposite ends of each circuit tester for connecting an AFCI between an electrical circuit load and a power source to indicate electrical circuit and/or appliance ground fault current leakage in an amount greater than approximately 30 mA and/or 50 A, as well as parallel arcing on an electrical circuit or appliance in an amount greater than approximately 50 mA and/or 70 A. Additionally, the present invention provides a plurality of methods for utilizing the circuit testers to detect ground fault current leakage and arc fault current leakage on a circuit and appliances.

The invention also provides two circuit testers including a GFCI having two pairs of leads connected to the opposite end of each circuit tester in series for connecting a GFCI between an electrical circuit load and a power source to indicate circuit and/or appliance ground fault current leakage in an amount greater than about 5 mA (FIG. 4) and 20 mA (FIG. 5). The invention provides nine methods of utilizing the circuit tester for detecting current leakage on a circuit and/or appliances.

The invention additionally provides a circuit tester comprising a GFCI and AFCI (FIG. 6) having three pairs of leads connected to opposite ends of each circuit tester in series for connecting the ground fault and AFCIs between an electrical circuit load and a power source to indicate ground fault and arc fault current leakage in a circuit and/or appliances. Furthermore, the invention provides a system of GFCI and AFCI test breakers.

The invention further provides a circuit tester comprising a GFCI and AFCI (FIG. 6) having six pairs of leads connected to the opposite end of each circuit tester in series for connecting a GFCI and an AFCI between an electrical circuit load and a power source to indicate electrical circuit and/or appliance ground fault current leakage in an amount greater than 5 mA or 20 mA and electrical circuit and/or appliance ground fault current leakage in an amount greater than 30 mA or 50 mA and parallel arcing on an electrical circuit or appliance in an amount greater than 50 A or 70 A. Additionally, six methods are provided for utilizing the AFCI tester for detecting ground fault current leakage and arc fault current leakage on a circuit and/or appliances. Additionally, nine methods are provided for utilizing the GFCI tester for detecting ground fault current leakage on a circuit and/or appliances.

Furthermore, the invention provides a system of GFCI and AFCI breakers which can be permanently installed in an electrical circuit panel of, for example, a home, to provide constant protection from ground fault and arc fault current leakage. It is therefore highly desirable to provide an improved circuit utilizing AFCI and GFCI protection.

Additionally, the invention provides a circuit test monitoring system (CTMS) comprising GFCI's and AFCI's (FIG. 22) having two pairs of leads connected to the opposite end of each circuit tester in series for connecting an AFCI and GFCI with ground fault and arc fault circuit technology detection capabilities between an electrical circuit load and a power source to indicate electrical circuit and/or appliance ground fault current leakage in an amount greater than 5 mA or 30 mA and electrical circuit and/or appliance arc fault parallel arcing on an electrical circuit or appliance in an amount greater than 50 A or 70 A. Additionally, a computerized CTMS module contact station (FIG. 22A) consists of an expandable control circuit board. Each imbedded circuit contact point allows a technician to inject a portable module (FIG. 22B) for evaluation of each circuit condition with serviceable and safe accessibility to each circuit. The panel signals to be injected depend on the type of fault condition seen at the time of discovery. This test method is unique when used at an injection site for more efficient troubleshooting.

A digital Display or Port module is an added feature which can be utilized as a separate CTMS panel or incorporated into a GFCI/AFCI circuitry system panel. The module can sense and display fault events. The events are Voltage surges/sags, duration, lose and time. A keyboard allows limited access to manipulate thresholds. The port allows full programming access. An alarm may sound at set parameters and may be silenced or a display alerts a property owner or maintenance personnel of events that may be damaging to appliances that otherwise would not be documented or realized. The GFCI-AFCI circuit test monitoring system provides all of the above when the display/port panel is added to it. It performs monitoring, logging, location of events and performs many safety functions. The signals as described below may be injected through it. It is both a monitor and a test panel.

The signals may be from 1 V to Hi voltage AC. This signal may be injected via the contact panel or a circuit component such as an outlet, light socket, etc. (wherever is available). The signal type shall be used to sustain an arc fault to locate/sense the ground fault or arc fault via RF/interference. Direct current voltage (DCV) from 1 V to hi voltage shall be used to sustain a heated fault junction that may be found via an infra-red device. It is also highly desirable to modulated through frequency/amplitude or pulse the above signals to sustain a condition during the troubleshooting/location process of repair operation.

It is therefore highly desirable to provide an improved circuit utilizing arc fault and GFCIs which are resetable on/off switches and will shut off upon sensing electrical appliance ground fault current leakage which measures more than 30 mA and any electrical arc fault current leakage in an appliance or circuit which measures more than 50 A as illustrated in FIGS. 1, 2, 3, and 6.

It is therefore highly desirable to provide an improved circuit and circuit test which utilizes GFCIs which are resetable on/off switches and will shut off upon sensing electrical circuit ground fault current leakage greater than 5 mA as illustrated in FIGS. 4, 5, and 6.

It is also highly desirable to provide an improved circuit tester and method for detecting electrical faults with resetable on/off switches which will shut off upon detecting (1) electrical circuit current leakage greater than 5 mA, (2) any appliance ground fault current leakage which detects current leakage in amounts greater than 30 mA as to avoid appliance or equipment nuisance tripping, (3) any electrical circuit arc fault current leakage which detects series or parallel arcing greater than 50 A.

It is therefore highly desirable to provide an improved circuit test method for identifying ground fault current leakage and arc fault current leakage on circuit conductors.

It is also highly desirable to provide an improved circuit tester and method for identifying the approximate location of where ground fault current leakage is occurring.

It is also highly desirable to provide an improved circuit tester and method for identifying the approximate location of where arc fault current leakage is occurring.

It is also highly desirable to provide an improved circuit tester and method for testing circuits which offers the user greater flexibility as a diagnostic tool; one that is user friendly and requires only a minimum of knowledge by the operator such that it can be conveniently and expertly utilized by electricians.

It is also highly desirable to provide an improved circuit tester and circuit method for testing electrical circuits which is simple and inexpensive to manufacture.

It is also highly desirable to provide an improved circuit tester and method for testing circuits which is consistent with the NEC.

It is also highly desirable to provide an improved circuit tester method for troubleshooting electrical faults which is user friendly and cost effective.

It is also desirable to provide an improved circuit with an AFCI for new construction.

It is therefore desirable to provide an improved circuit, circuit tester, and method that isolate any ground fault current leakage and arc fault current leakage in the grounding electrical system.

It is also desirable to provide an improved electrical circuit, circuit tester and test method for isolating appliance ground fault current leakage.

It is also highly desirable to provide an improved electrical circuit, circuit tester and test method when troubleshooting electrical circuits for arc fault current leakage.

It is also highly desirable to provide an improved circuit tester and test method for troubleshooting circuits whereby arc fault series or parallel arcing in circuits can be repaired.

It is also highly desirable to provide an improved circuit tester for troubleshooting circuits whereby ground fault leakage in circuits can be repaired.

It is also highly desirable to provide an improved circuit tester and test method for troubleshooting whereby arc fault current leakage in appliances can be repaired.

It is also highly desirable to provide an improved circuit tester and test method for troubleshooting.

Finally, it is highly desirable to provide an improved circuit tester and test method for determining differences between the improved method of an AFCI test method (FIGS. 1, 2, and 3) and a GFCI test method (FIGS. 4 and 5).

It is therefore a desired object to provide an improved electrical circuit, circuit tester and method of testing circuits and appliances for arc fault series and parallel arcing greater than 50 A.

It is also a desired object to provide a circuit tester and method of testing circuits and appliances for ground fault current leakage greater than 30 mA.

It is also a desired object to provide a circuit tester and method of testing circuits for ground fault current leakage greater than 5 mA.

It is also a desired object to provide an improved circuit, circuit tester and method for testing appliance refrigeration, which avoids nuisance trips of standard GFCIs.

It is also a desired object to provide an improved circuit tester and method for testing circuits which provides greater diagnostic flexibility for the electrician, is user friendly and simple to explain.

It is also a desired object to provide an improved circuit tester and method for testing circuits to determine the approximate location that current leakage is occurring.

It is also a desired object to provide an improved circuit tester and troubleshooting method which can isolate and repair electrical faults.

It is also a desired object to provide an improved electrical circuit; circuit tester and test method for isolating a building's electrical grounding system from a building's parallel wiring system circuit load to prevent circuit harmonics.

Finally, it is also a desired object to provide an improved circuit tester and test method for determining the potential differences between ground fault current and arc fault current as detected by two types of circuit testers.

The tester as previously referenced by this text discusses a circuit tester and test method by which a circuit tester and method utilizes a circuit load voltage of approximately 120 volts and line (from a source) voltage of approximately 120 volts.

Whereas, circuit tester and method also utilize a circuit load voltage of approximately 240 volts and a line voltage of approximately 240 volts.

Whereas, a circuit tester is provided with Ground Fault Circuit Interrupter (GFCI) technology capabilities having two pairs of test leads, one red, one white, connected in series to two load side connections of a circuit tester at the base of a circuit tester for connecting the load side of a GFCI circuit tester between an approximate 240 volt circuit load, and having one test lead connected to a load neutral or load ground, and an approximate 240 volt power source having two pairs of leads connected in series to two line side connections, one black, one green, at the base of a circuit tester to detect electrical circuit and/or appliance, equipment, and machinery ground fault current leakage and/or parallel ground fault arcing in an amount greater than 5 milliampere.

Whereas, a plurality of methods are provided for utilizing a GFCI circuit tester between an approximate 120 volt electrical circuit load and an approximate 120 volt power source to detect electrical circuit and/or appliance, equipment, and machinery ground fault current leakage and parallel ground fault arcing in an amount greater than 5 milliamperes.

Whereas, a circuit tester is provided with Arc Fault Circuit Interrupter (AFCI) technology capabilities having two pairs of test leads, one red, one white, connected in series to two load side connections at the base of a circuit tester at for connecting the load side of a AFCI circuit tester between an approximate 240 volt circuit load, and an approximate 240 volt power source having two pairs of leads, one black, one green, connected in series to two line side connections at the base of a circuit tester to detect electrical circuit and/or appliance, equipment, and machinery arc fault current leakage and/or parallel arcing in an amount greater than 50 amperes.

Whereas, a circuit tester is provided with Arc Fault Circuit Interrupter (AFCI) technology capabilities having two pairs of test leads, one red, one white, connected in series line connections at the base of a circuit tester for connecting the AFCI between an approximate 120 volt electrical circuit load, and an approximate 120 volt power source supply, having two pairs of test leads, one black, one green, connected in series to line connections at the base of an AFCI circuit tester to detect electrical circuit and/or appliance, equipment, and machinery Arc Fault current leakage and/or in series arcing in an amount greater than 5 amperes.

Whereas, a plurality of methods are provided for utilizing an AFCI circuit tester between an approximate 120 volt electrical circuit load and an approximate 120 volt power supply to detect electrical circuit and/or appliance, equipment, and machinery arc fault current leakage and/or parallel arcing in an amount greater than 50 amperes and in series arcing in an amount greater than 5 amperes.

In one form thereof, the present invention provides a method for testing an electrical circuit, the electrical circuit including a circuit overload device, a plurality of electrical outlets, and at least one appliance connected in parallel, the method including the steps of providing an arc fault circuit interrupter (AFCI) tester, the tester having at least two pairs of tester lead wires, the AFCI tester connected to a power source; providing a ground fault circuit interrupter (GFCI) tester, the tester having at least two pairs of tester lead wires, the GFCI tester connected to a power source; connecting at least one of the AFCI tester lead wires to at least a portion of the circuit; connecting a load hot tester wire from the GFCI tester to a circuit load hot wire; connecting a load neutral tester wire from the GFCI tester to a circuit load neutral wire; identifying, if any, ground fault current leakage on the electrical circuit; and identifying, if any, arc fault current leakage on the electrical circuit.

In another form thereof, the present invention provides a method for testing an electrical circuit, the electrical circuit including a circuit overload device, a plurality of electrical outlets, and at least one appliance connected in parallel, the method including the steps of providing a ground fault circuit interrupter (GFCI) tester, the tester having at least two pairs of tester lead wires, the tester connected to a power source; connecting at least one of the GFCI tester lead wires to at least a portion of the circuit; and identifying, if any, ground fault current leakage on the electrical circuit.

In one form thereof, the present invention provides a method for testing an electrical circuit including the step of using a plurality of AFCI and GFCI testers.

BRIEF DESCRIPTION OF THE DRAWINGS

Other features and objects of the invention and the manner of attaining them will become more apparent and the invention itself will be better understood by reference to the following description of embodiments of the invention taken in conjunction with the accompanying drawings wherein:

FIG. 11 shows a GFCI tester useful in a method according to one embodiment;

FIG. 15A shows connections for test #1;

FIG. 15B shows purposes for test #1;

FIG. 16A shows connections for test #2;

FIG. 16B shows purposes for test #2;

FIG. 17A shows connections for test #3;

FIG. 17B shows purposes for test #3;

FIG. 18A shows connections for test #4;

FIG. 18B shows purposes for test #4;

FIG. 19A shows connections for test #5;

FIG. 19B shows purposes for test #5;

FIG. 20A shows connections for test #6;

FIG. 20B shows purposes for test #6;

FIG. 22A illustrates an arc fault and ground fault circuit test monitoring system (CTMS);

FIG. 22B illustrates an auxiliary circuit test monitoring station (CTMS);

FIG. 24 shows arc fault and ground fault circuit protection downstream of the circuit panel for the home of FIG. 22;

FIG. 25 illustrates a method of pigtailing line side wires for FIG. 24;

FIG. 28A shows connections for test #7;
FIG. 28B shows purposes for test #7;
FIG. 29 illustrates test #8 according to one embodiment of the GFCI test method;
FIG. 29B shows purposes for test #8;
FIG. 30A shows connections for test #9;
FIG. 30B shows purposes for test #9;
FIG. 31A shows connections for test #10;
FIG. 31B shows purposes for test #10;
FIG. 32A shows connections for test #11;
FIG. 32B shows purposes for test #11;
FIG. 33A shows connections for test #12;
FIG. 33B shows purposes for test #12;
FIG. 34A shows connections for test #13;
FIG. 34B shows purposes for test #13;
FIG. 35A shows connections for test #14;
FIG. 41 shows an example of how a ground fault on neutral is load dependent, shown with a 100-watt load;
FIG. 42 shows how the current is divided between the neutral conductor and a ground fault;
FIG. 43 shows an example of how a 19 mA ground fault on neutral is detected by utilizing GFCI tests in FIGS. 28-36;
FIG. 47 shows an example of how increased voltage increases the $I^2R$ heating factor and carbon tracking of a ground fault;
FIG. 47A shows information to assist in understanding the mathematical models provided for each test method;
FIG. 48 shows an example of how a voltage spike through the hot increases the $I^2R$ heating factor and carbon tracking of a ground fault.

Figure 1:
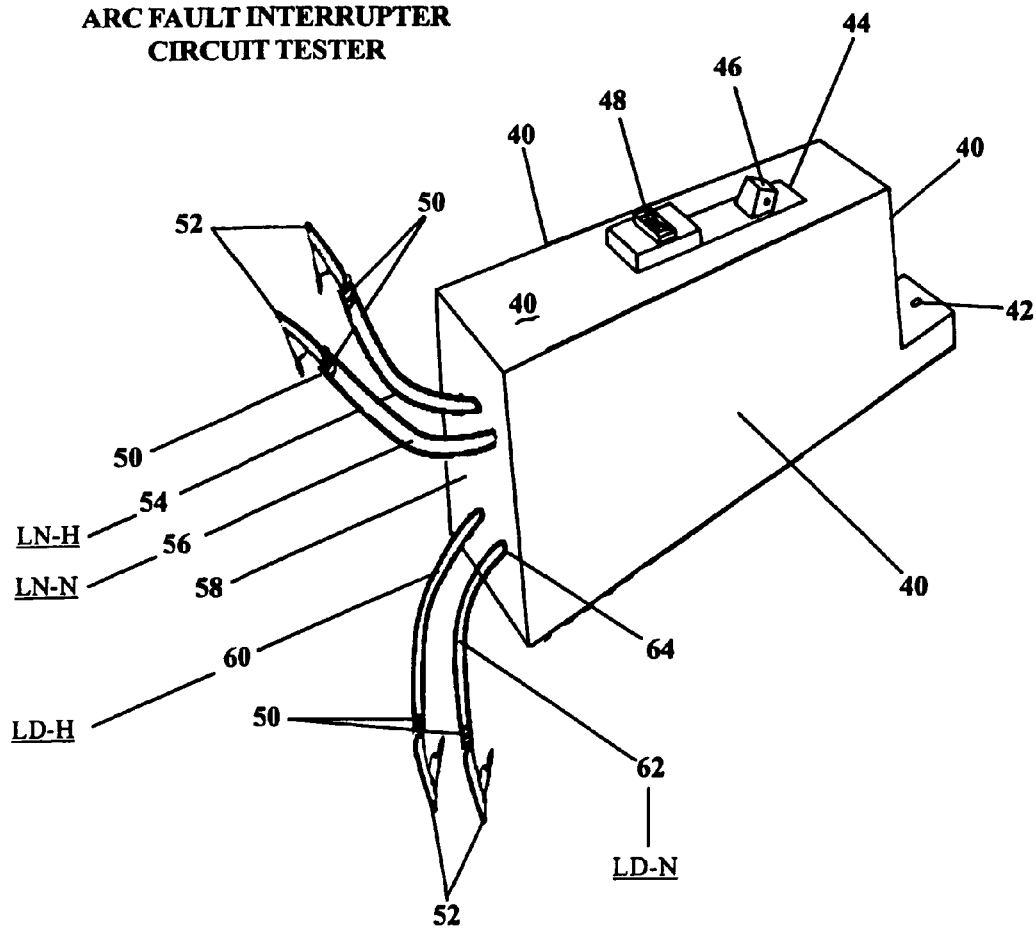
FIG. 1 is a perspective view of an AFCI tester according to one embodiment.

Corresponding reference characters indicate corresponding parts throughout the several views. Although the drawings represent embodiments of the present invention, the drawings are not necessarily to scale and certain features may be exaggerated to better illustrate and explain the present invention. The exemplifications set out herein illustrate embodiments of the invention, and such exemplifications are not to be construed as limiting the scope of the invention in any manner.

DETAILED DESCRIPTION

Figure 2:
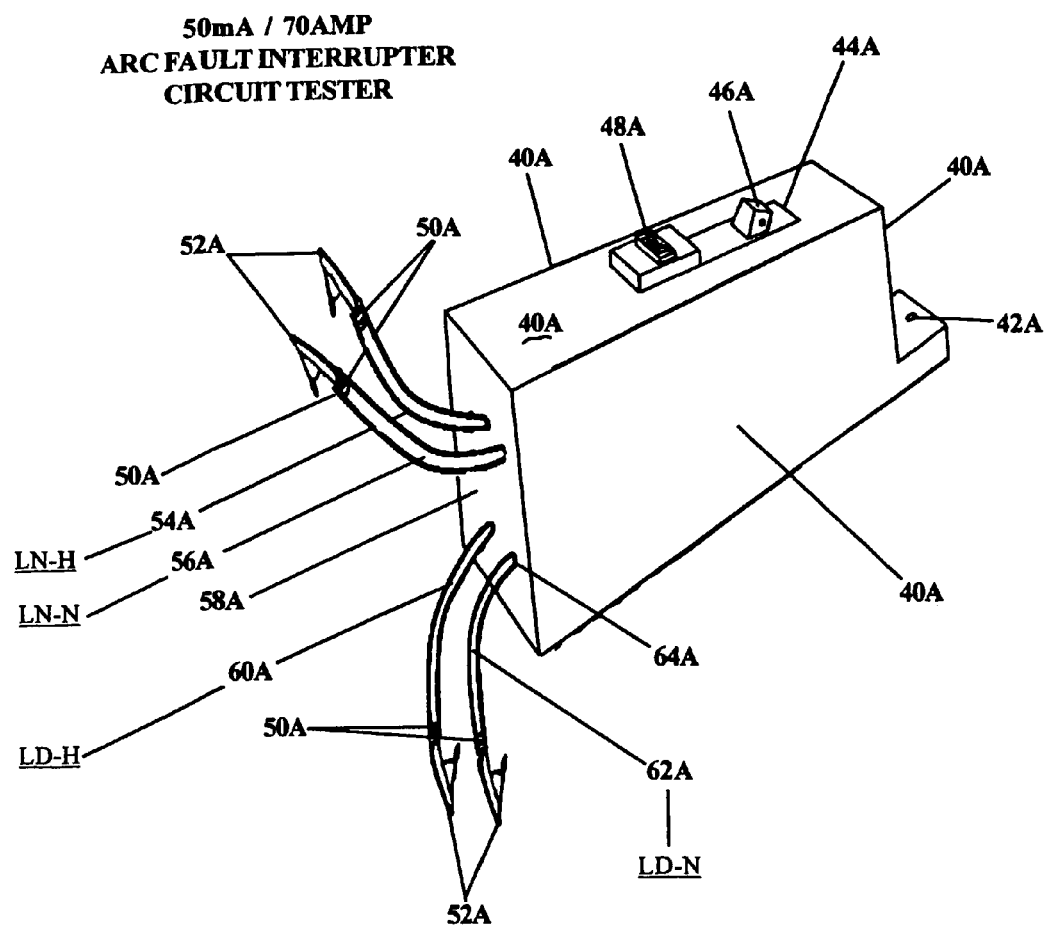
FIG. 2 is a perspective view of an AFCI tester according to one embodiment.
Figure 3:
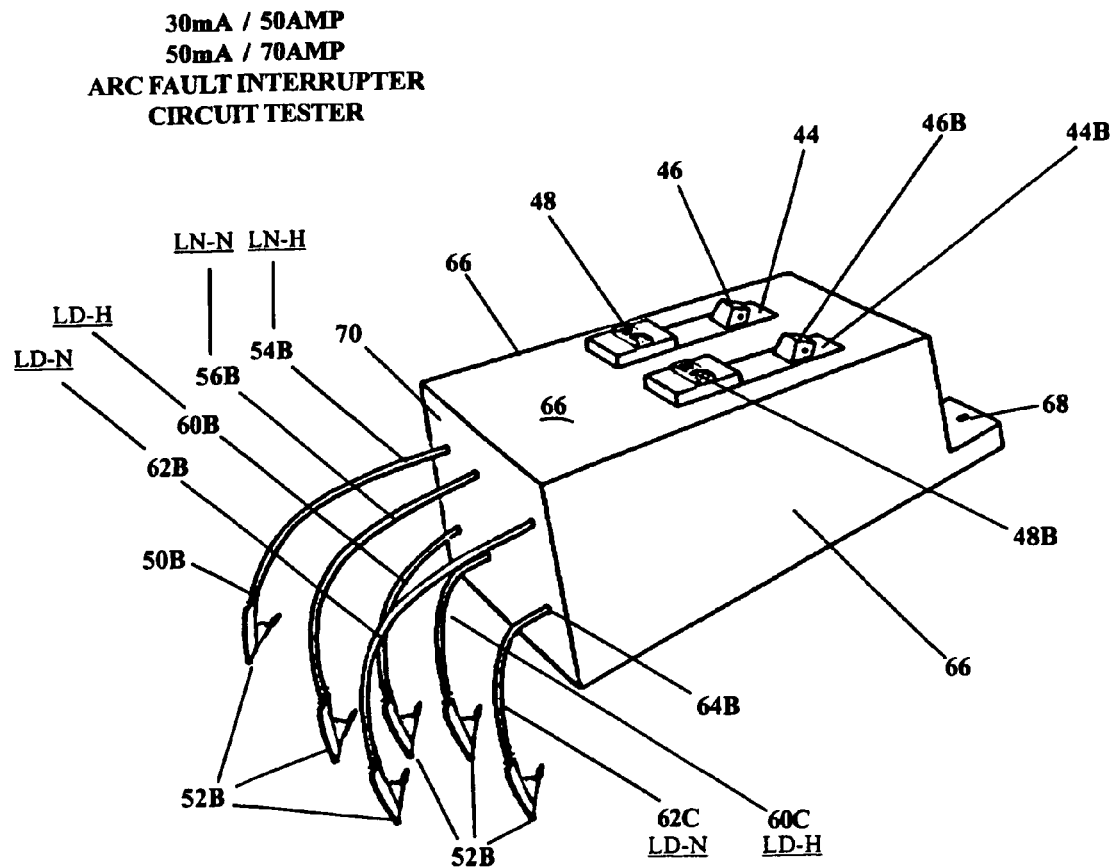
FIG. 3 is a perspective view of an AFCI tester according to one embodiment.
Figure 22:
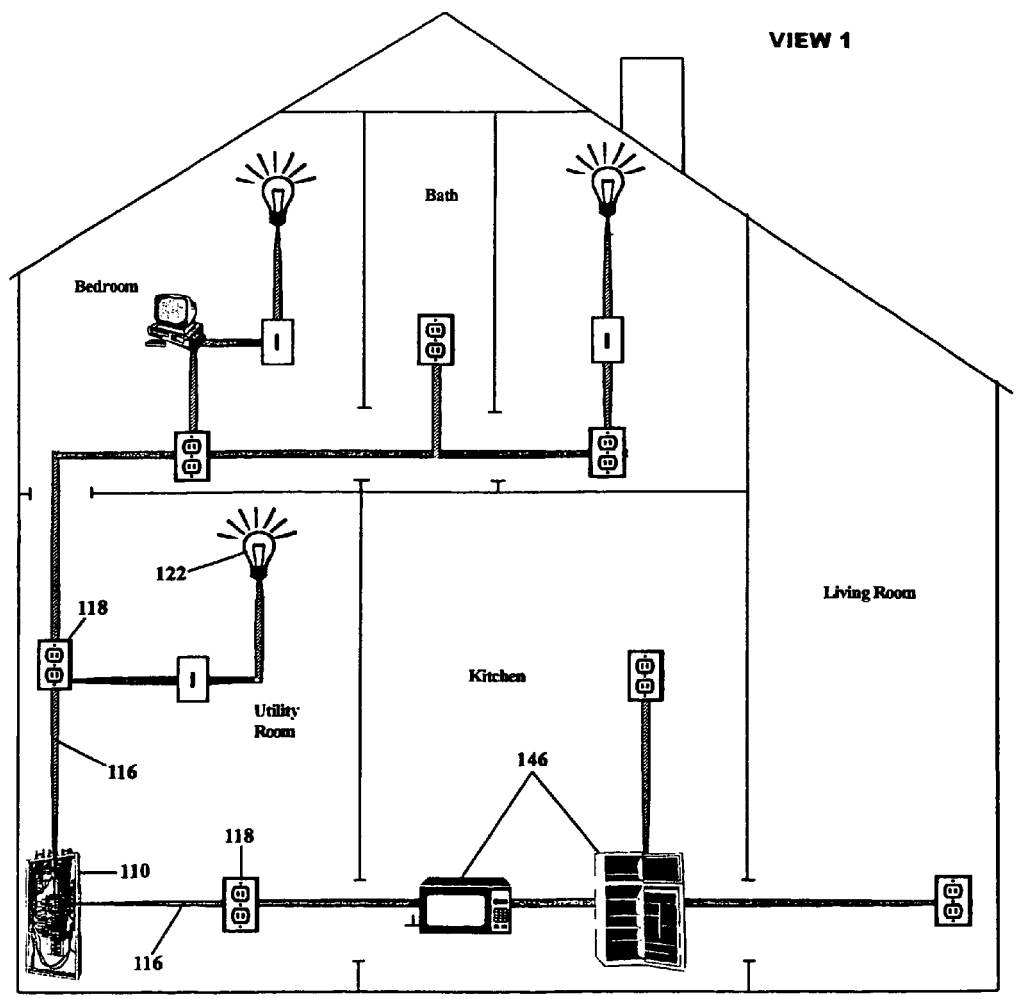
FIG. 22 illustrates a home having a plurality of AFCI testers.

Referring now to FIGS. 1-3, a method is shown for testing electrical circuits 116 (FIG. 22) by utilizing AFCI tester 40 (FIG. 1) or 40A (FIG. 2) to permanently test monitor whole house wiring systems and to provide the portability of diagnostic circuit testing for all existing electrical circuits 116 using AFCI testers 40, 40A, or 66 (FIG. 3). By the test methods shown in FIGS. 15-20, electrical wiring and appliances, no matter how old, can be tested for arc fault current leakage exceeding 50 amps using tester 40 (FIG. 1), arc fault current leakage greater than 70 amps using tester 40A (FIG. 2), ground fault current leakage greater than 30 mA using tester 40 (FIG. 1), and ground fault current leakage greater than 50 mA using tester 40A (FIG. 2).

Aging of installed wiring can cause a variety of different types of electrical problems. Many wire insulation exhibits cracking because of variations in humidity, dry climates, dust, sunlight, and extreme temperatures. Wire insulation can be damaged by drawing multiple wires in framed walls, ceilings, and roof rafters, by contact with sharp edges on heating ducts, door jams, and metal cross bars, by contact with the construction materials, such as plaster, lathing, nails, staples and the like, by an electrician's error in wire stripping, or manufacturing wire defects.

Figure 37:
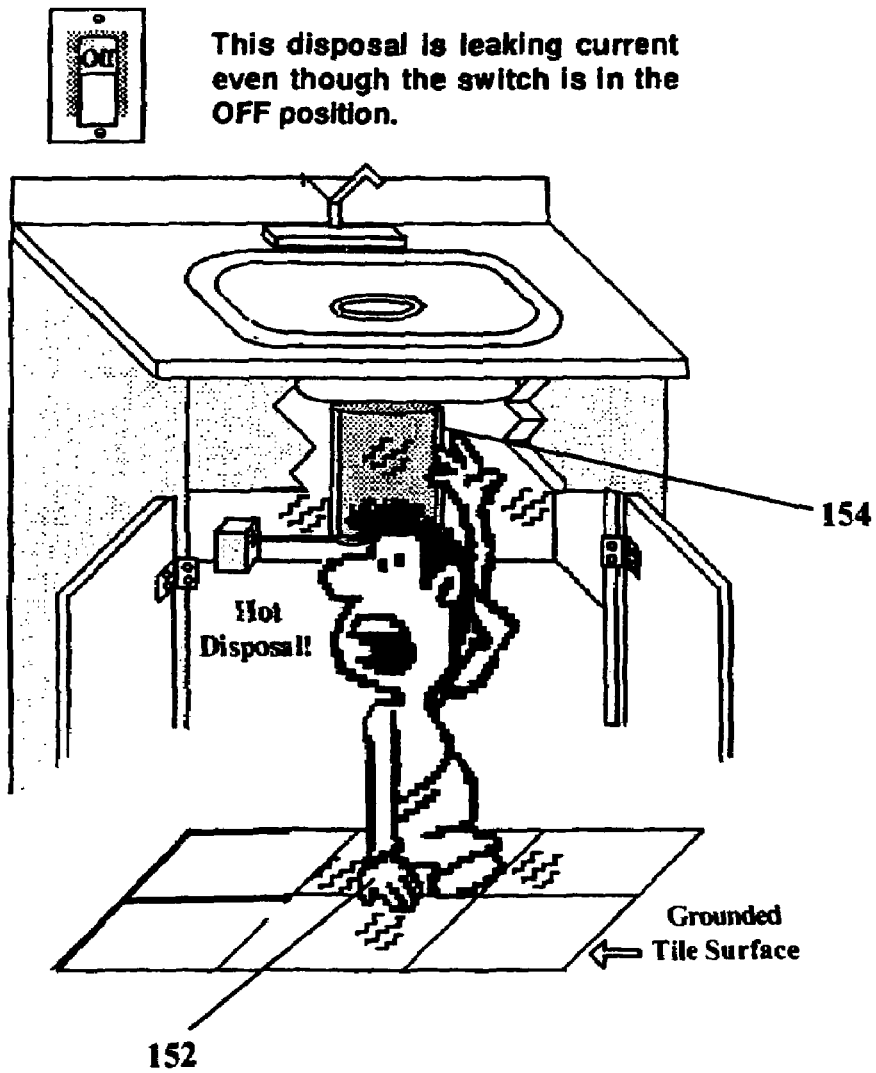
FIG. 37 illustrates the ground fault danger of electrical appliances.
Figure 38:
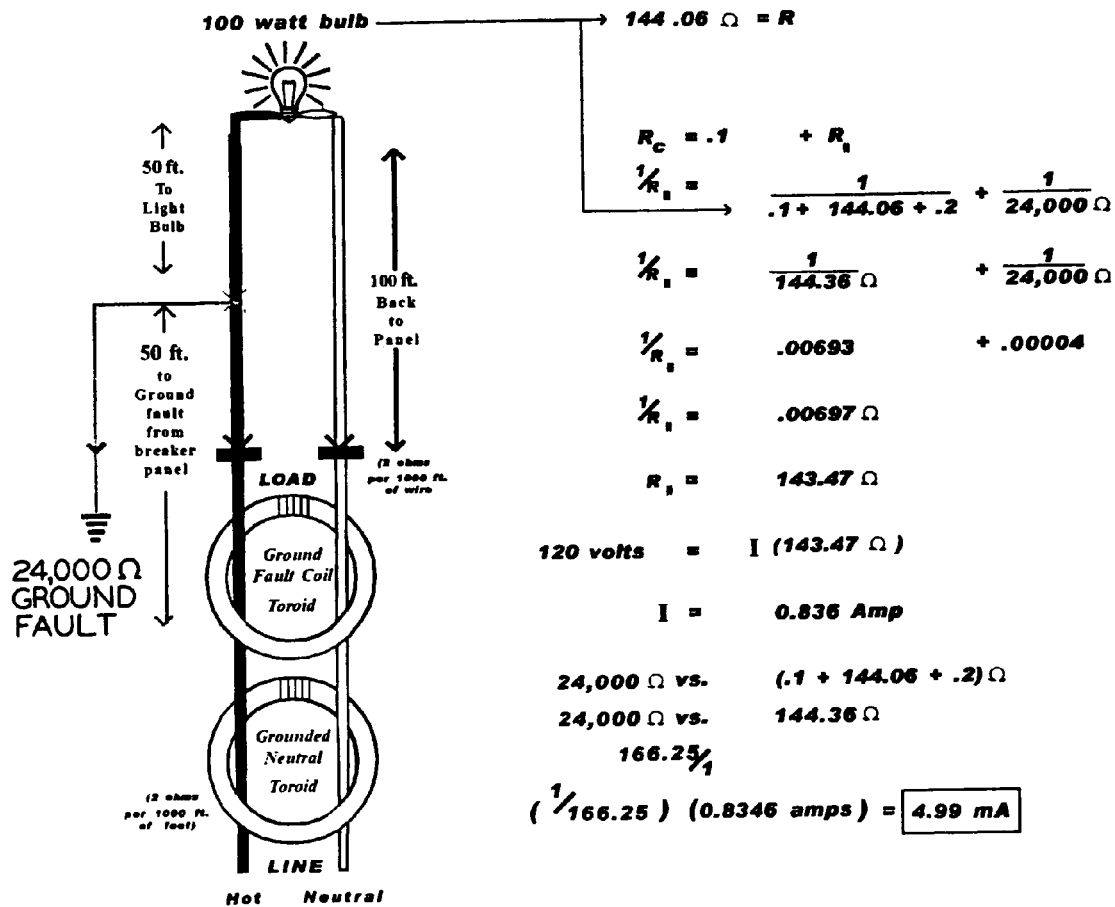
FIG. 38 shows how a 5 mA ground fault does not change in size on the hot conductor regardless of the load amount, shown with a 100-watt load.
Figure 39:
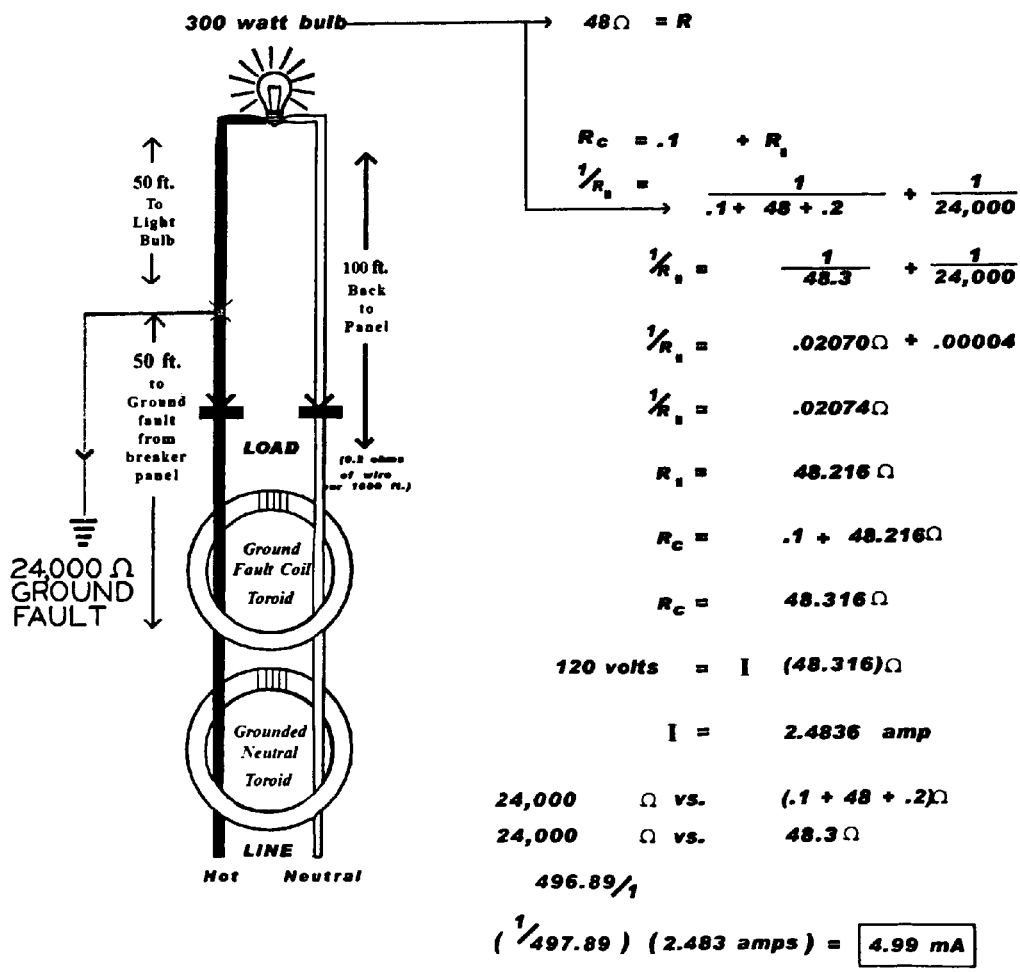
FIG. 39 shows how a 5 mA ground fault does not change a ground fault on the hot conductor regardless of load size, shown with a 300-watt load.
Figure 40:
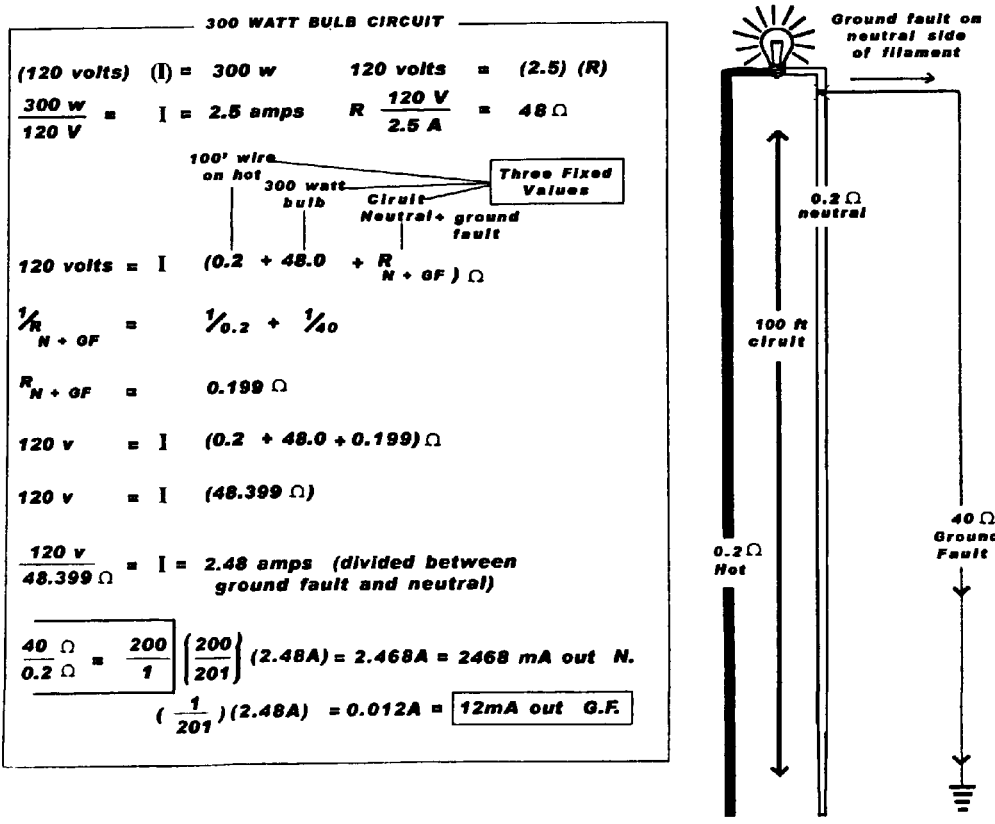
FIG. 40 shows an example of how a ground fault on neutral is load dependent, shown with a 300-watt load.
Figure 44:
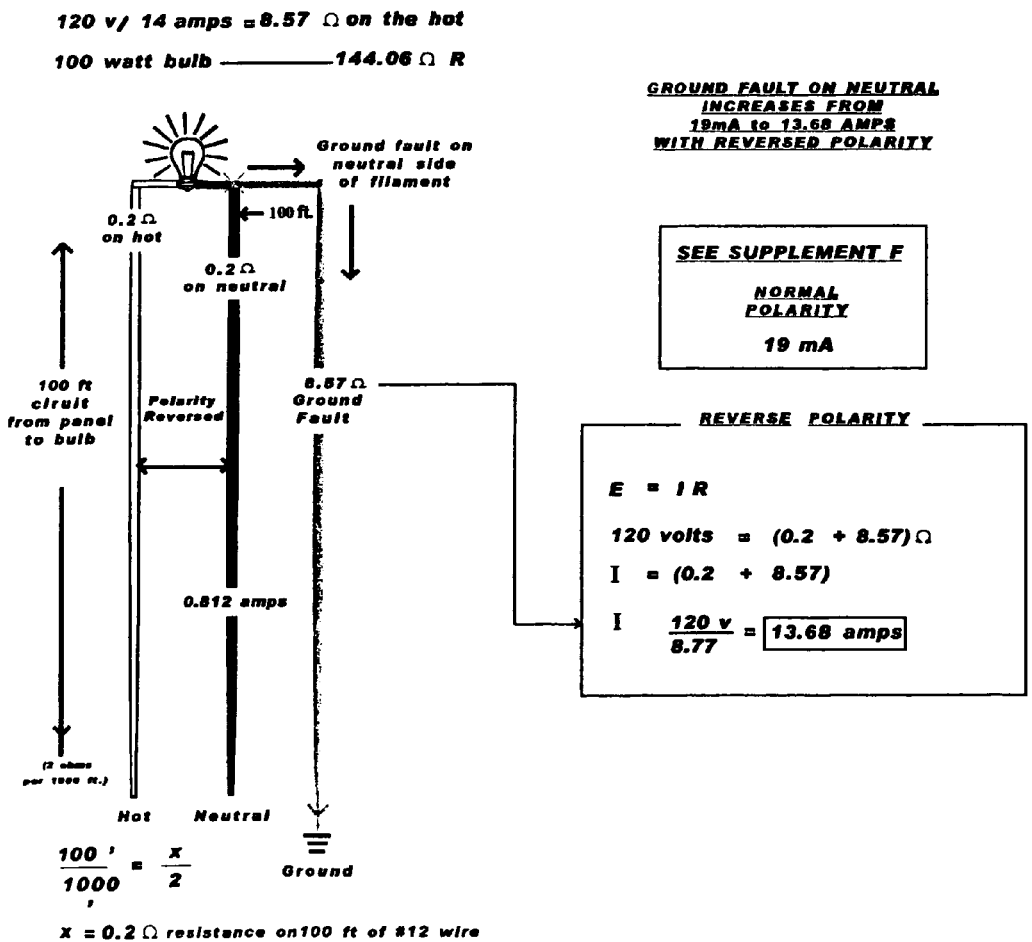
FIG. 44 shows how the size of a ground fault increases if polarity is reversed.
Figure 45:
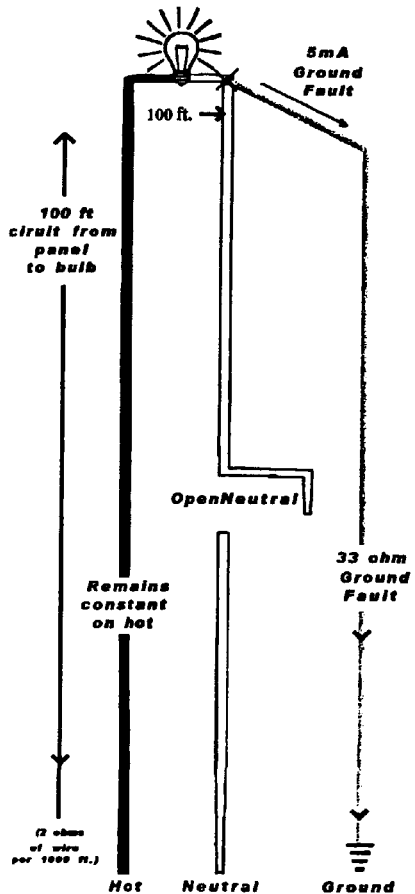
FIG. 45 shows how the size of a ground fault increases if neutral is disconnected or broken.
Figure 46:
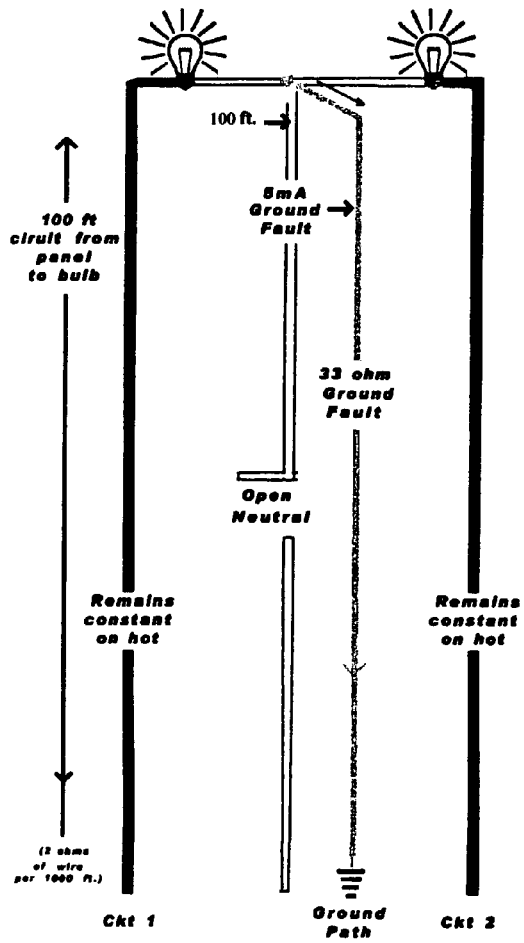
FIG. 46 shows how the size of a ground fault on a shared neutral circuit increases if neutral is opened or broken.
Figure 49:
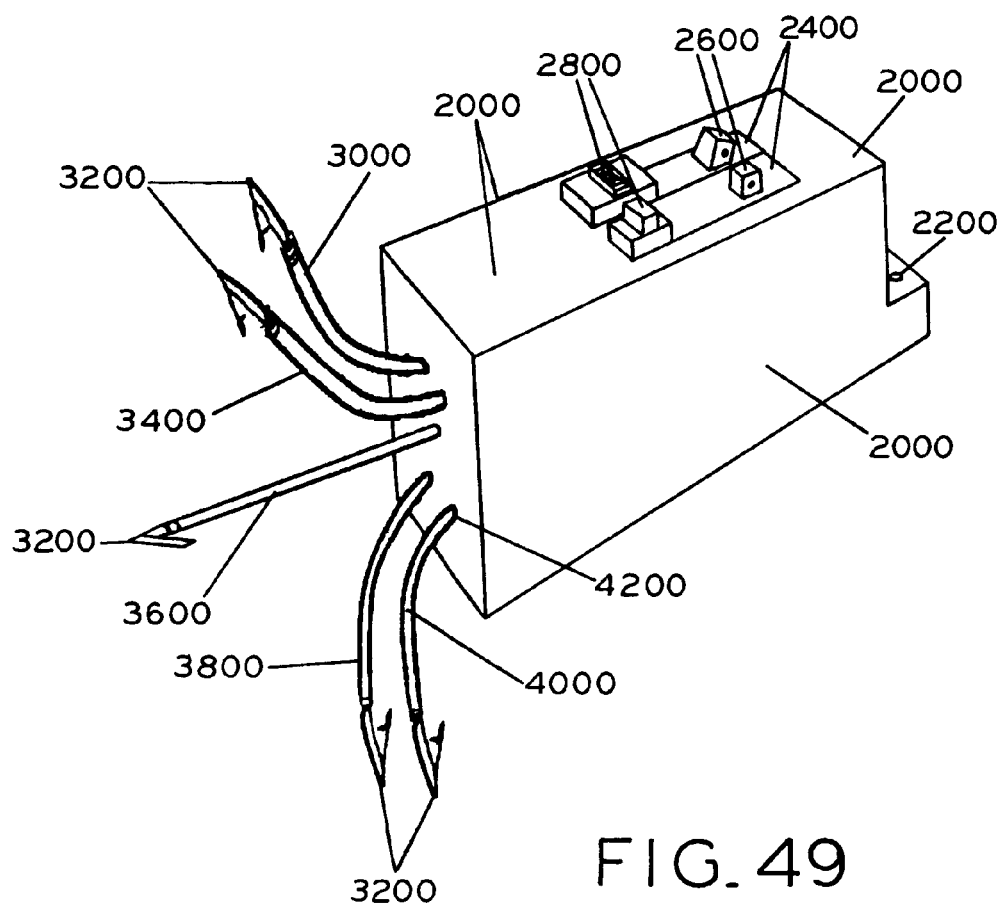
FIG. 49 shows a 240-volt ground fault circuit interrupter tester.
Figure 50:
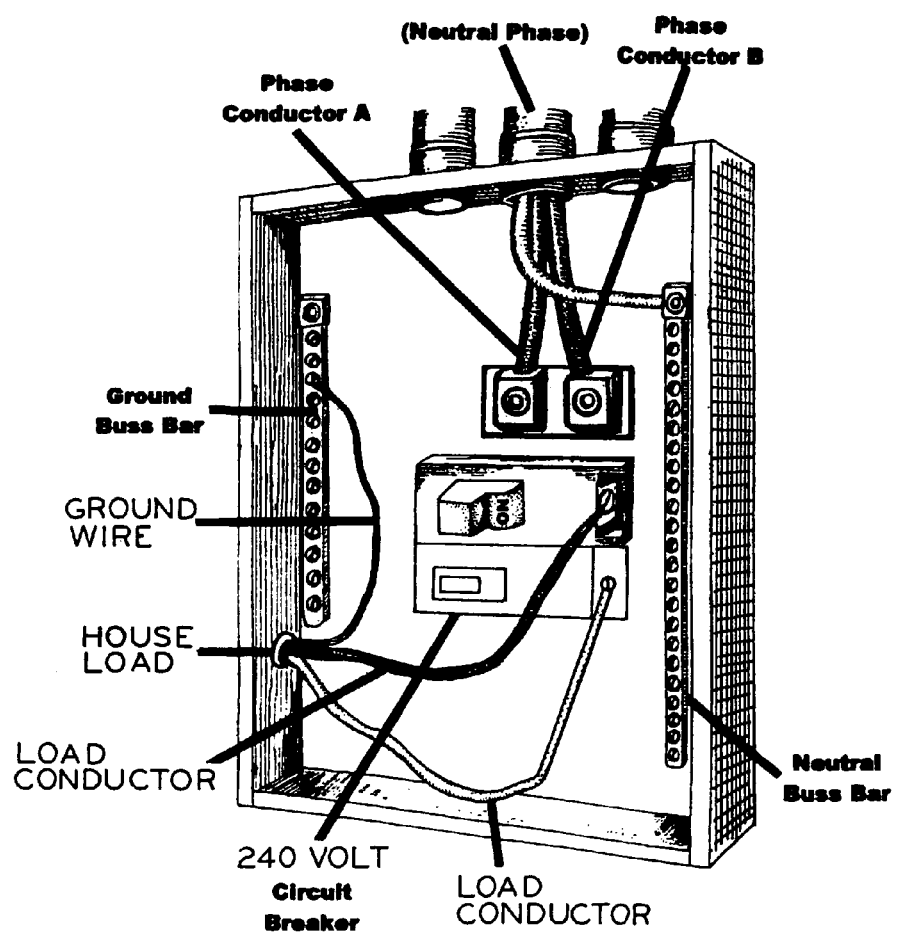
FIG. 50 shows a standard breaker panel.
Figure 51:
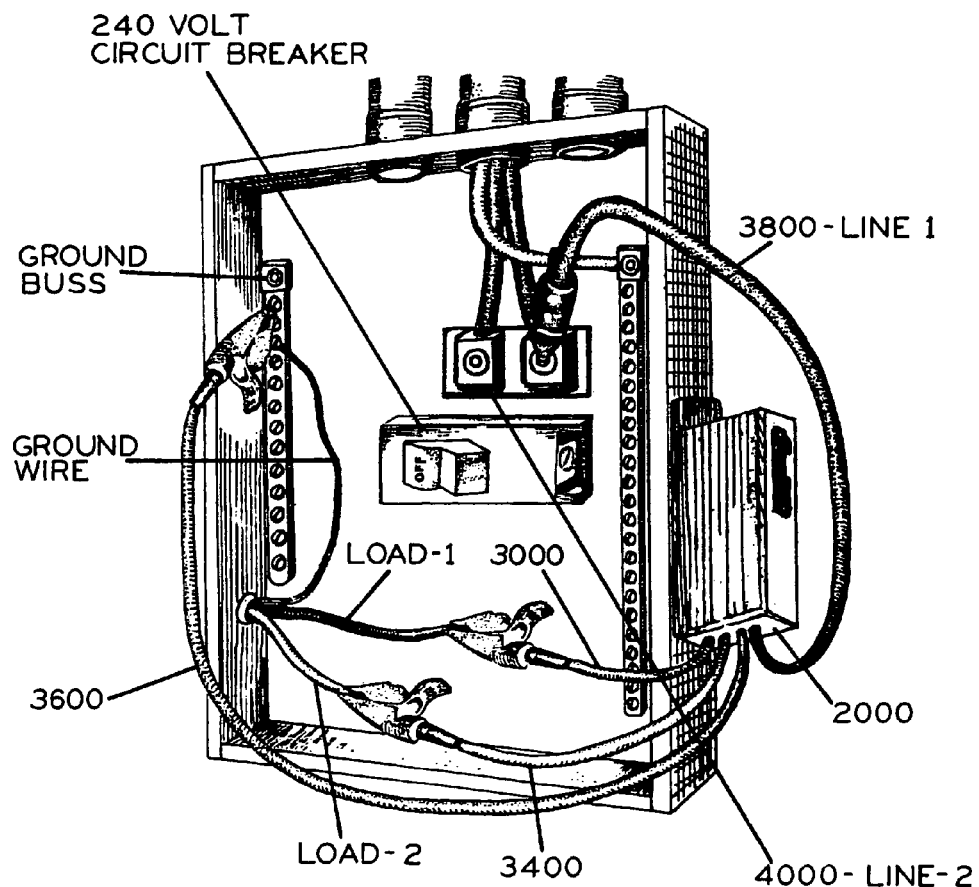
FIG. 51 shows test #1 for a 240 volt ground fault circuit tester with a 3 wire circuit tester hookup with no neutral.
Figure 52:
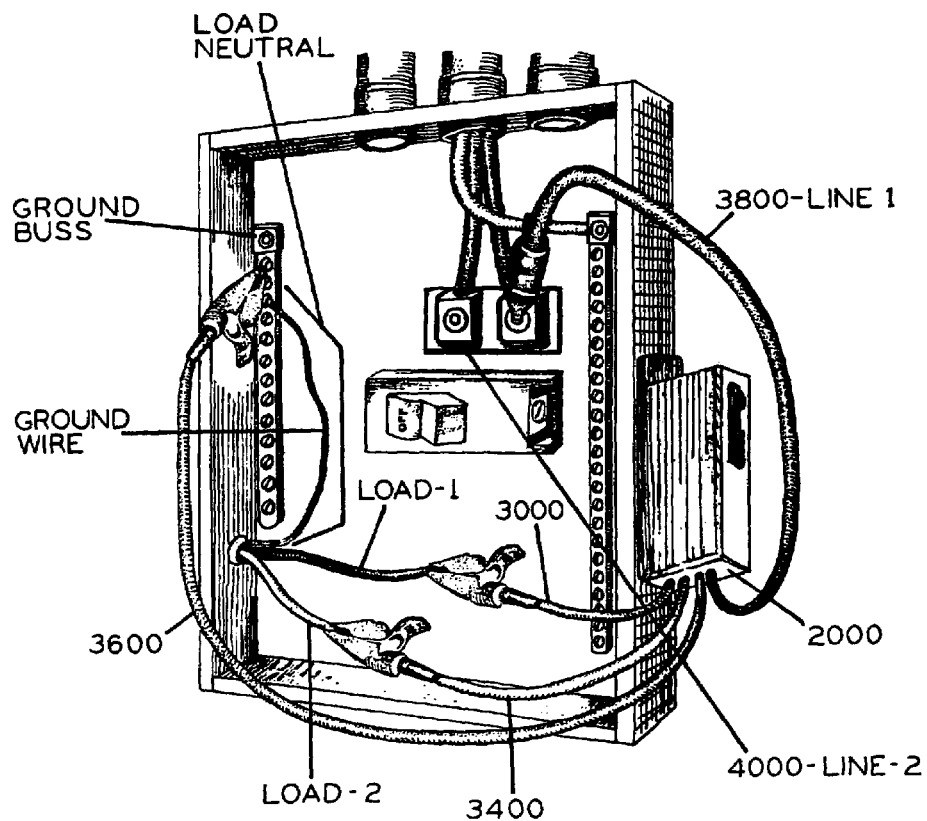
FIG. 52 shows test #2 for a 240 volt ground fault circuit tester with a 4 wire circuit tester hookup with neutral.

Any type of appliance 146 (FIG. 22) can become faulty during operation and leak electrical current to the frame of the appliance. Many appliances are permanently connected to a circuit 116 such as ranges, furnaces, dishwashers and the like. Any faulty appliance 146 can continuously leak current to ground and is unsafe to the person 152 using it, as illustrated in FIG. 37. All of these circuit defects can be detected by the test methods utilized with testers 40, 40A and 66.

In one embodiment, tester 40 including an AFCI is provided. As illustrated in FIG. 1, AFCI tester 40 is provided with two pair of removable test leads 54, 56 and 60, 64 connected in series to base 58 of AFCI tester 40. The test lead ends are distal end sockets 50. Distal end sockets 50 are equipped with removable alligator clamps 52 as illustrated, or current probes or any means by which distal end sockets 50 may be removably connected to circuit 116.

AFCI breaker 44 of tester 40 is used to test circuit 116 by depressing test button 48. When tester 40 is properly connected in series between line voltage 112 (FIG. 12) and house circuit load 116 (FIG. 12), an existing circuit may be tested through the use of the test methods illustrated in FIGS. 15-20 as described hereinafter.

When test button 48 is depressed, AFCI breaker switch 46 trips to the off position. When test button 48 is depressed, appliances 146, lights 122, and outlets 124 (FIG. 12) between tester 40 and end 130 of circuit 116 should be dead. This can be verified by plugging in a load, such as a lamp or light bulb tester anywhere on circuit 116. Similarly, the power should be restored to all of the appliances and outlets between tester 40 and end 130 of circuit 116 when AFCI breaker switch 46 is pushed forward to the on position.

In an exemplary embodiment shown in FIG. 1, AFCI breaker 44 is mounted in tester 40 having openings on the side thereof, wherein AFCI breaker 44 is partially enclosed in tester 40. The distal tester leads are removable sockets 50 and extend through one or more openings 64 in base 58 of tester 40. Sockets 50 and alligator clamp ends 52 are outside of tester 40 and secured thereto or are otherwise adapted to be connected between line test leads 54, 56 and load test leads 60, 62 of tester 40, and are connected to circuit 116 to indicate ground fault leakage in an amount greater than 30 mA and arc fault leakage in an amount greater than 50 A.

In another embodiment, tester 40A including an AFCI is provided. As illustrated in FIG. 2, AFCI tester 40A is provided with two pair of removable test leads 54A, 56A and 60A, 64A connected in series to base 58A of AFCI tester 40A. The test lead ends are distal end sockets 50A. Distal end sockets 50A are equipped with removable alligator clamps 52A as illustrated, or current probes or any means by which distal ends 50A may be removably connected to circuit 116.

AFCI breaker 44A of tester 40A is used to test circuit 116 by depressing test button 48A. When tester 40A is properly connected in series between line voltage 112 (FIG. 12) and house circuit load 116 (FIG. 12), an existing circuit may be tested through the use of the test methods illustrated in FIGS. 15-20 as described hereinafter.

When test button 48A is depressed, AFCI breaker switch 46A trips to the off position. When test button 48A is depressed, appliances 146, lights 122, and outlets 124 (FIG. 12) between tester 40A and end 130 of circuit 116 should be dead. This can be verified by plugging in a load, such as a lamp or light bulb tester anywhere on circuit 116. Similarly, the power should be restored to all of the appliances and outlets between tester 40A and end 130 of circuit 116 when AFCI breaker switch 46A is pushed forward to the on position.

In an exemplary embodiment shown in FIG. 2, AFCI breaker 44A is mounted in tester 40A having openings on the side thereof, wherein AFCI breaker 44A is partially enclosed in tester 40A. The distal tester leads are removable sockets 50A and extend through one or more openings 64A in base 58A of tester 40A. Distal leads 50A and alligator clamp ends 52A are outside of tester 40A and secured thereto or are otherwise adapted to be connected between line test leads 54A, 56A and load test leads 60A, 62A of tester 40A, and are connected to circuit 116 to indicate ground fault leakage in an amount greater than 50 mA and arc fault leakage in an amount greater than 70 A.

Referring now to FIG. 3, a method is shown for testing electrical circuits 116 by utilizing two types of AFCI breakers 44, 44B to provide the portability of efficient diagnostic circuit testing with tester 66 for all existing electrical circuits 116. By the test methods shown in FIGS. 15-20, electrical circuits 116 and appliances 146, no matter how old, can be tested for arc fault current leakage greater than 50 A using breaker 44, arc fault current leakage greater than 70 A using breaker 44B, ground fault current leakage greater than 30 mA using breaker 44, and ground fault current leakage greater than 50 mA using breaker 44B. All circuit defects can be detected by the test method utilized with tester 66.

In one embodiment, tester 66 including two AFCI breakers 44, 44B is provided. As illustrated in FIG. 3, AFCI circuit tester 66 is provided with three pairs of removable test leads 54B, 56B; 60B, 62B; and 62C, 60C connected in series to base 70 of tester 66. The test lead ends are distal end sockets 50B. Distal end sockets 50B are equipped with removable alligator clamps 52B as illustrated, or test probes or any means by which distal ends 50B may be removably connected to circuit 116.

AFCI breakers 44, 44B of tester 66 are used to test circuit 116 by depressing test buttons 48, 48B. When tester 66 is properly connected in series between line voltage 112 (FIG. 12) and house circuit 116 (FIG. 12), an existing circuit may be tested through the use of the test method illustrated in FIGS. 15-20 as described hereinafter.

When test button 48 or 48B is depressed, corresponding AFCI breaker switch 46 or 46B trips to the off position. When test button 48 or 48B is depressed, appliances 146, lights 122, outlets 124 (FIG. 12) between tester 66 and end 130 of circuit 116 should be dead. This can be verified by plugging in a load, such as a lamp or light bulb tester anywhere on circuit 116. Similarly, the power should be restored to all of the appliances and outlets between circuit tester 66 and end 130 of circuit 116 (FIG. 12) when AFCI breaker switch 46 or 46B is pushed forward to the on position.

In an exemplary embodiment, AFCI breakers 44, 44B are mounted in tester 66 having openings on the side thereof, as shown in FIG. 3, wherein AFCI breakers 44, 44B are partially enclosed in tester 66. The distal tester leads are removable sockets 50B and extend through one or more openings 64B in base 70 of tester 66. Sockets 50B and alligator clamp ends 52B are outside of tester 66 and secured thereto or are otherwise adapted to be connected between line test leads 54B, 56B and load test leads 60B, 62B and 60C, 62C of tester 66, and are connected to circuit 116 to indicate ground fault current leakage greater than 30 mA, ground fault current leakage greater than 50 mA, arc fault current leakage greater than 50 A, or arc fault current leakage greater than 70 A.

Figure 4:
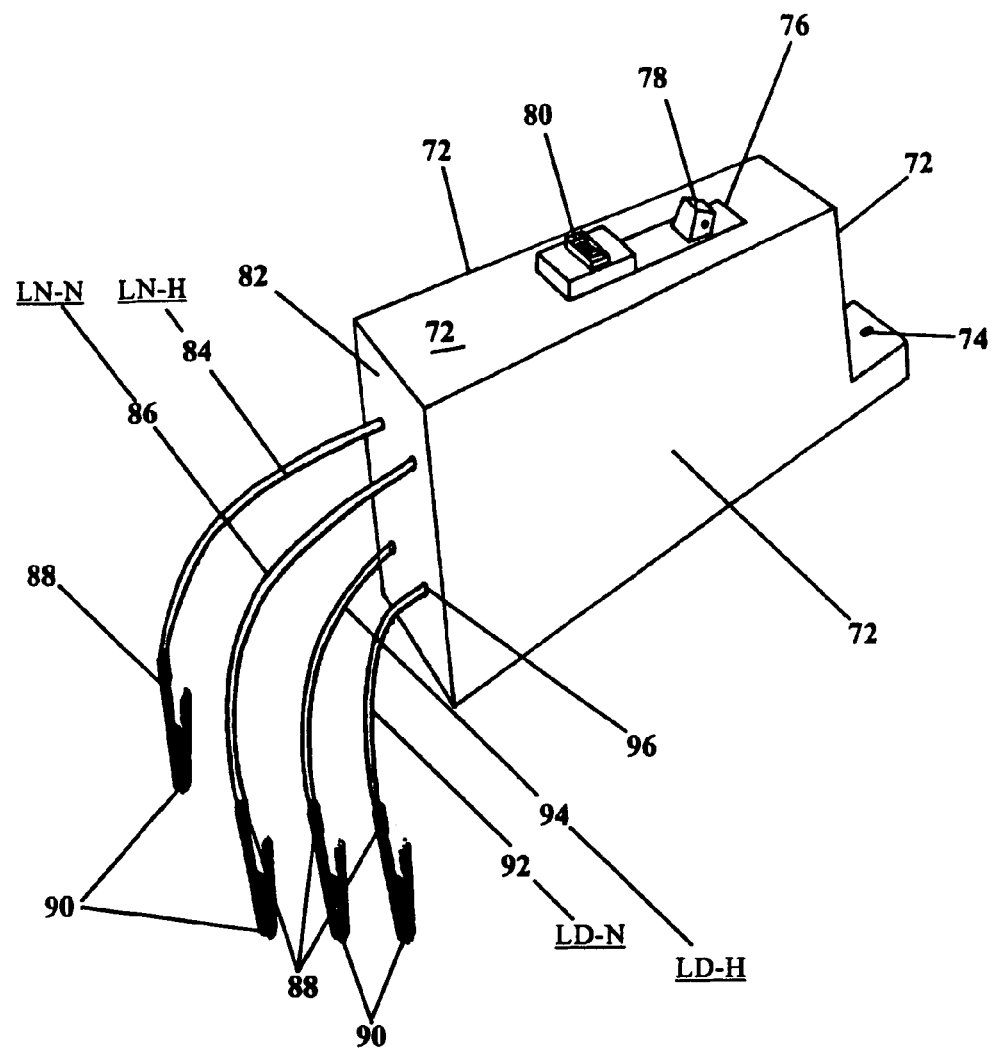
FIG. 4 is a perspective view of a GFCI tester according to one embodiment.
Figure 5:
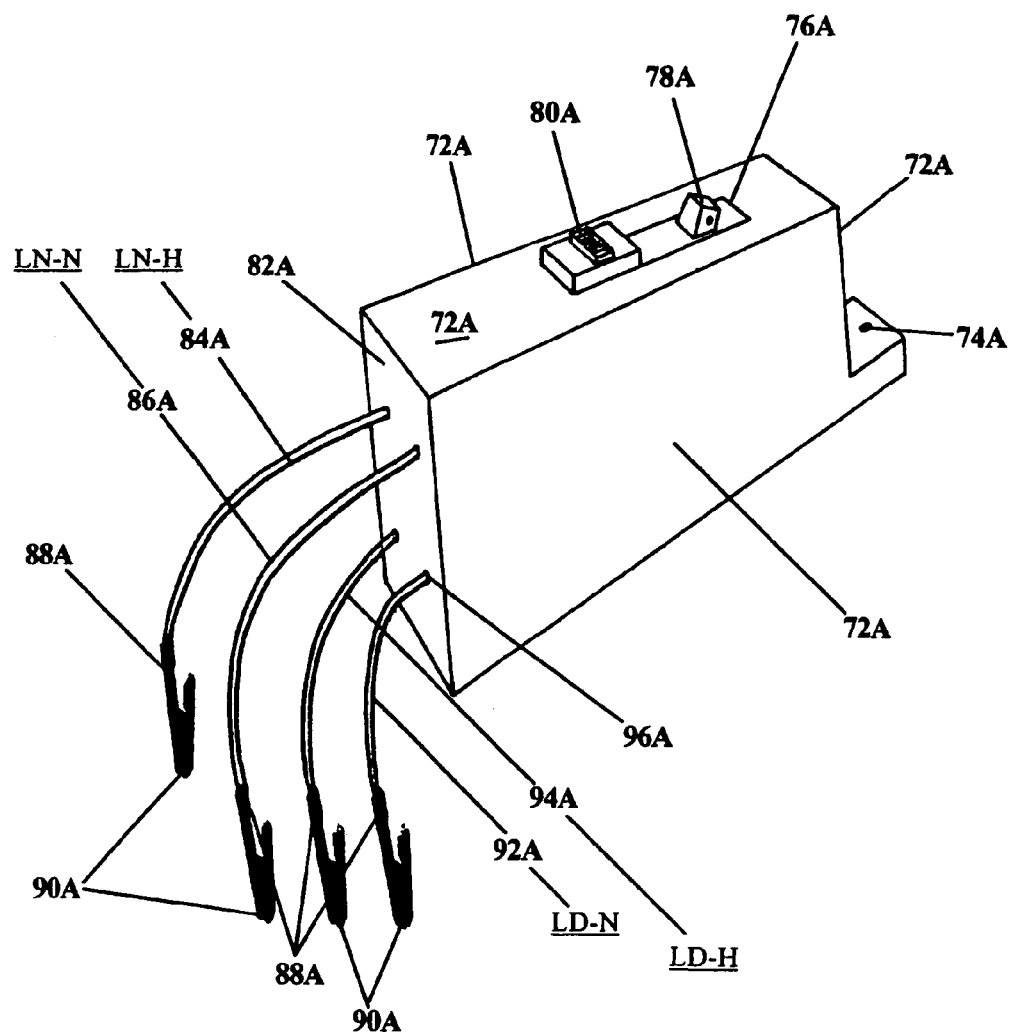
FIG. 5 is a perspective view of a GFCI tester according to one embodiment.
Figure 6:
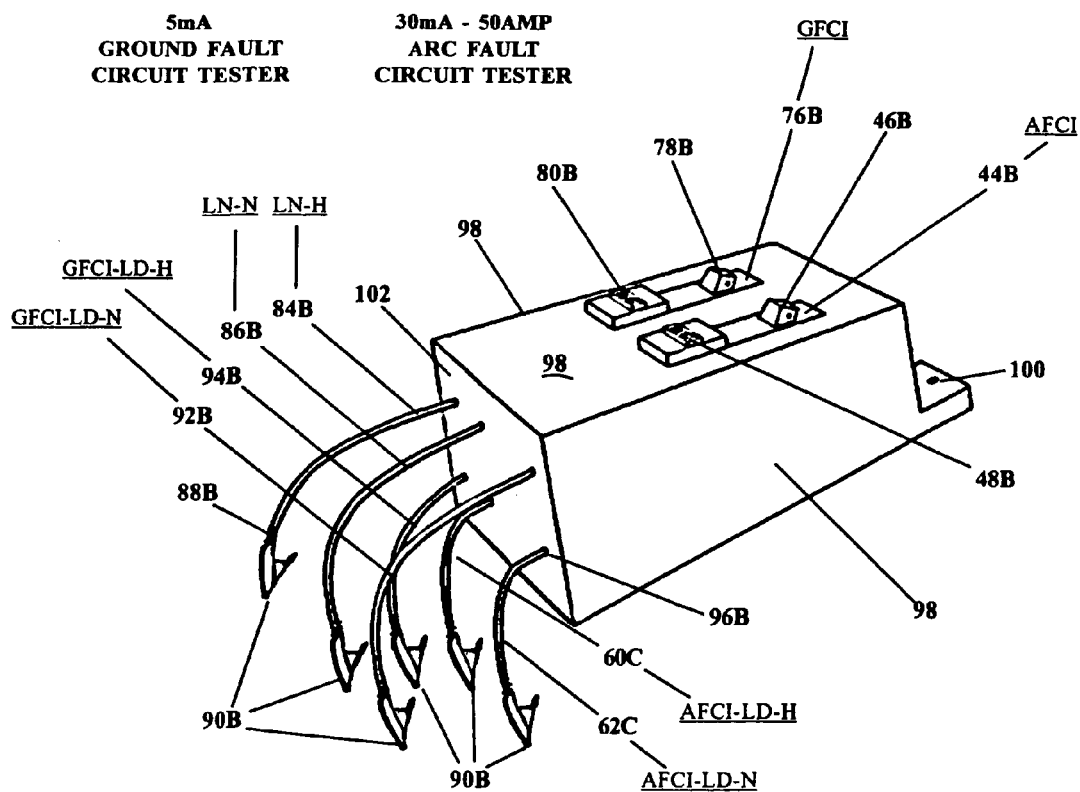
FIG. 6 is a perspective view of an AFCI and GFCI tester according to one embodiment.
Figure 7:
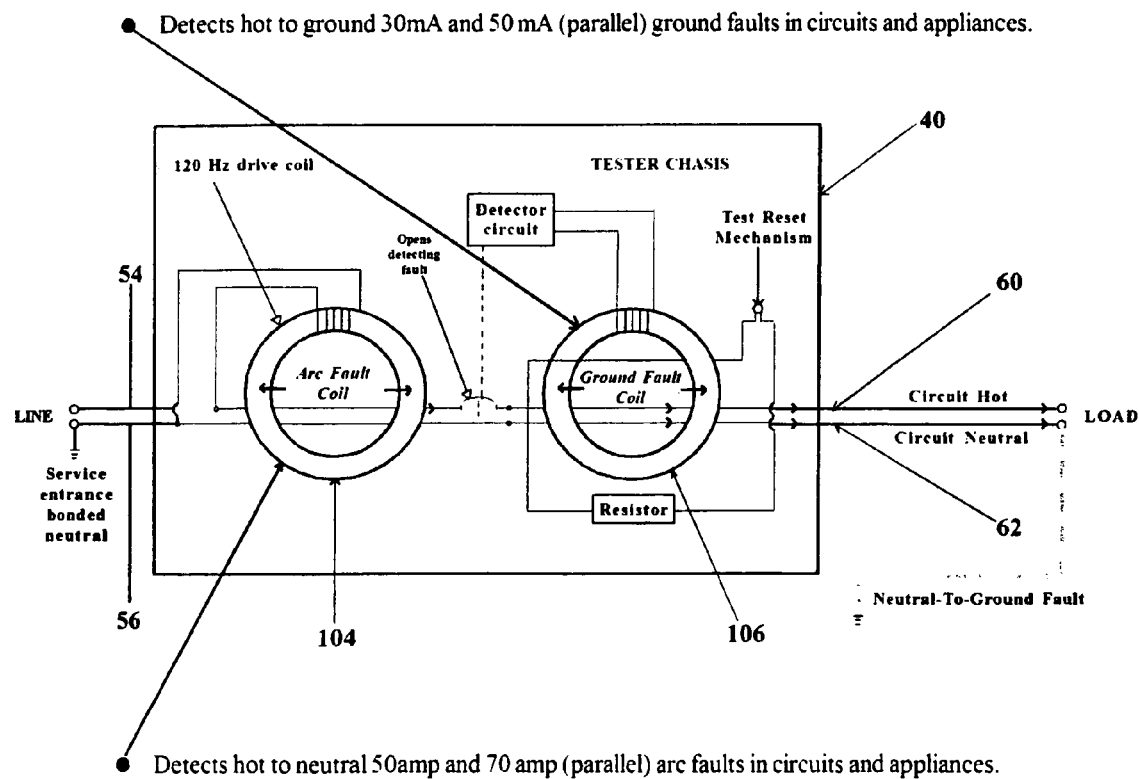
FIG. 7 shows an AFCI tester useful in a method according to one embodiment.
Figure 8:
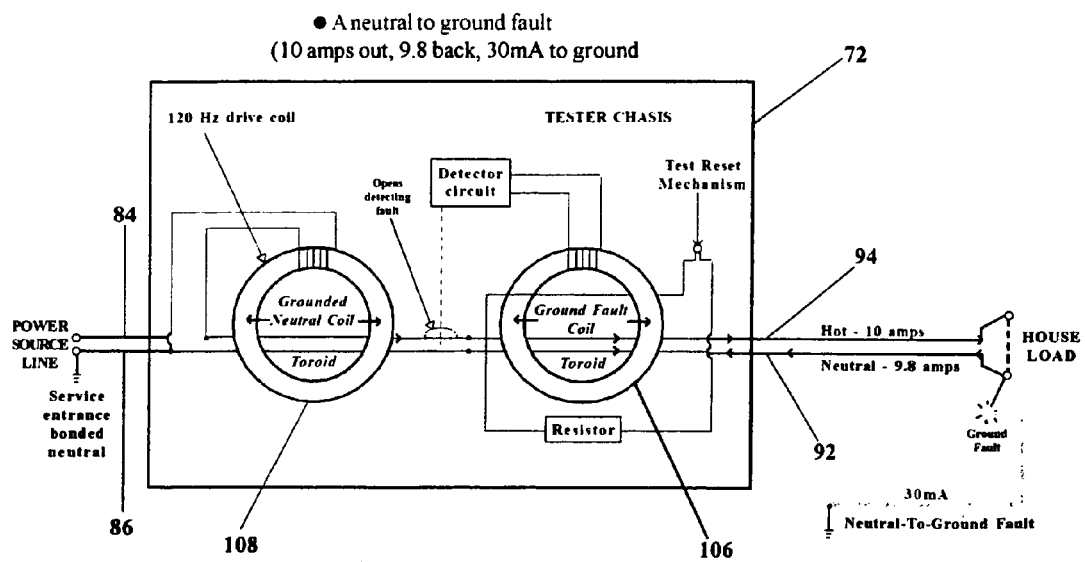
FIG. 8 shows a GFCI tester useful in a method according to one embodiment.
Figure 9:
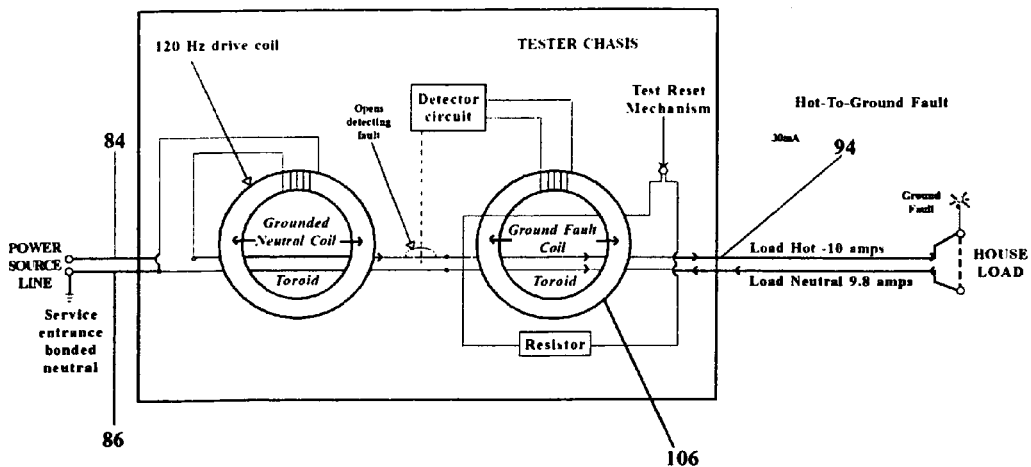
FIG. 9 shows a GFCI tester useful in a method according to one embodiment.
Figure 10:
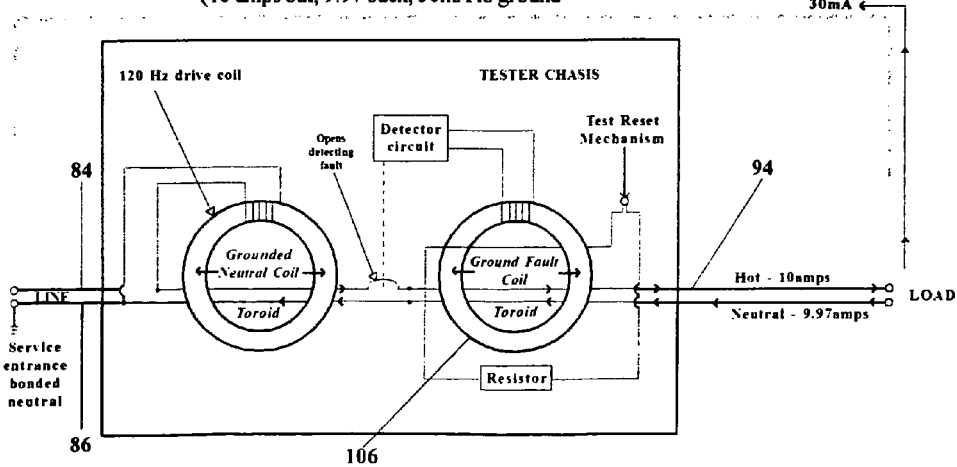
FIG. 10 shows a GFCI tester useful in a method according to one embodiment.

Referring now to FIGS. 4-6, a method is shown for testing electrical circuits 116 (FIG. 22) by utilizing GFCI circuit testers 72, 72A, and 98. By the test methods shown in FIGS. 15-20 and 28-36, all existing electrical circuits 116, no matter how old, can be tested for ground fault and arc fault current leakage. A method is shown for testing electrical circuits 116 by utilizing GFCI breakers 76, 76A to permanently test monitor whole house wiring systems (FIGS. 22-24) and provide the portability of diagnostic circuit testing using testers 72, 72A, and 98 for all existing electrical circuits 116. By the test methods shown in FIGS. 28-36, electrical wiring and appliances, no matter how old, can be tested for ground fault current leakage greater than 5 mA (FIG. 4), ground fault current leakage greater than 20 mA (FIG. 5), and ground fault current leakage greater than 30 mA (FIG. 6).

All of the circuit defects mentioned above can be detected by the test method utilized with circuit testers 72, 72A and 98.

In one embodiment, tester 72 including a GFCI is provided. As illustrated in FIG. 4, GFCI circuit tester 72 is provided with two pairs of removable test leads 84, 86 and 92, 94 connected in series to base 82 of tester 72. The test lead ends are distal end sockets 88. Distal end sockets 88 are equipped with removable alligator clamps 90 as illustrated, or current test probes or any means by which the distal ends 88 may be removably connected to circuit 116. GFCI breaker 76 of tester 72 is used to test circuit 116 by depressing test button 80. When tester 72 is properly connected in series between line voltage 112 (FIG. 12) and house circuit load 116 (FIG. 12), an existing circuit may be tested through the use of the test methods illustrated in FIGS. 28-36 as described herein.

When test button 80 is depressed, GFCI breaker switch 78 trips to the off position. When test button 80 is depressed, appliances 146, lights 122, and outlets 124 (FIG. 12) between tester 72 and end 130 of circuit 116 should be dead. This can be verified by plugging in a load, such as a lamp or light bulb anywhere on circuit 116. Similarly, the power should be restored to all of the appliances and outlets between tester 72 and end 130 of circuit 116 when GFCI breaker switch 78 is pushed forward to the on position.

In an exemplary embodiment shown in FIG. 4, GFCI breaker 76 is mounted in tester 72 having openings in the side thereof, wherein GFCI breaker 76 is partially enclosed in tester 72. The distal tester leads are removable sockets 88 and extend through one or more openings 96 in base 82 of tester 72. Sockets 88 and alligator clamp ends 90 are outside of tester 72 and secured thereto or are otherwise adapted to be connected between line test leads 84, 86 and load test leads 92, 94 of tester 72, and are connected to circuit 116 to indicate ground fault current leakage greater than 5 mA.

In another embodiment, tester 72A including a GFCI is provided. As illustrated in FIG. 5, GFCI circuit tester 72A is provided with two pairs of removable test leads 84A, 86A and 92A, 94A connected in series to base 82A of tester 72A. The test lead ends are distal end sockets 88A. Distal end sockets 88A are equipped with removable alligator clamps 90A as illustrated, or current test probes or any means by which the distal ends 88A may be removably connected to circuit 116. GFCI breaker 76A of tester 72A is used to test circuit 116 by depressing test button 80A. When tester 72A is properly connected in series between line voltage 112 (FIG. 12) and house circuit load 116 (FIG. 12), an existing circuit may be tested through the use of the test methods illustrated in FIGS. 28-36 as described herein.

When test button 80A is depressed, GFCI breaker switch 78A trips to the off position. When test button 80A is depressed, appliances 146, lights 122, and outlets 124 (FIG. 12) between tester 72A and end 130 of circuit 116 should be dead. This can be verified by plugging in a load, such as a lamp or light bulb anywhere on circuit 116. Similarly, the power should be restored to all of the appliances and outlets between tester 72A and end 130 of circuit 116 when GFCI breaker switch 78A is pushed forward to the on position.

In an exemplary embodiment shown in FIG. 5, GFCI breaker 76A is mounted in tester 72A having openings in the side thereof, wherein GFCI breaker 76A is partially enclosed in tester 72A. The distal tester leads are removable sockets 88A and extend through one or more openings 96A in base 82A of tester 72A. Sockets 88A and alligator clamp ends 90A are outside of tester 72A and secured thereto or are otherwise adapted to be connected between line test leads 84A, 86A and load test leads 92A, 94A of tester 72A, and are connected to circuit 116 to indicate ground fault current leakage greater than 20 mA.

Referring now to FIG. 6, a method is shown for testing electrical circuits 116 by utilizing a combination circuit tester 98 with interchangeable parts consisting of GFCI breaker 76B and AFCI breaker 44B to provide the efficient portability of diagnostic circuit testing for all existing electrical circuits 116. By the test methods shown in FIGS. 15-20 and 28-36, electrical wiring and appliances, no matter how old, can be tested for ground fault current leakage and arc fault current leakage. Circuit defects can be detected by the test method utilized with tester 98 according to the method described below.

In one embodiment, tester 98 including a GFCI and an AFCI is provided. As illustrated in FIG. 6, tester 98 is provided with three pairs of removable test leads 84B, 86B; 92B, 94B; and 60C, 62C connected in series to base 102 of tester 98. The test lead ends are distal end sockets 88B. Distal end sockets 88B are equipped with removable alligator clamps 90B as illustrated, or test probes or any means by which distal ends 88B may be removably connected to circuit 116.

GFCI breaker 76B and AFCI breaker 44B of tester 98 are used to test circuit 116 by depressing test buttons 80B and 48B, respectively. When tester 98 is properly connected in series between line voltage 112 (FIG. 12) and house circuit load 116 (FIG. 12), an existing circuit may be tested through the use of the test methods illustrated in FIGS. 15-20 and 28-36 as described hereinbelow.

When test button 80B is depressed, GFCI breaker switch 78B trips to the off position. When test button 48B is depressed, AFCI breaker switch 46B trips to the off position. When either test button 80B or 48B is depressed, appliances 146, lights 122, and outlets 124 (FIG. 12) between tester 98 and end 130 of circuit 116 should be dead. This can be verified by plugging in a load, such as a lamp or light bulb anywhere on circuit 116. Similarly, the power should be restored to all circuit electrical items (FIG. 12) between tester 98 and end 130 of circuit 116 when GFCI breaker switch 78B, or AFCI breaker switch 46B is pushed forward to the on position.

In an exemplary embodiment, GFCI breaker 76B and AFCI breaker 44B are mounted in tester 98 having openings in the side thereof, as shown in FIG. 6, wherein GFCI breaker 76B and AFCI breaker 44B are partially enclosed in tester 98. The distal tester leads are removable sockets 88B and extend though one or more openings 96B in base 102 of tester 98. Sockets 88B and alligator clamp ends 90B are outside of tester 98 and secured thereto or are otherwise adapted to be connected between line test leads 84B, 86B and load test leads 92B, 94B and 60B, 62B of tester 98, and are connected to circuit 116 to indicate ground fault current leakage greater than 5 mA, ground fault current leakage greater than 20 mA, ground fault current leakage greater than 30 mA, arc fault current leakage greater than 50 A, or arc fault current leakage greater than 70 A.

In order to perform testing on existing electrical circuits for electrical faults, power source 112 (FIGS. 12-13) representing line voltage to circuit 116 is identified with a voltage tester 150 (FIG. 26), or an equivalent device. A portable light bulb tester or table lamp carried from outlet to outlet would suffice as an equivalent device. All dead outlets 118, 124, 126, 130, appliances 146, and lights 122 (FIG. 12) on circuit 116 are identified as dead or having no power.

It is a desired object to provide improved circuit 116, circuit testers 40, 40A, 66, 72, 72A, 98, and circuit test methods as shown in FIGS. 15-20 and 28-36 for testing circuits to detect arc fault and ground fault current leakage which simulate/duplicate the everyday use of live electrical current in circuit 116 for outlets 118, 124, 126, 130, appliances 146, and lights 122. The ground fault and AFCI testers and test methods discussed herein are accomplished with live AC current which enables the user to recreate actual electrical fault current leakage such as thermal arc tracking. Electrical faults identified by the methods are undetectable by other types of conventional DC type (battery operated) test instruments.

In all tests shown in FIGS. 15-20 and 28-36, a LINE hot and a LINE neutral power source is connected to LOAD (hot) and LOAD (neutral) tester leads of the improved AFCI and GFCI testers.

Figure 15:
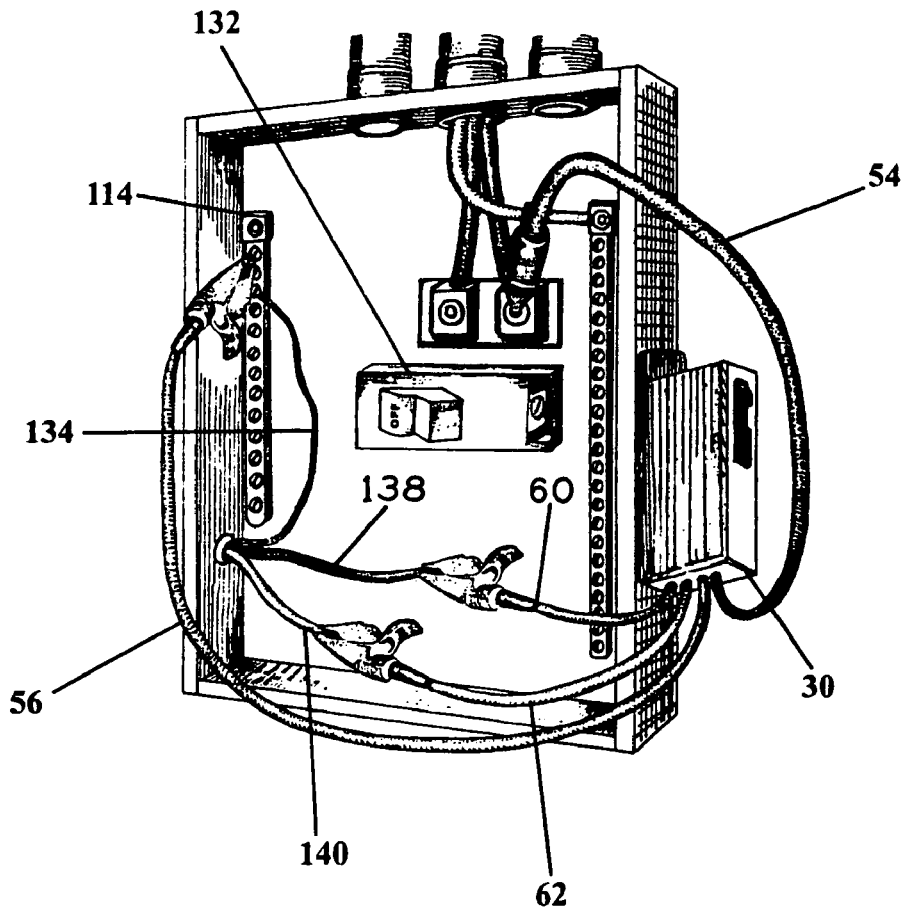
FIG. 15 illustrates test #1 according to one embodiment of the AFCI test method.

In one embodiment of the present method, FIG. 15 illustrates circuit test #1 wherein circuit breaker 132 is turned off to circuit 116 and house circuit load hot wire 138 is attached to tester hot load lead wire 60. House circuit load neutral wire 140 is attached to tester neutral load lead wire 62.

Figure 21:
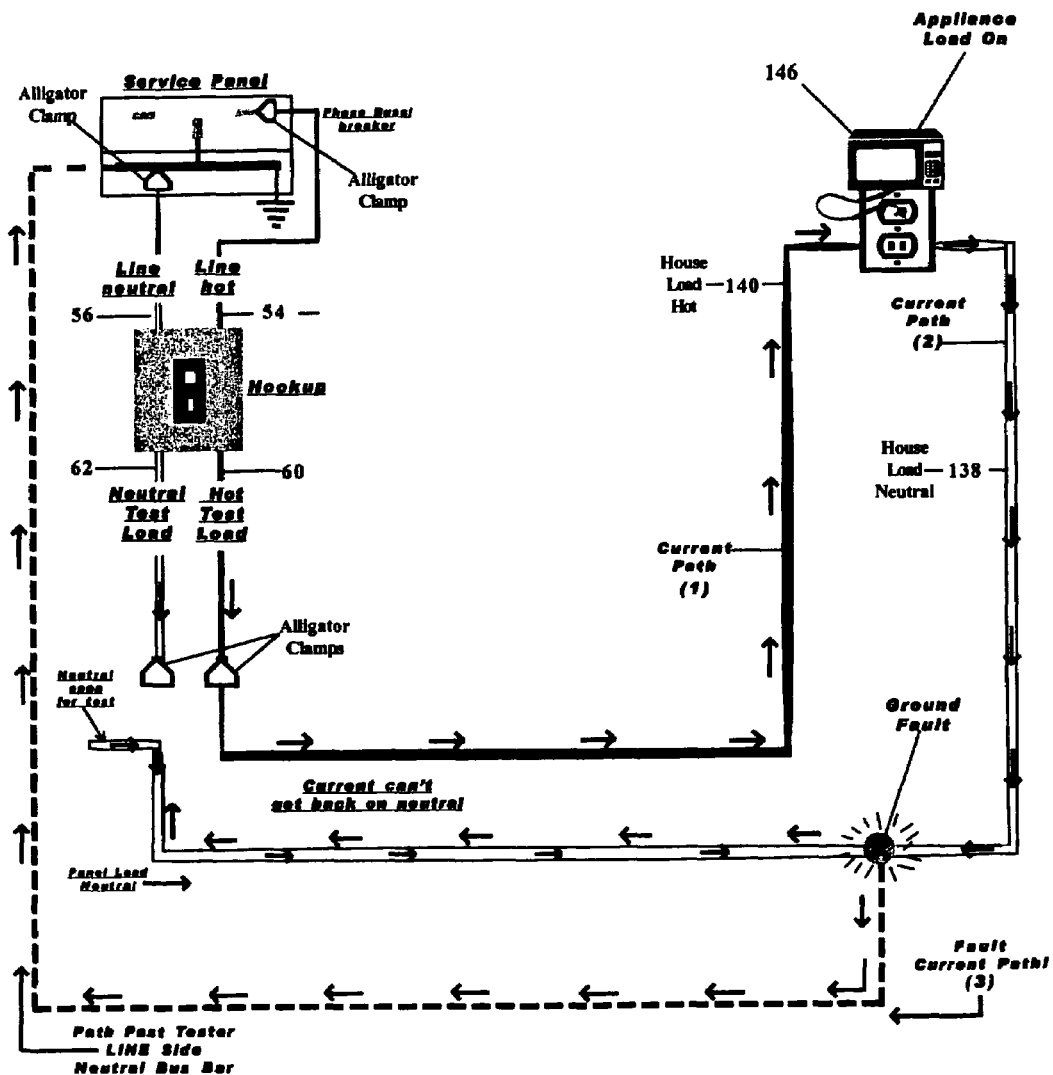
FIG. 21 illustrates a method using test #2 of FIG. 16 and test #8 of FIG. 29 with an open neutral circuit, wherein an illustration is provided of how electrical fault current is detected by an AFCI/GFCI circuit tester when a house circuit neutral is opened via dropping circuit tester load neutral.

Referring now to FIG. 21, a description of the "live" open neutral test or how the current flow works during tests #2 (FIG. 16) and #8 (FIG. 29) is provided. FIG. 21 illustrates how electrical fault current is detected by an AFCI/GFCI circuit tester when a house circuit neutral is opened (via dropping circuit tester load neutral).

The circuit test is intended to force electrical current flow away from its originally intended path on the neutral—to another path out a ground fault, thereby sending the current flow from the load side to the line side of the AFCI/GFCI tester. Here, a line neutral test lead of the AFCI/GFCI circuit tester is attached (via an alligator clamp) to the ground buss bar in a breaker/fuse panel.

In other words, current flows out from the AFCI/GFCI tester on the circuit hot load lead and attempts to return on the circuit neutral load. When the current cannot return on the neutral path, because the neutral is open, one of two things happen: 1) if there is no electrical fault, nothing changes because no current flows; or 2) if there is a ground fault or grounded arc fault, the current will choose a path which circumvents the circuit tester by making its way back to the neutral/ground buss either through a mechanical (copper or aluminum) ground wire of the circuit or grounded surface such as wet soil, rebar, aluminum siding, water/gas pipe, etc.

When electrical current leaves a source, it returns to the source, via a grounded intentional path or a grounded unintentional path. A ground fault or a grounded arc fault is an unintentional path (in parallel) with a circuit hot/neutral conductor.

In FIG. 21, there are four stages of development when performing Test #2 (FIG. 16) and Test #8 (FIG. 29): 1) electrical current flows out on the load hot from the GFCI/AFCI tester; 2) the circuit tester neutral is opened so no current can return on the original grounded neutral path; 3) when the current cannot get back on the house load neutral, it looks for another available return path, if one exists, through an electrical fault; and 4) due to the AFCI/GFCI circuit tester hookup (in series) with a line side panel neutral buss, ground faults and grounded arc faults can be detected by a circuit tester when the fault current is routed through a neutral/ground substitute return path. When abnormal fault current is detected, the GFCI or AFCI tester trips a torrid sensor reset button. If no fault current is detected, electricity is dispersed from the tester to the open neutral to other points throughout a circuit. In theory, the current floats throughout parts of a circuit harmlessly.

Figure 16:
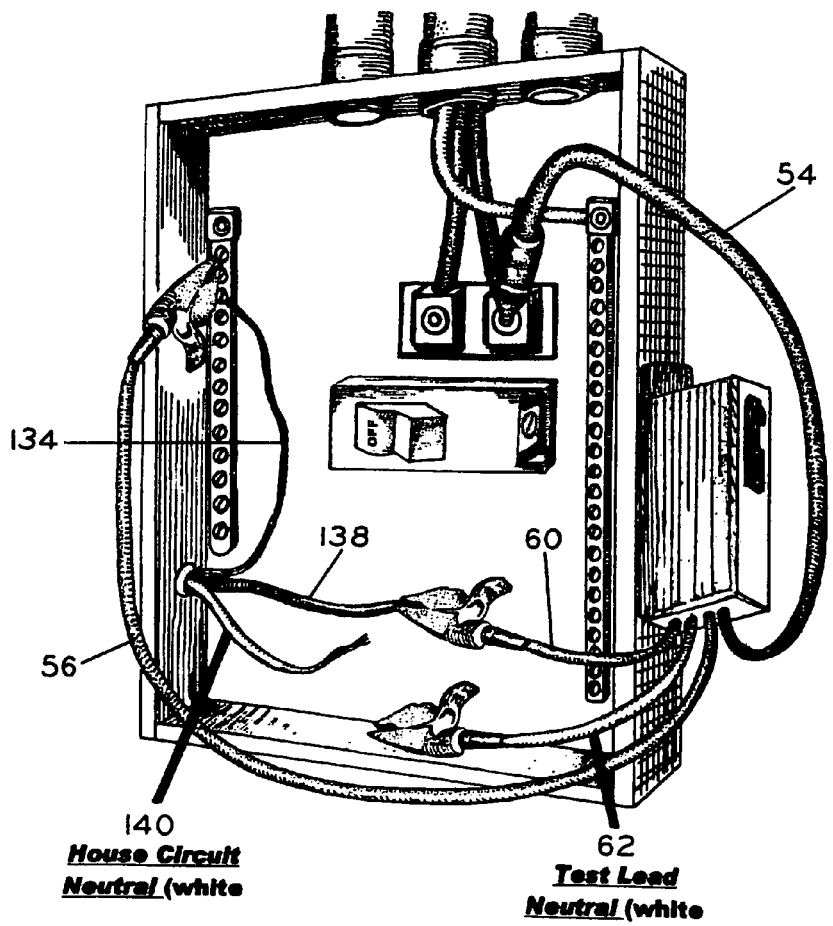
FIG. 16 illustrates test #2 according to one embodiment of the AFCI test method.
Figure 17:
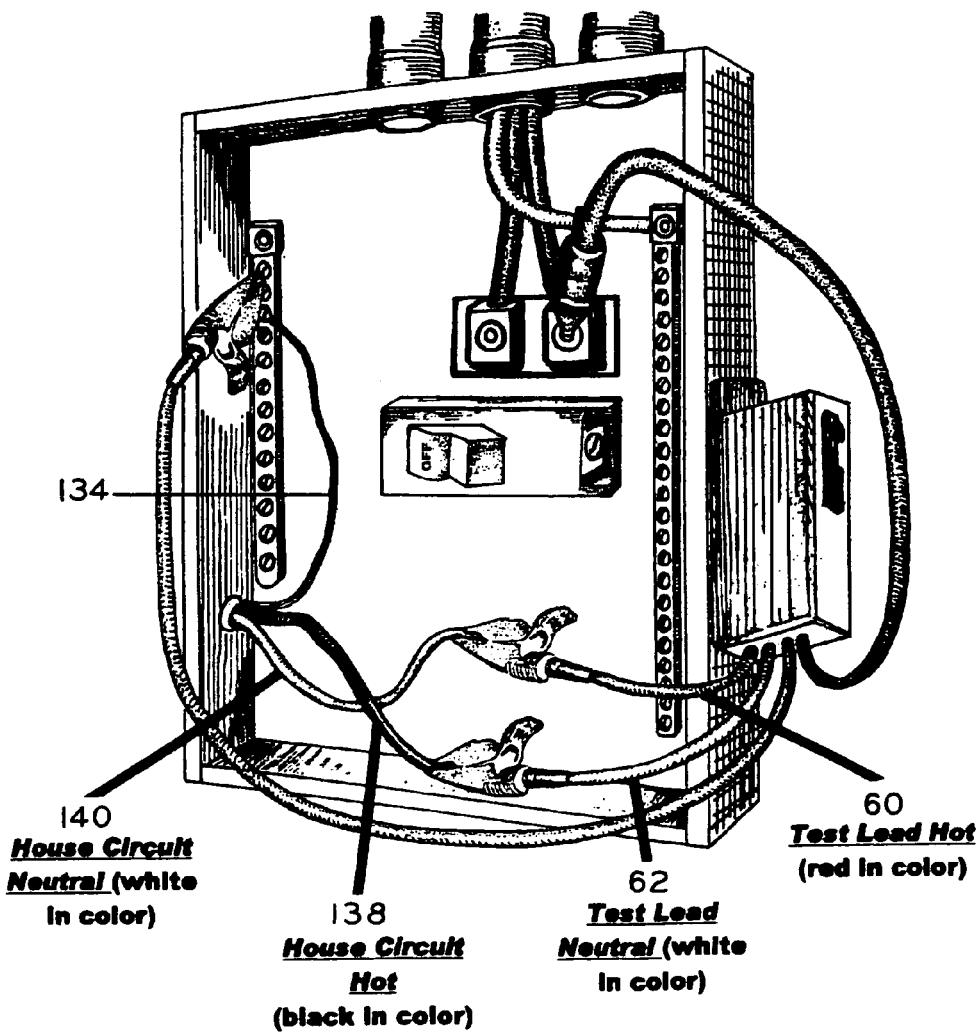
FIG. 17 illustrates test #3 according to one embodiment of the AFCI test method.
Figure 18:
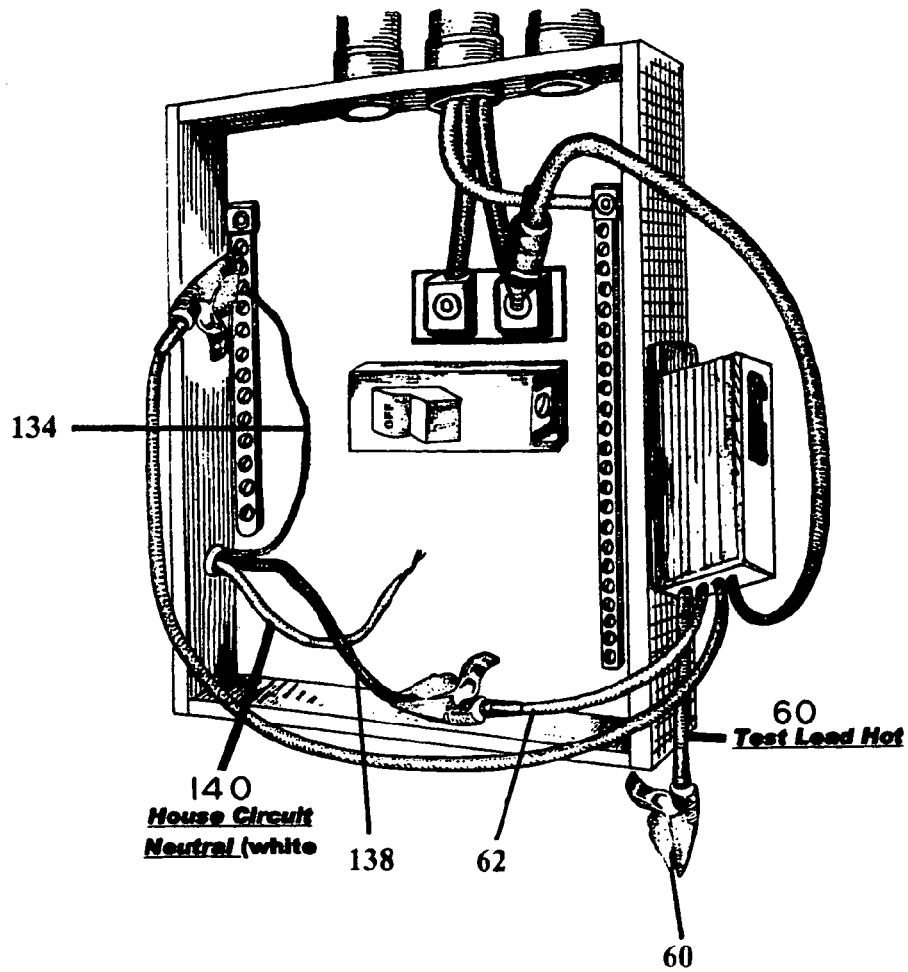
FIG. 18 illustrates test #4 according to one embodiment of the AFCI test method.
Figure 19:
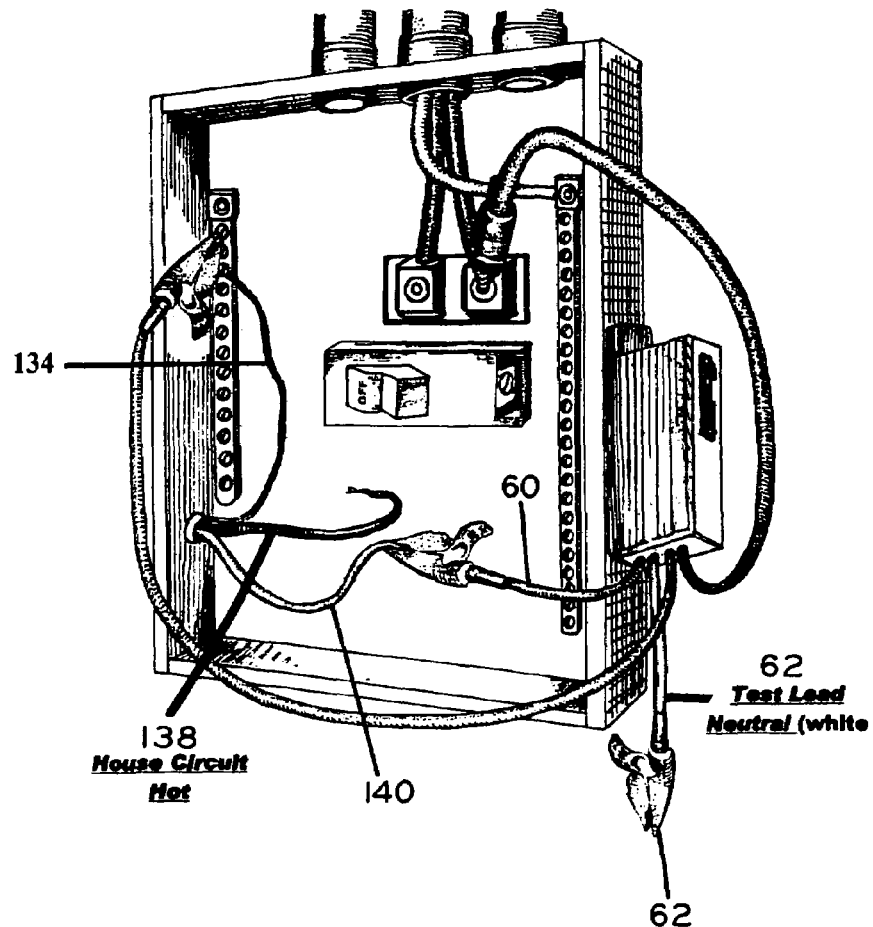
FIG. 19 illustrates test #5 according to one embodiment of the AFCI test method.
Figure 20:
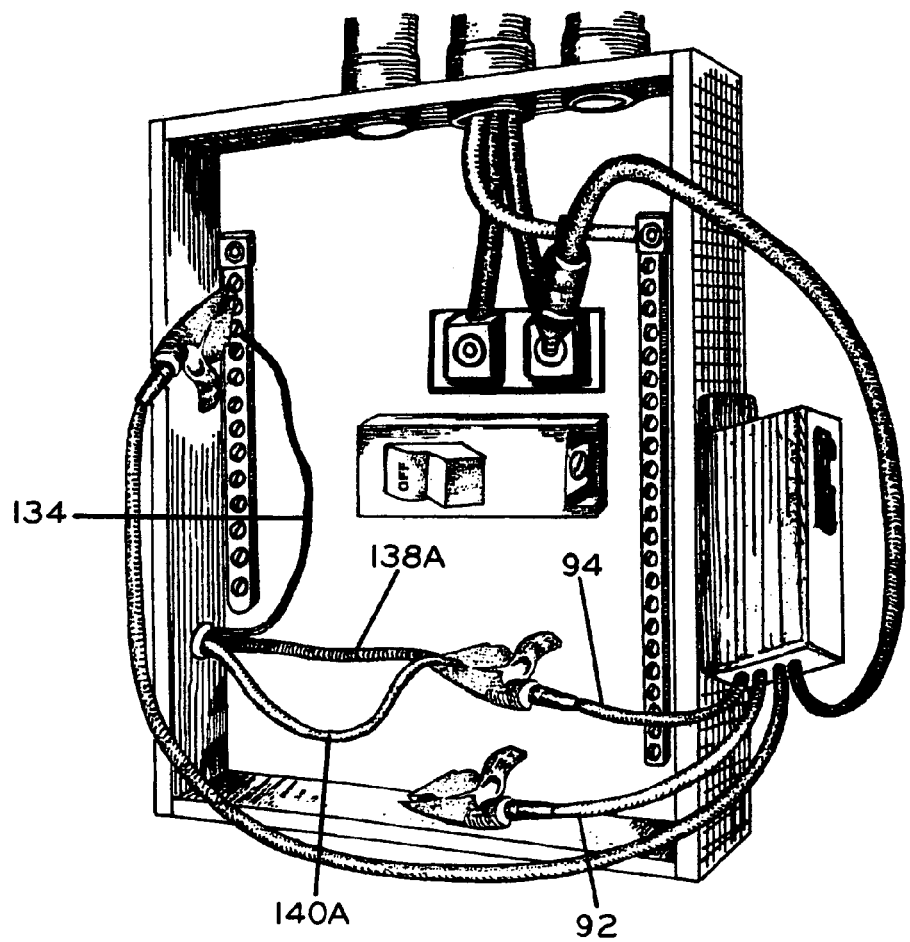
FIG. 20 illustrates test #6 according to one embodiment of the AFCI test method.
Figure 29A:
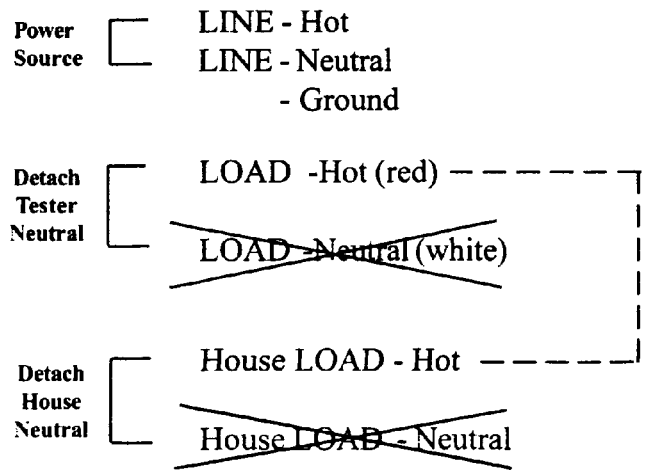
FIG. 29A shows connections for test #8.
Figure 30:
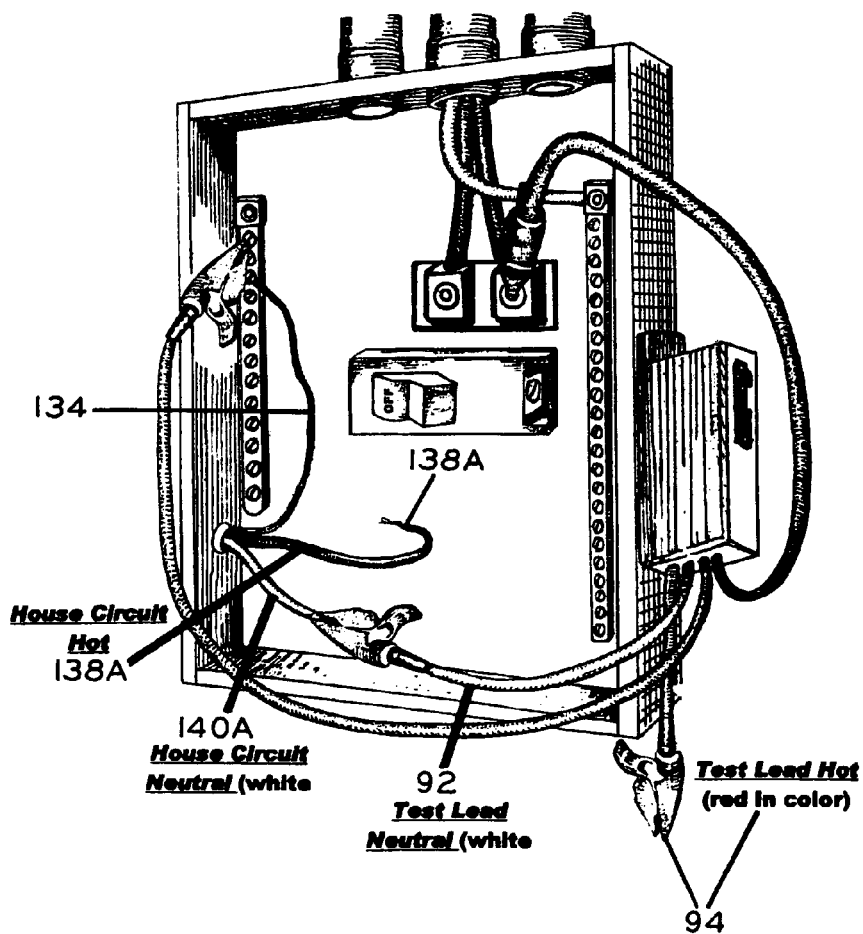
FIG. 30 illustrates test #9 according to one embodiment of the GFCI test method.
Figure 31:
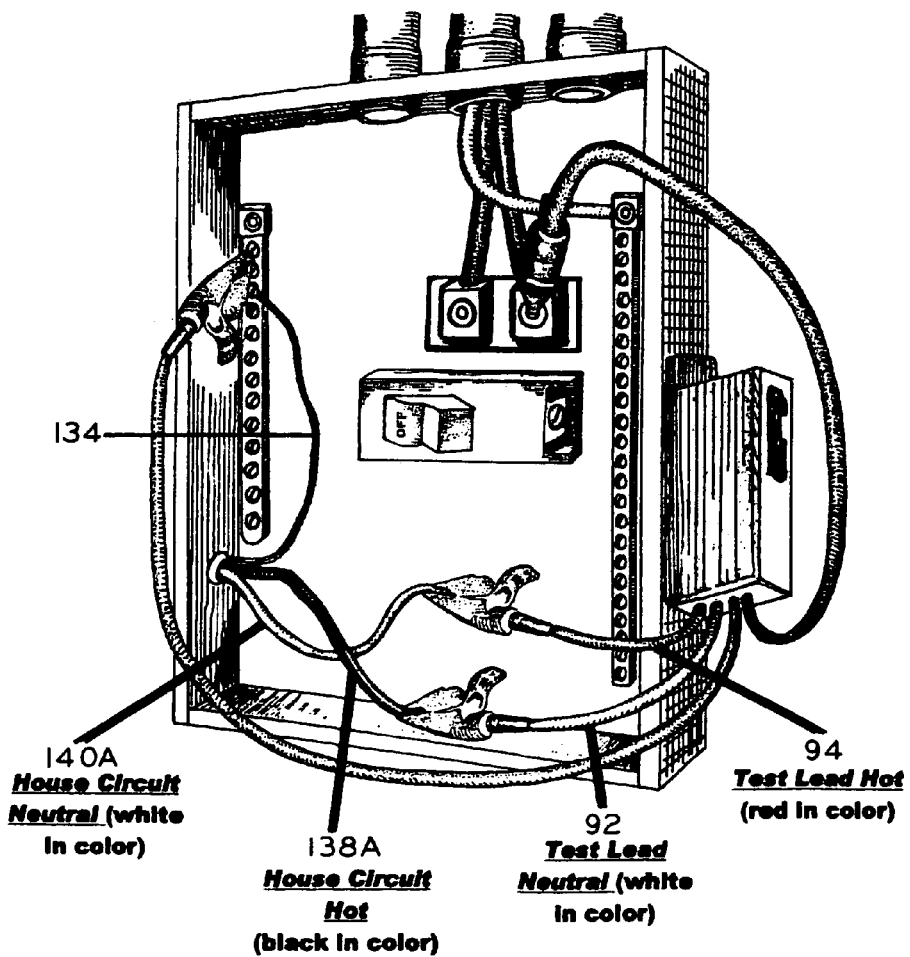
FIG. 31 illustrates test #10 according to one embodiment of the GFCI test method.
Figure 32:
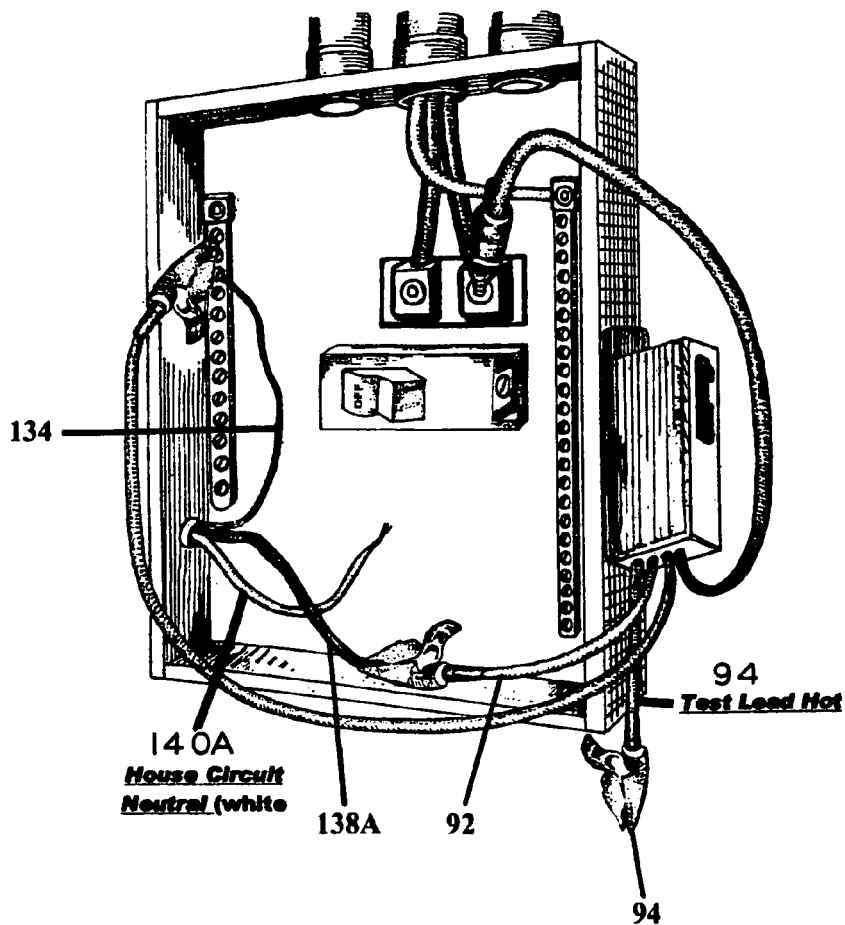
FIG. 32 illustrates test #11 according to one embodiment of the GFCI test method.
Figure 33:
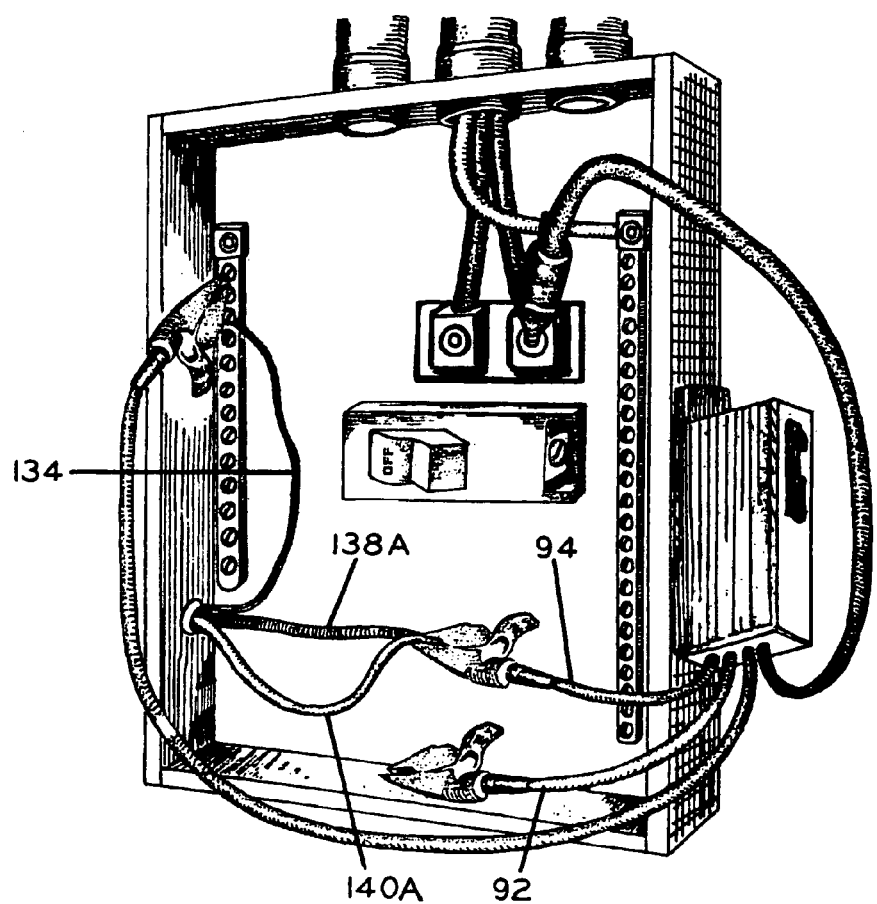
FIG. 33 illustrates test #12 according to one embodiment of the GFCI test method.
Figure 34:
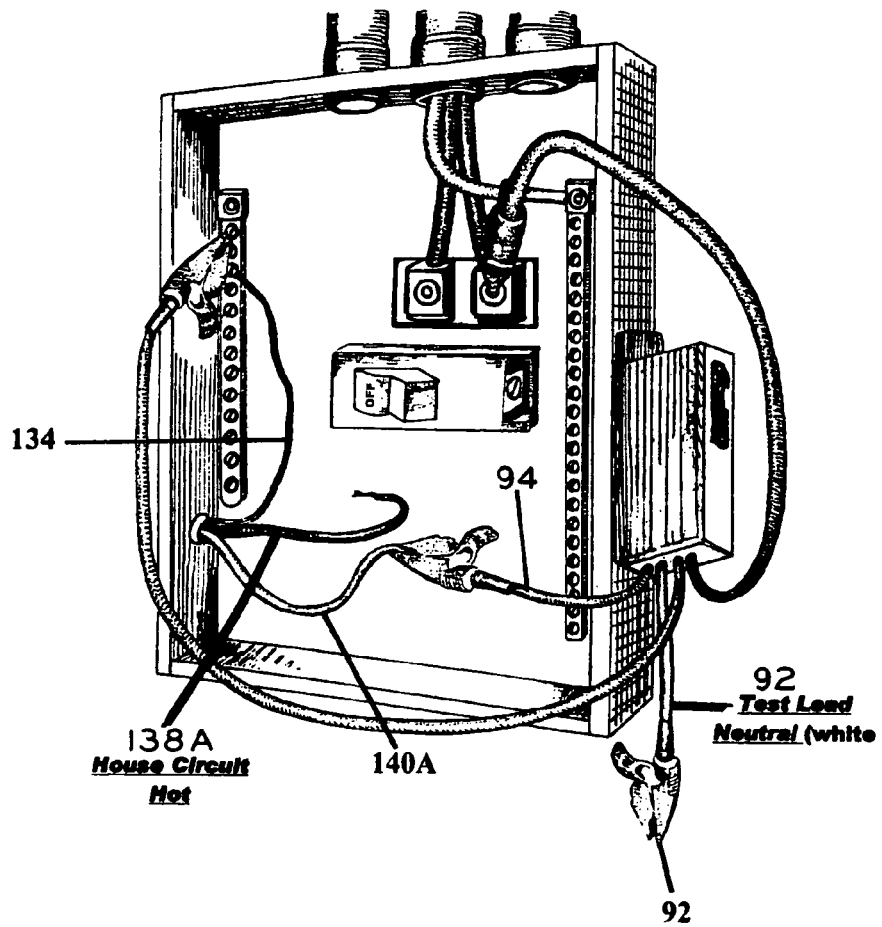
FIG. 34 illustrates test #13 according to one embodiment of the GFCI test method.
Figure 35:
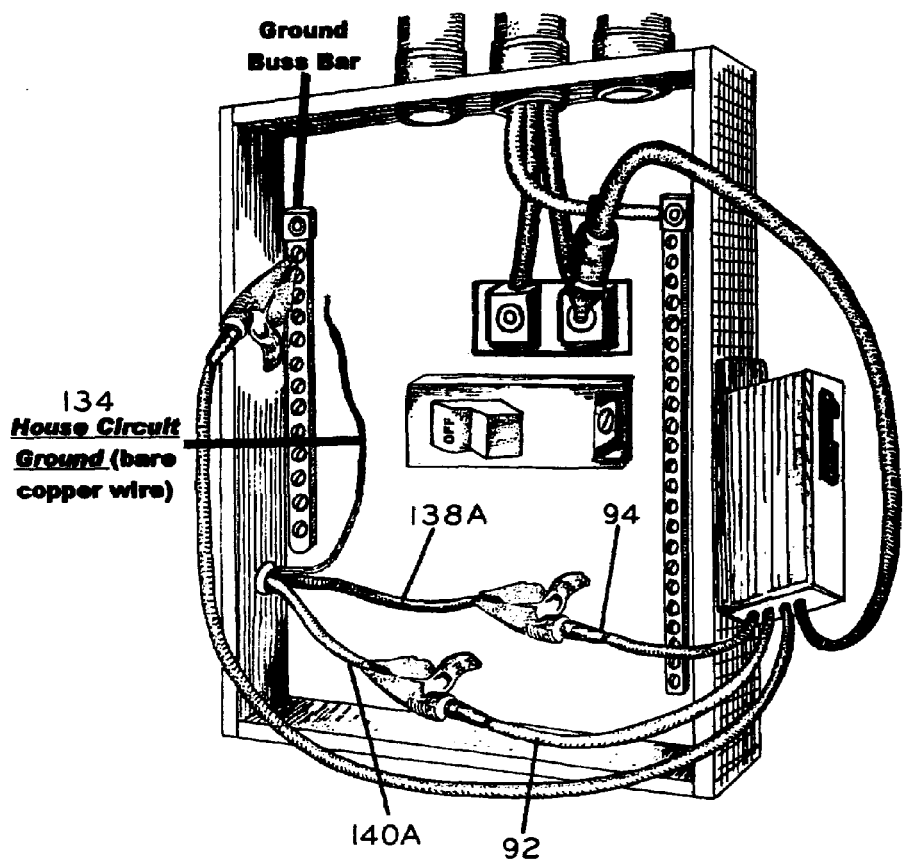
FIG. 35 illustrates test #14 according to one embodiment of the GFCI test method.
Figure 36:
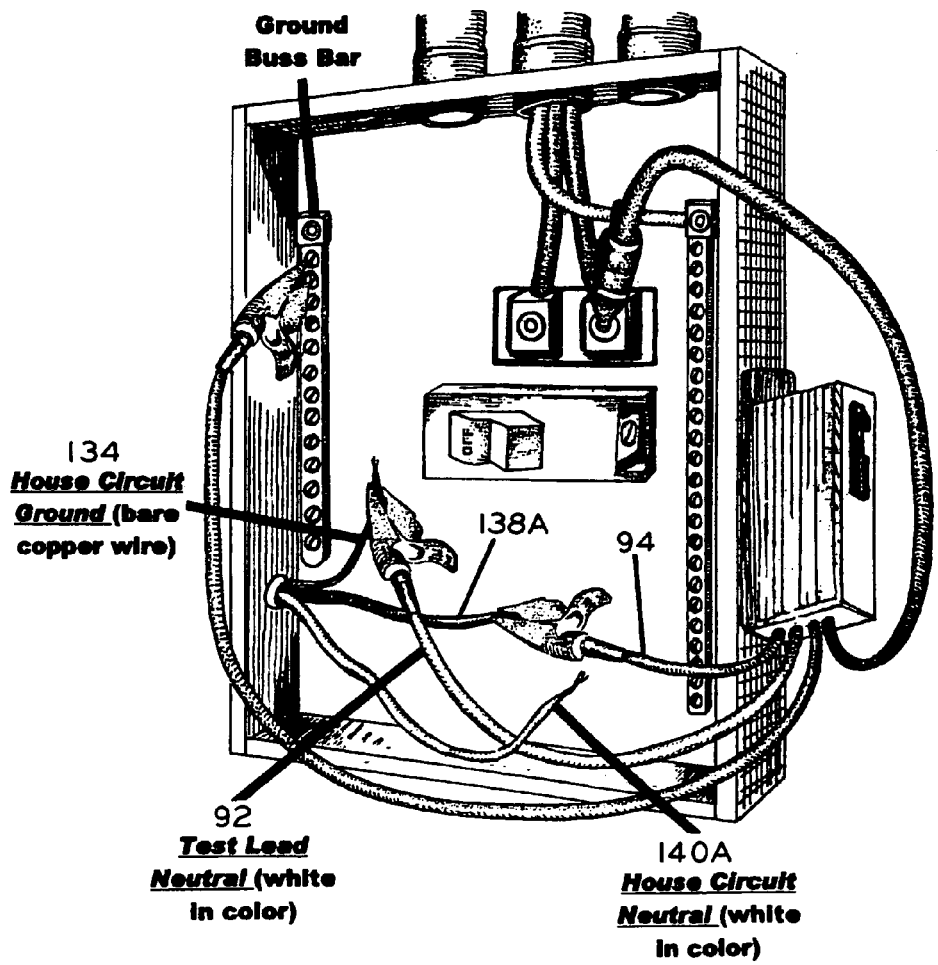
FIG. 36 illustrates test #15 according to one embodiment of the GFCI test method.
Figure 36A:
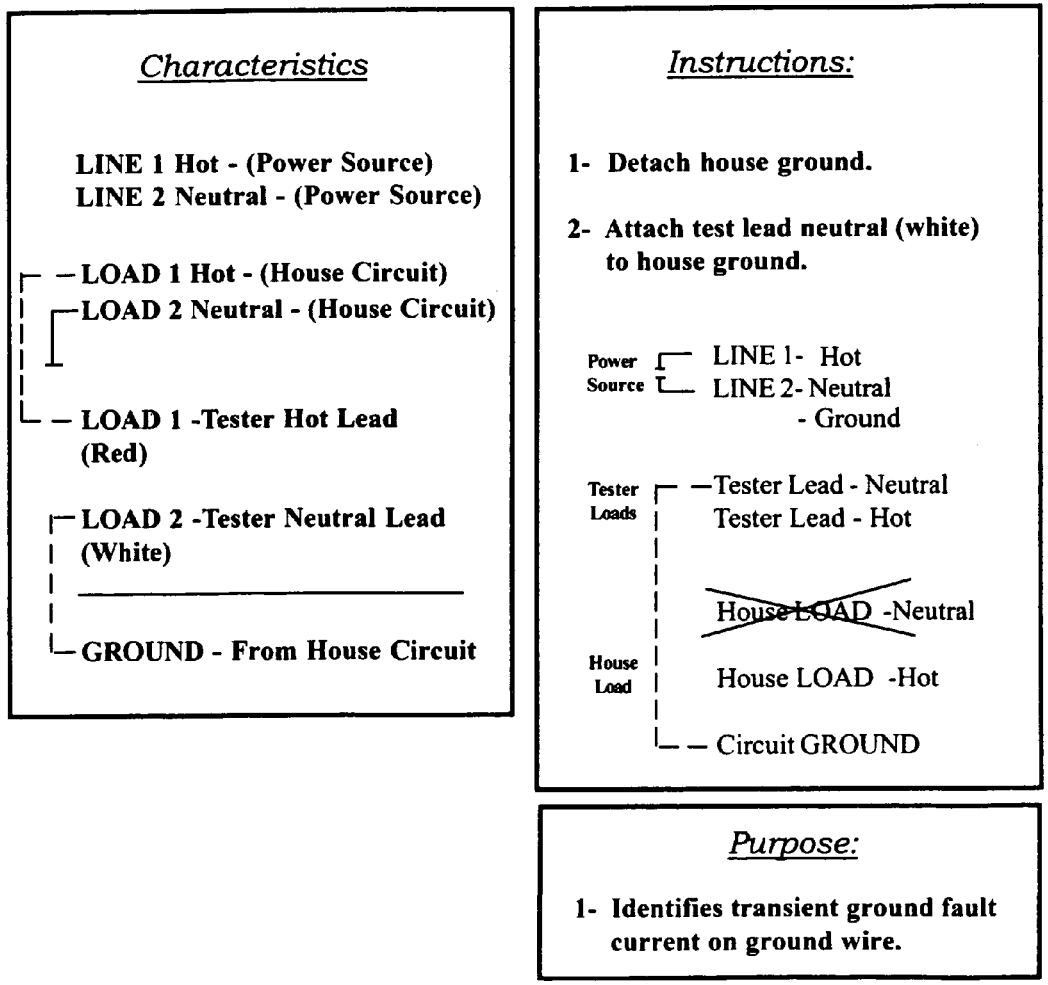
FIG. 36A shows connections for test #15.

FIG. 16 and FIG. 29 illustrate alternative embodiments of the present method. FIG. 16 illustrates circuit test #2 and FIG. 29 illustrates circuit test #7 showing how load neutral wire 140 is opened on house circuit 116. FIGS. 16-17 show house circuit mechanical ground wire 134 intact after house load neutral wire 140 is disengaged. By opening house load neutral wire 140 and disengaging circuit tester load neutral wire 62, any transient ground fault current leakage is directed though ground path wire 134 and detected by grounded neutral coil toroid 108 (FIG. 11) of circuit tester 40, 40A, 66, 72, 72A, or 98. With no ground fault current leakage present in circuit 116, house circuit load current 138 remains constant on house load neutral wire 140.

It is a desired object to utilize the isolated grounding system to detect ground fault current by use of the improved circuit test methods shown in FIGS. 16 and 29. The preferred improved circuit 116 includes an electrical test method by which all electrical circuits 116 are replaced at the circuit overload electrical circuit breaker 110 (FIGS. 12, 22) by AFCI tester 40 or 40A. In this manner, all electrical circuit system segments shown in FIGS. 12 and 22 can be tested for ground fault current leakage greater than 30 mA or 5 mA and arc fault current leakage greater than 50 A or 70 A.

Figure 23:
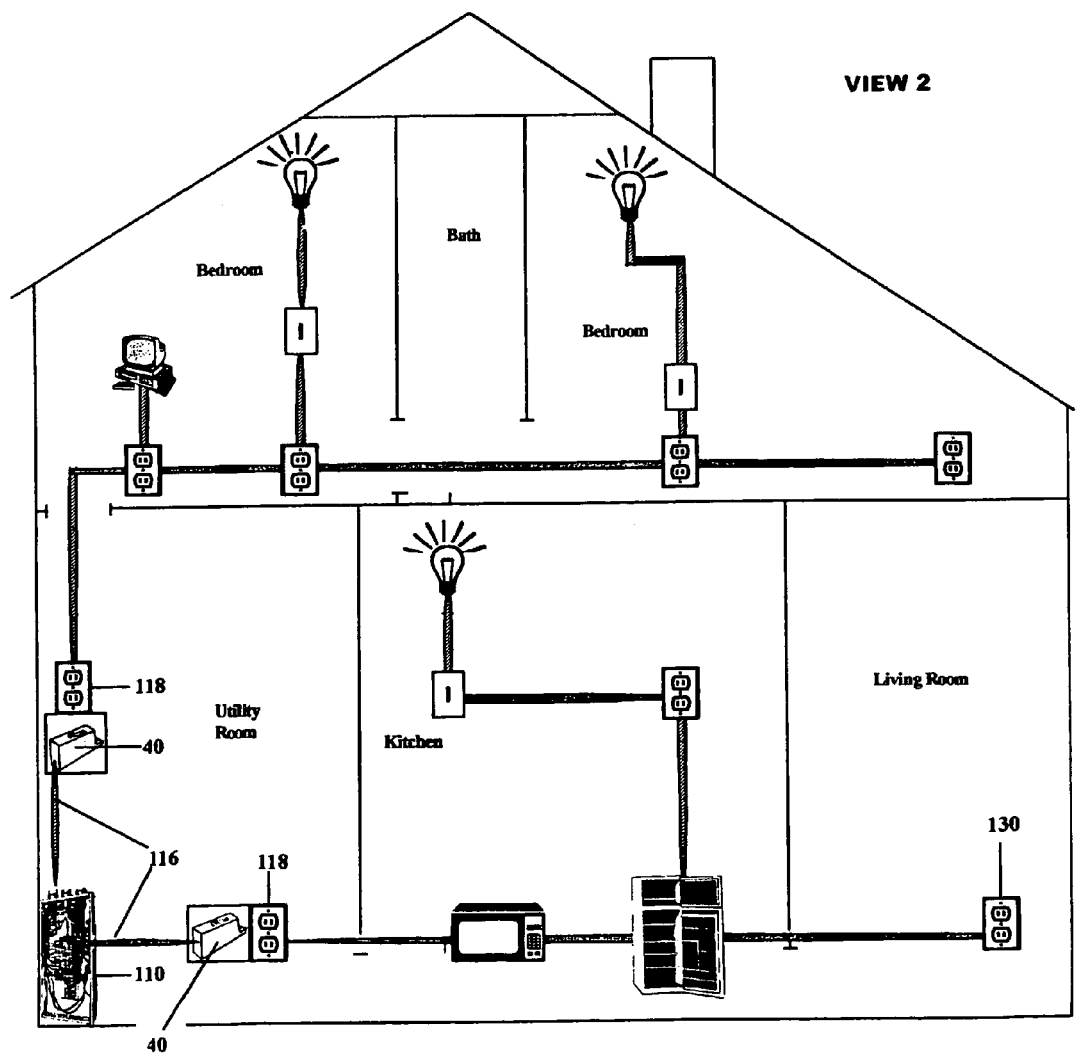
FIG. 23 shows arc fault and ground fault circuit protection at the first electrical outlet for the home of FIG. 22.

In addition to improved electrical circuit 116, FIG. 23 illustrates how AFCI tester 40 or 40A may be moved forward of circuit overload device or standard circuit breaker 132 and utilized at first outlet 118. FIG. 24 illustrates how AFCI tester 40 or 40A may be moved forward of circuit overload device or standard circuit breaker 132 and mounted in adjacent outlet 124 on the other side (after) electrical fault 108.

The methods described herein provide numerous advantages. The improved circuit 116 incorporates the circuit test method shown in FIG. 15 using tester 40 or 40A, and the circuit test method shown in FIG. 28 using tester 72 or 72A, wherein whole house continuous AFCI and GFCI protection is provided for new construction. Circuit 116 has some degree of protection from power surges wherein the methods shut off power to circuit 116 in about 1/40 of a second. When danger exists, circuit 116 cannot be turned on until the electrical fault is corrected. The life of the wiring in circuit 116 and the life of appliances 146 will be extended. A person will be protected against electric shock and electrocution. A structure will be protected against electrical fires. All of these advantages will be acquired by improved AFCI electrical circuit 116 and the circuit test method shown in FIGS. 15 and 28 using tester 40, 40A, 72, or 72A.

Due to equipment adaptability, the above described improved electrical circuit test methods may not be ideally suited for older homes and buildings with vintage breaker or fuse panel technology. Due to circuit failures, the improved test methods may not be desirable for homes or buildings with remodeled complex wiring circuitry. Due to circuit failures, the improved test methods may not be suited for structures with pre-existing ground faults and arc faults. It is therefore necessary to incorporate an improved circuit test method, which overcomes all the above-described obstacles. An AFCI circuit test method, as shown in FIG. 15, using tester 40 or 40A is provided, or a GFCI circuit test method, as shown in FIG. 28, using tester 72 or 72A is provided, wherein tester 40, 40A, 72, or 72A is moved forward of electrical breaker panel 110 to first outlet 118 (FIG. 23).

Figure 26:
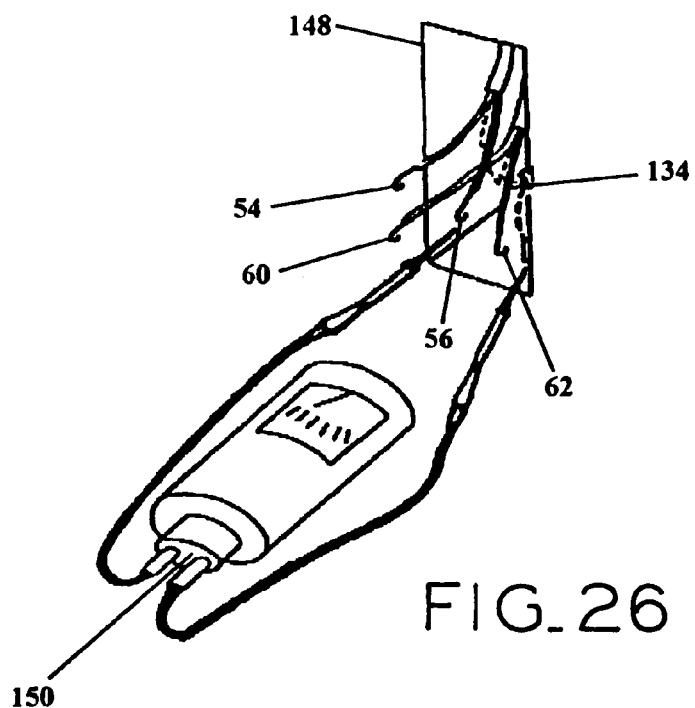
FIG. 26 shows an electric device used for electrical fault troubleshooting.
Figure 27:
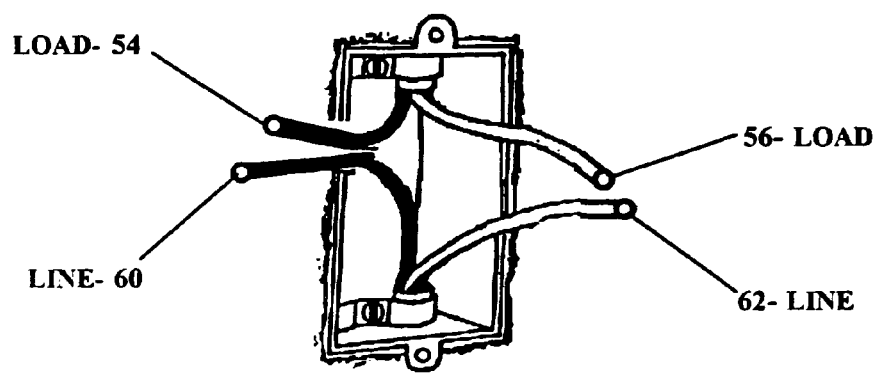
FIG. 27 shows the identification of circuit line and load for use with a method according to one embodiment.

It is a desired object to incorporate a troubleshooting test method shown in FIGS. 26-27, which locates the proximity of first outlet 118 on circuit 116.

In one embodiment, AFCI tester 40 or 40A and GFCI tester 72 or 72A is moved forward of electrical fault 108 of circuit 116 (FIG. 24). The defective LOAD (hot-neutral) wires of fault 108 are terminated, and the LINE (hot-neutral) wires of fault 108 are pigtailed by the method of FIG. 25.

Figure 28:
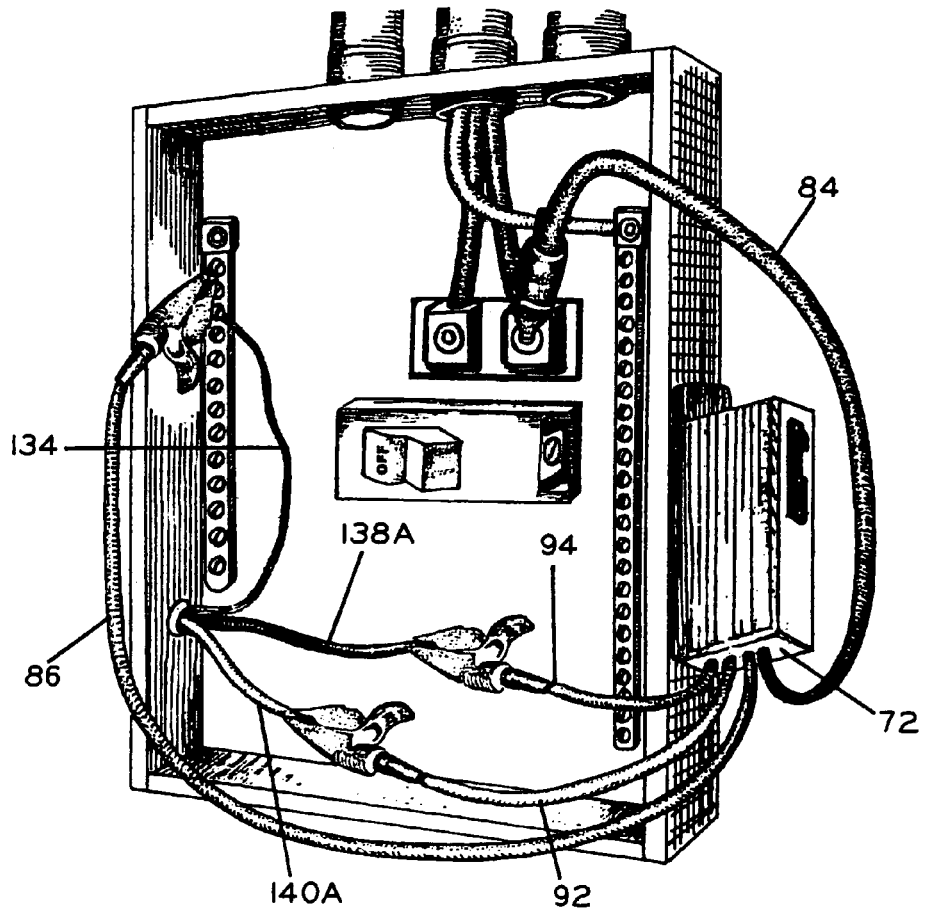
FIG. 28 illustrates test #7 according to one embodiment of the GFCI test method.

AFCI tester 40 or 40A of the circuit test method, as shown in FIG. 15, is connected to line side wires 54, 56, or GFCI tester 72 or 72A of the circuit test method, as shown in FIG. 28, is connected to line side wires 54, 56 until repairs are made.

It is therefore a desired object to incorporate a troubleshooting process by the method of FIG. 23 for experienced electricians to investigate the occurrence of an AFCI trip by the method shown in FIG. 23, and the methods shown in FIGS. 15-20. It is also a desired object to incorporate a troubleshooting test method which locates the proximity of first outlet 118 forward of electrical panel 110 of circuit 116 by the method of FIG. 23. It is also a desired object to incorporate the troubleshooting test method of FIG. 24 for experienced electricians to investigate the occurrence of a GFCI trip by the methods shown in FIGS. 23 and 28-36.

It is also a desired object to incorporate a troubleshooting test method which locates electrical fault 108 of circuit 116 by the methods of FIGS. 15-20, 24, and 28-36. Finally, it is a desired object to incorporate a troubleshooting test method for FIGS. 15-20 and 28-36 to investigate the occurrence of electrical circuit faults which have been moved forward of the original fault of FIG. 24 after a trip has been identified by tester 40, 40A, 72, or 72A.

It is therefore a necessary step to locate the proximity of the middle of circuit 116 by the method of FIG. 24 at one of three checkpoints: outlet 124C, switch 120A, and light 122B. Conductors are disconnected from wire devices and FIG. 26 shows circuit tester 150 being used to determine the location of a power source to circuit 116.

FIG. 27 identifies the separation of line wires 60 and 62 (source of power) from the load wires 54 and 56 (house circuit) to the electrical fault. This test method is repeated in adjacent electrical items 120, 124 until electrical fault 108A is isolated on circuit 116. After electrical fault 108A is isolated, defective load wires 54 and 56 are terminated from tester 40, 40A, 72, or 72A.

During the troubleshooting process or temporary pigtailing repair, as shown in FIG. 25, outlets 124, switches 120, lights 122, and appliances 146, are dead forward of the electrical fault 108A or terminated at outlet wires of FIG. 25.

Thus, all other electrical items 124, 120, 122 which were previously disconnected are reconnected and the power is restored to circuit 116 by resetting circuit breaker 132 in electrical circuit panel 110.

After electrical fault 108A is repaired, circuit 116 is retested by utilizing the circuit tester methods at electrical circuit panel 110 to insure that circuit 116 does not have additional faults. If the electrical fault circuit interrupter of tester 40, 40A, 66, 72, 72A, or 98 resets when connected to circuit 116, circuit 116 is free of faults.

When an electrical fault is detected by improved circuit 116, all electrical circuits are protected from electrical circuit panel 110 (FIG. 22) by an AFCI or GFCI breaker 44, 44A, 76, 76A.

It should be understood that separate circuits 116 exist for each of overload devices 132 of electrical circuit panel 110 illustrated and for each of electrical fault circuit interrupter testers 40, 40A, 72, and 72A illustrated. Each of the circuits include line leads 60, 62, load leads 54, 56 and ground wires within Romex cables or raceway pipes extending either from electrical fault circuit interrupter testers 40, 40A, 72, 72A to outlets 124.

The position of electrical fault circuit interrupter testers 40, 40A, 72, and 72A (FIGS. 23-24) of outlets 124 may be provided with a receptacle type device connected between line leads 60, 62 and load leads 54, 56, and mounted in outlet 124 between overload device 132 and adjacent outlets 124. Both embodiments of improved circuit 116 illustrate the improved circuit.

While the above described test methods and circuit tests utilize an arc fault and a ground fault circuit tester to detect ground fault current leakage greater than 5 mA, 20 mA, or 30 mA and arc fault current leakage greater than 50 A or 70 A, the electrical fault circuit test devices can be used in circuits which are both grounded and ungrounded. The previously described improvement for the circuit testing methods utilize both a grounded and ungrounded circuit for detecting ground fault current leakage and arc fault current leakage. If the circuit is ungrounded and a ground fault current leakage of greater than 30 mA is detected, a parallel current leakage path has formed from circuit 116 to an earth ground source in conjunction with the circuit load current. Such a ground source may be caused by carbon or charcoal produced by arcing and carbon tracking from nail or screw penetrations, a loose connection, insulation cut, contact with aluminum siding, water or gas pipes, a heat duct, furnace, water heater, stucco, wire mesh, or many other types of metallic or conductive building materials. One or more of these may be linked to an earth ground source in some manner.

Figure 12:
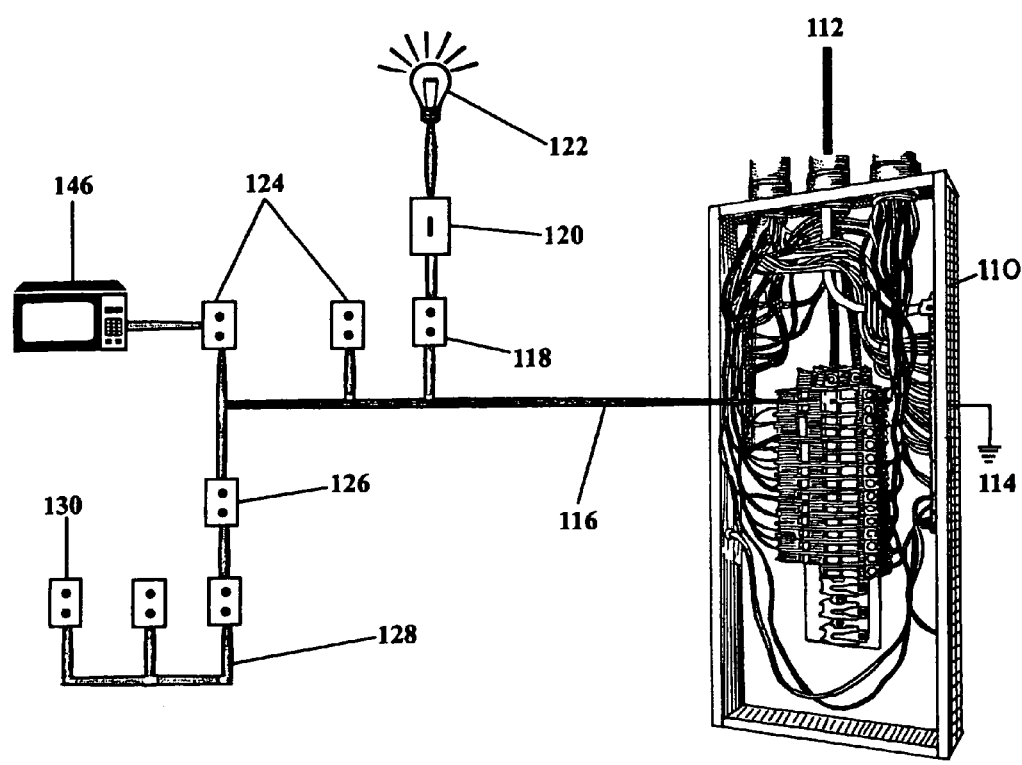
FIG. 12 illustrates a standard circuit and electric panel.
Figure 13:
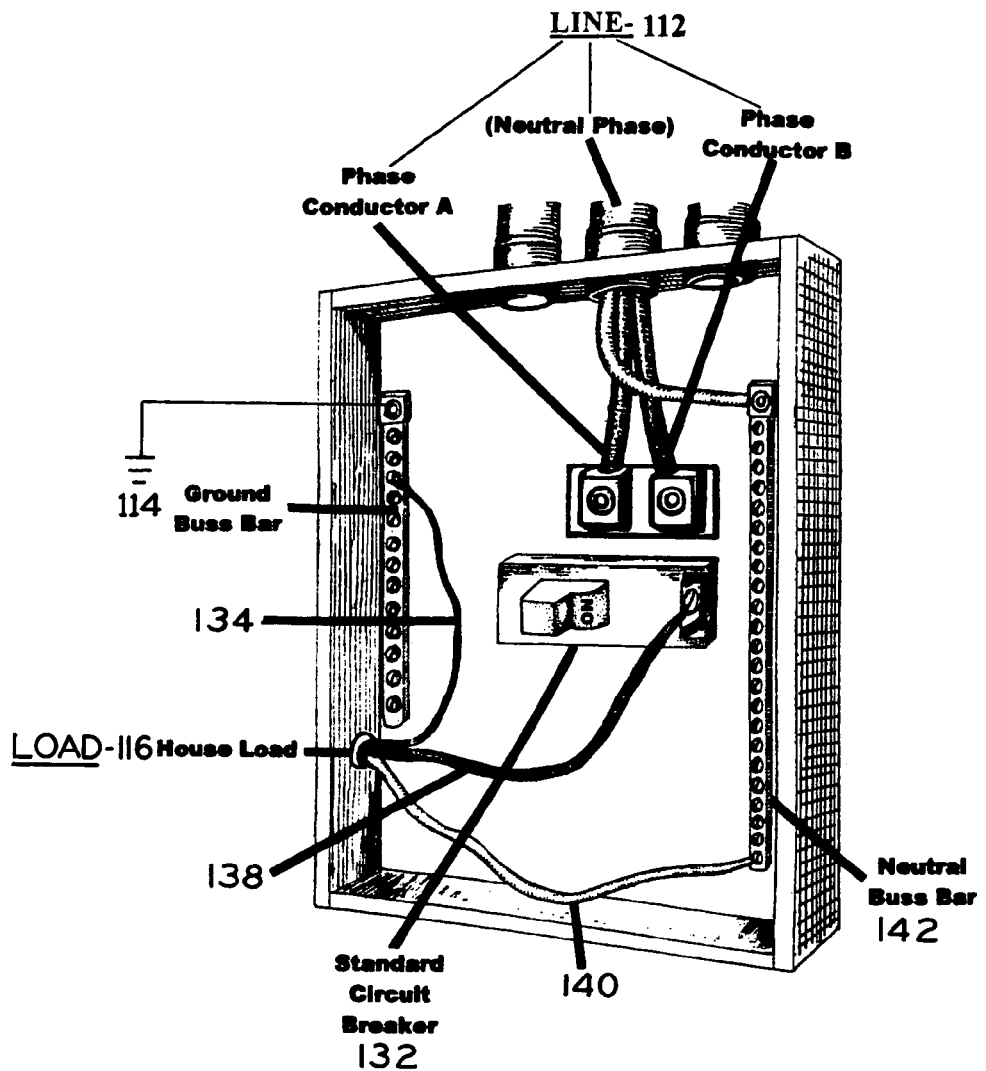
FIG. 13 illustrates a standard circuit breaker panel.

Similarly, the improved electrical circuit 116 is an improvement over standard electrical circuits whether ungrounded or grounded. A difference between an ungrounded and grounded circuit is a mechanical copper wire which bonds all metallic objects in a building in series with the main electrical panel. The mechanical copper ground wire originates at main electrical circuit panel 110. The next point of connection thereafter, as shown in FIG. 12, illustrates how the first receptacle and outlet 118, light 122, switch 120, or appliance 146 and wire connection box on circuit 116 is connected in series with the last outlet 130, or similar electrical device. Modern grounded systems may be susceptible to both ground fault current leakage and arc fault current leakage due to wiring errors, misuse, and misunderstanding of grounding methods.

Ungrounded electrical systems have no mechanical copper ground wire, and have no means of grounding other than accidental contact or errors made with plumbing and gas pipe systems or driven earth rods. Ungrounded electrical systems may be more susceptible to arc fault current leakage due to aging, misuse, and misunderstanding of grounding methods.

Grounded and ungrounded methods are typically compromised by hazardous transient ground fault and arc fault current leakage. It is therefore a desired object to provide an improved circuit, circuit tester and circuit test method for identifying ground fault and arc fault current leakage in grounding systems for electrical fire protection, and provide a degree of electric shock protection not found with standard circuit breakers.

The AFCI circuit tester and circuit test methods are intended to isolate ground fault and arc fault currents in ungrounded and grounded electrical systems. Without AFCI protection and the circuit test methods described herein, transient ground fault and arc fault current can travel freely and unrestricted in grounded or ungrounded electrical systems without detection. Therefore, the improved AFCI test methods described herein are improvements.

All of the above-described improvements can detect ground fault current leakage greater than 5 mA, 20 mA, or 30 mA between the circuit load hot to ground (in parallel) and the circuit load neutral to ground (in parallel).

All of the above-described improvements can detect arc fault current leakage greater than 50 A or 70 A between the circuit load hot to neutral (in parallel) and the circuit load hot to hot (in series).

Rather than having limited fire protection by standard electrical circuits and test practices, the improved circuit, whether grounded or ungrounded, provides a circuit for new construction in which the circuit and circuit segments can be continuously tested for ground faults and arc faults. In addition, the improved circuit provides a degree of protection from power surges and the life of appliances or wiring is extended. The improved circuit, circuit tester, and circuit methods add a degree of awareness against potentially life threatening hazards. The improved circuit tester method is simple and inexpensive to manufacture and is consistent with the NEC.

In all AFCI tests (FIGS. 15-20), electrical circuits and appliances are tested for arc fault current leakage greater than 50 A or 70 A, and ground fault current leakage greater than 30 mA. One pair of tester wires, a line-hot (black) wire and a line-neutral (green) wire are connected from an arc fault circuit tester to a line-hot and line-neutral power source to energize the circuit tester. One pair of removable tester lead wires, a load-hot (red) wire and a load-neutral (white) wire are connected between the arc fault circuit tester and a house circuit (load-hot) wire and a house circuit (load-neutral) wire. It should be noted that, in all AFCI tests shown in FIGS. 15-20, a mechanical ground wire is utilized. Throughout this document, power source refers to any available power source, such as the power supplied by the electrical circuit or a battery, which provides sufficient voltage and current to power the testers.

Figure 22C:
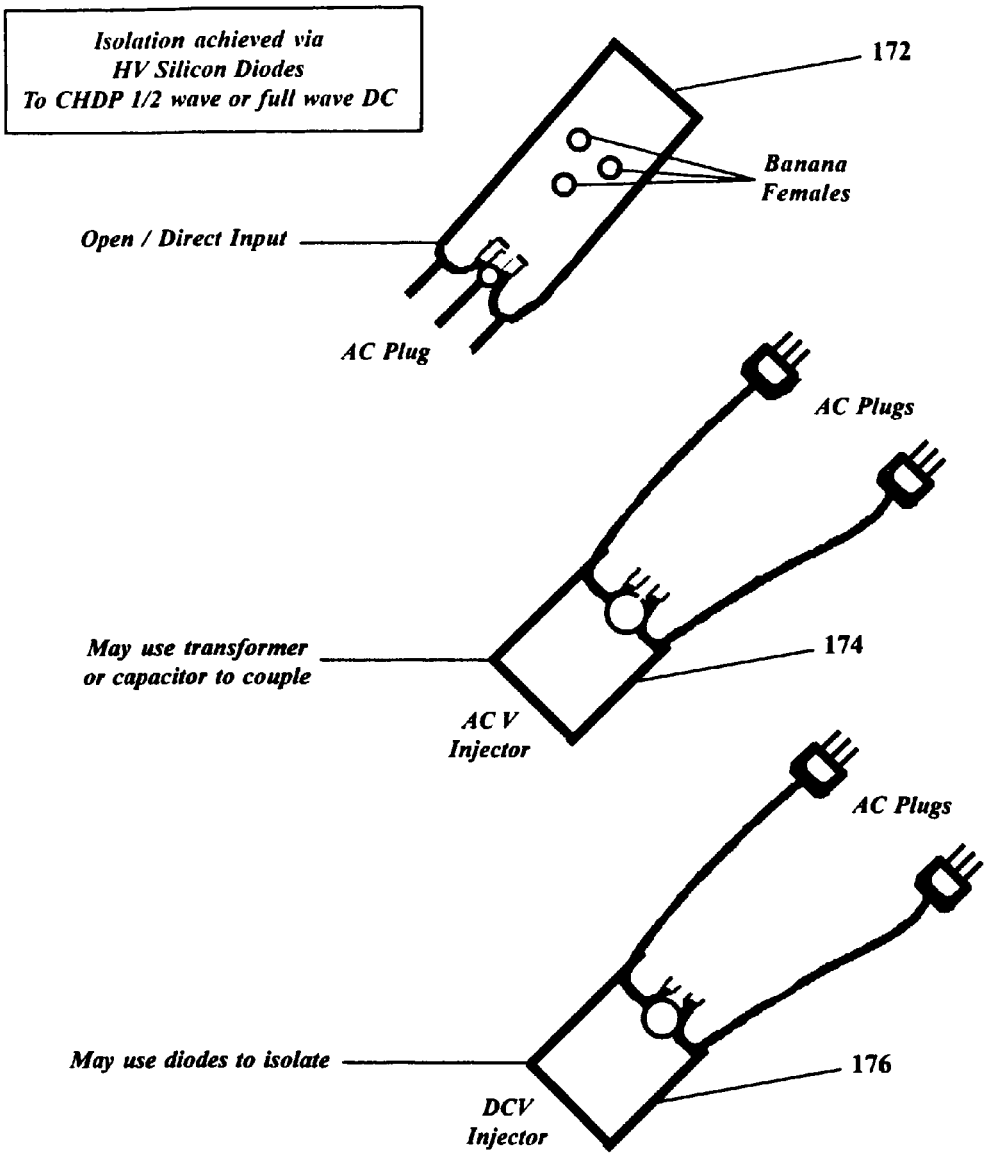
FIG. 22C illustrates the CTMS signal test injectors.
Figure 22D:
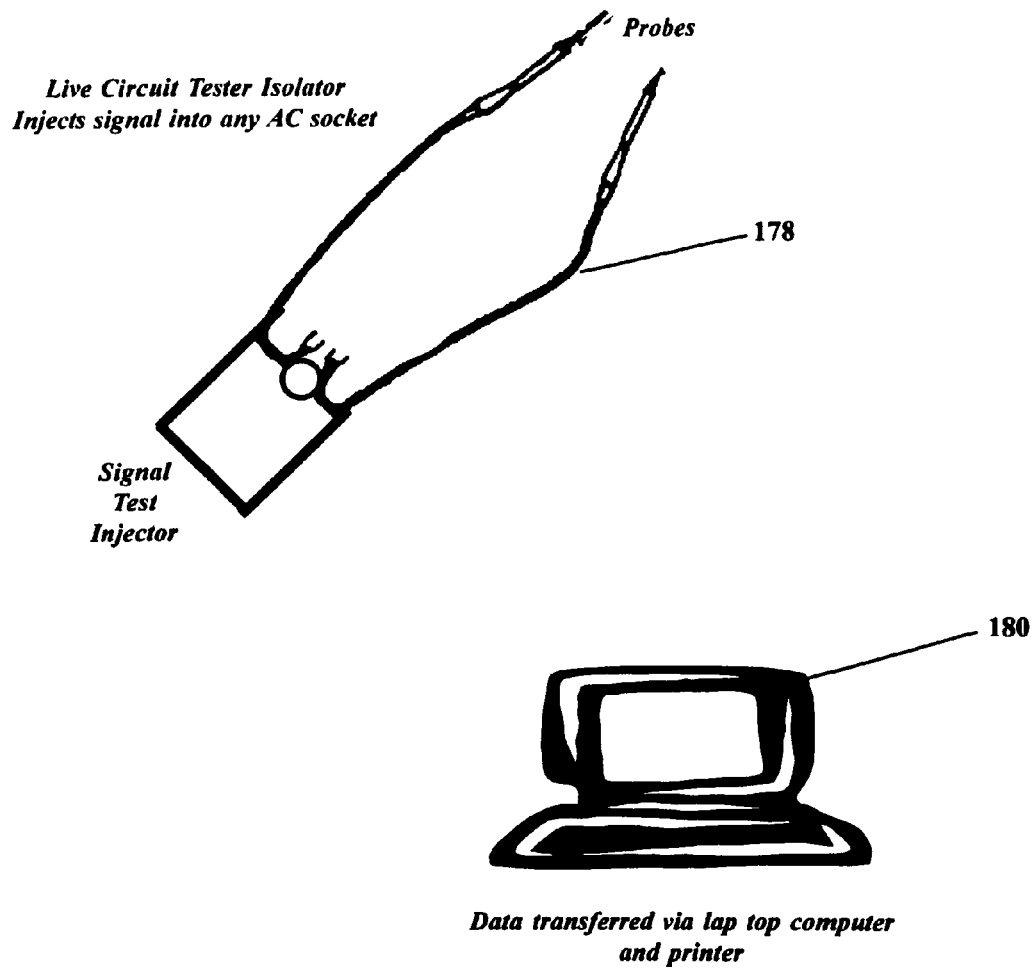
FIG. 22D illustrates the CTMS accessories.

In another embodiment, any number of testers 40, 40A, 66, 72, 72A, and 98 may be permanently implemented in electrical circuit panel 110 to provide a system of test breakers, thereby providing constant and complete protection for a home from ground fault and arc fault current leakage. The Circuit Test Monitoring System (CTMS) is an intelligent processor of information consisting of a system of circuit test breakers or tester modules. FIGS. 22A, 22B, and 22C describe an arc fault and ground fault circuit test monitoring station (CTMS) including a plurality of ground fault and arc fault circuit test breakers. The CTMS is an electrical system of diagnostic test devices that analyze the electrical system circuit activity of dwelling occupants. FIG. 22A illustrates the station itself, while FIG. 22B illustrates the CTMS signal test injectors. FIG. 22C depicts the CTMS accessories for use with the CTMS signal test injectors of FIG. 22B.

Figure 14:
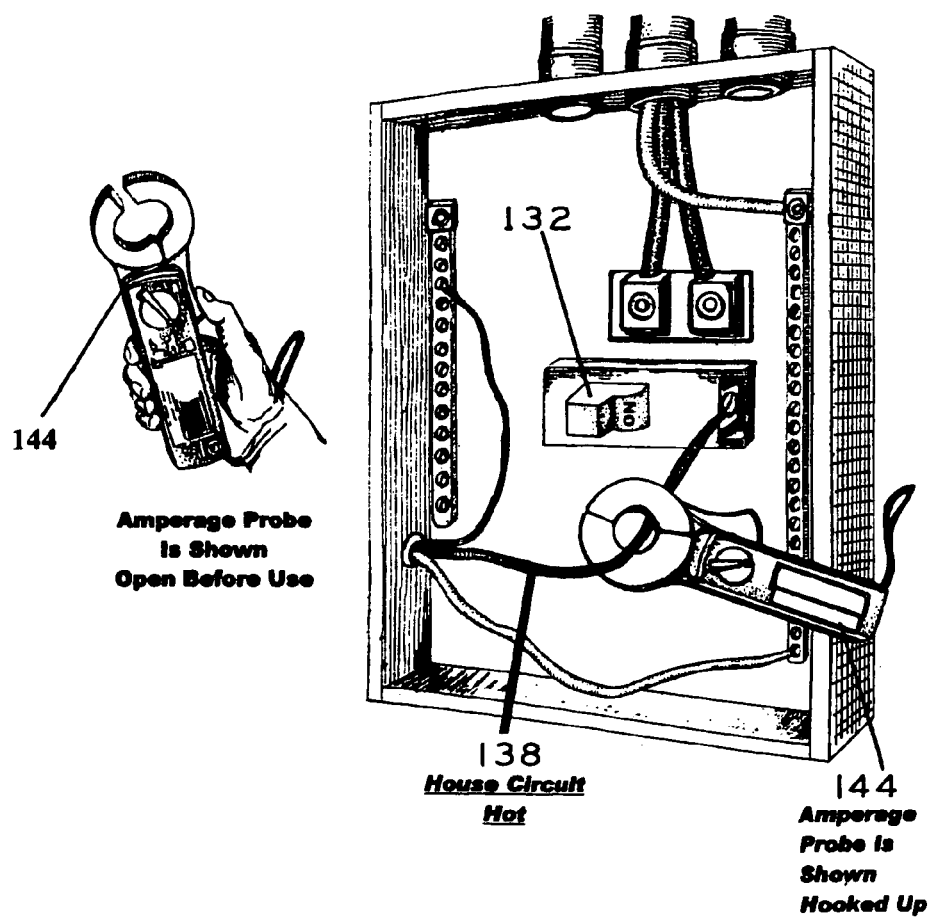
FIG. 14 illustrates a preliminary test according to one embodiment on a standard circuit breaker panel.

In one embodiment, as shown in FIGS. 1-6, a CTMS-1 circuit test device provided. The AFCI/GFCI test device is factory or lab calibrated for a designated test amperage threshold, whereby when an electrical abnormality is detected, a test button is activated. When depressed, a corresponding breaker switch trips to the off position. In another embodiment, as shown in FIG. 14, a CTMS-2 circuit test device provides a digital analog reading to recognize electrical abnormalities. In an exemplary embodiment, as shown in FIG. 14A, a CTMS-3 circuit test device provides a printed circuit format. A CTMS-3 circuit test device can be plugged into a printed computer chip circuit board containing a series of electric diodes that is computer programmed to recognize electrical abnormalities. Thus, the CTMS provides a completely safe 24 hour monitoring station at the main service entrance electrical panel or at various sub-panel locations within a home or commercial building. It is highly desirable to provide circuit test methods which are user friendly and may be adapted to fit various situations which describe the probable nature of an electrical fault, potential fault hazard, the faults severity, the exact location of a fault, the magnitude of any electro magnetic field, and the degree of electrical energy waste. The various methods described herein allow for all valuable information to be collected, logged, processed, disseminated or studied for immediate or future use. The system is user friendly and may provide a service technician with a digital reading in an analog or printed circuit format that describes the probable nature of the problem, potential electrical fault hazard, the faults severity, the faults exact location, the magnitude of electro magnetic field, and degree of energy waste.

The CTMS contact panel consists of expandable contacts of 2-4 contacts per home circuit. Three contacts would be the expected norm. This contact panel is mainly to allow easy and safe access to each home circuit. The panel allows a technician to isolate and inject/sense each circuit condition. These signals to be injected depend on the fault seen, as further described below. This is advantageous when used as an injection site for troubleshooting. The Display/Port module is an add-on device to either the CTMS or the AM2k AFCI/GFCI panel. It senses and displays fault events. The events are voltage surge/sag, duration, loss and time. The keyboard allows limited access to manipulate thresholds. The port allows full programming access. A buzzer alarms at set parameters and may be silenced. The display tells the homeowner of events that may be damaging to appliances that otherwise would not be documented or realized. This is advantageous in the fact it is an affordable data logger for homeowners that shall have certified accuracy. The original AM2k safe homes panel provides all of the above when the display/port panel is added to it. It performs monitoring, logging, and location of events. It performs the safety functions. The signals as described below may be injected through it. It is a monitor and test panel.

The new "satellite" tester may inject the signals described to locate faults as described. Signals may be from 1V to high-voltage AC. This signal may be injected via the contact panel or a circuit component such as an outlet, light socket, etc. (whatever is available). This signal type shall be used to sustain an arc fault to locate/sense the ARC fault via RF/interference. DC voltage from 1 V to high-voltage shall be used to sustain a heated fault junction that may be found via an infrared device. The signals may also be modulated through frequency/amplitude or pulsed to sustain a condition during the troubleshoot/locate phase of a repair operation.

In the portable fault test (PFT) embodiment, the method is user friendly and provides the service technician with a single portable diagnostic test device that can be utilized to detect electrical faults at the main service entrance electrical panel, at various sub-panel locations, or remote locations within electrical system circuit junction boxes. The method can be utilized as a single portable diagnostic troubleshooting tool to isolate an electrical fault problem at remote locations in a system of electrical circuits within a home or commercial building.

In one embodiment, the AFCI/GFCI tester will have a counter built therein. The counter would count every time the breaker trips to show how many times the arc fault or ground fault breakers have to be reset for calibration purposes. The counter may be included as a mechanical counter, for example, using a lever that, when thrown, would roll up another number in a viewing window. The counter may also be digitally included within the tester.

The object of the claims described in this application include (1) two AFCI testers having two pairs of removable test leads with distal ends, and (2) one AFCI tester having three pairs of removable test leads with distal ends, and (3) two GFCI testers having two pairs of removable test leads with distal ends, and (4) one GFCI tester, one AFCI tester having three pairs of removable test leads with distal ends. One pair of removable test lead wires secured thereto is connected to a line hot and line neutral power source in series to energize an AFCI tester. One pair of removable test leads secured thereto is connected between the load hot and load neutral of the AFCI tester in series to power a house circuit load hot and load neutral.

The present concept is intended to cover the following:

Two circuit testers comprising an AFCI having two pairs of removable test leads connected at the base of circuit tester in series for connecting an AFCI between an electrical circuit (load) and the power source (line).

One circuit tester comprising an AFCI having three pairs of removable test leads connected at the base of circuit tester in series for connecting an AFCI between an electrical current (load) and the power source (line).

Two circuit testers comprising a GFCI having two pairs of removable test leads connected at the base of circuit tester in series for connecting a GFCI between an electrical circuit (load) and the power source (line).

One circuit tester comprising of a GFCI and an AFCI having three pairs of removable test leads connected at the base of circuit tester in series for connecting a Ground Fault Interrupter and AFCI between an electrical circuit (load) and the power source (line).

The circuit tester wherein said removable distal test leads is secured thereto.

The circuit tester wherein said AFCI is mounted in a rectangular box having one or more openings said AFCI being within said box, said two pairs of leads extending through said first opening at base of box device, said distal test leads being outside of said box.

The circuit tester wherein said first pair of distal test leads are adapted to be removably connected between circuit load wires, and a said second pair of distal test leads being adapted to be connected to line wires from a power source to indicate ground fault current leakage greater than about 30 mA and arc fault current leakage greater than about 50 A.

The circuit tester wherein said first pair of distal test leads are adapted to be removably connected between circuit load wires, and a said second pair of distal test leads being adapted to be connected to line wires from a power source to indicate ground fault current leakage greater than about 5 mA and arc fault current leakage greater than about 70 A.

The circuit tester wherein said first pair of distal test leads are adapted to be removably connected between circuit load wires, and a said second pair of distal test leads being adapted to be connected to line wires from a power source to indicate ground fault current leakage greater than about 5 mA.

The circuit tester wherein said first pair of distal test leads are adapted to be removably connected between circuit load wires, and a said second pair of distal test leads being adapted to be connected to line wires from a power source to indicate ground fault current leakage greater than about 20 mA.

The circuit tester of wherein a pair of distal test leads are adapted to be removably connected between circuit load wires, and a second pair of distal test leads being adapted to be connected to line wires from a power source to indicate ground fault current leakage greater than about 5 or 20 mA, wherein a pair of distal test leads are adapted to be removably connected between circuit load wires, and said power source to indicate arc fault current leakage greater than 50 A or 70 A.

The method wherein said defining step includes isolating line voltage from said circuit at said center of said circuit at said circuit overload device.

A circuit test method wherein said testing comprises an electrical circuit having a circuit overload device, several electrical outlets and at least one appliance connecting in parallel outlets and at least one appliance connected in parallel comprising; defining said electrical outlet, appliance and said overload device of said circuit.

A circuit test method wherein said test comprises an electrical circuit having a circuit overload device, several electrical outlets and at least one appliance connecting in parallel outlets and at least one appliance connected in parallel comprising: defining said electrical outlet, appliance and said overload device of said circuit for determining the approximate first outlet of said circuit in parallel with said remaining electrical outlets and said overload device of said circuit to indicate ground fault and arc fault circuit leakage.

A circuit test method wherein said test comprises an electrical circuit having a circuit overload device, several electrical outlets and at least one appliance connecting in parallel outlets and at least one appliance connected in parallel comprising: defining said electrical outlet, appliance and said overload device of said circuit for determining the approximate center of said circuit in parallel with said remaining electrical outlets and said overload device.

The method wherein said connecting step includes connecting a circuit tester to said circuit, said circuit tester having an AFCI having two pair of removable test leads connected at the base of circuit tester in series for connecting the electrical Fault Circuit Interrupter between a circuit (load) and the power source (line), to indicate ground fault current leakage and arc fault current leakage.

The method further comprising the successive steps for retesting said circuit to determine that ground faults and arc faults have been located and corrected and said circuit is electrical fault free.

The method herein said test method can identify ground fault current leakage in previously describe amounts within an electrical system between a circuit (load hot and load neutral to ground), whereas an AFCI can identify current leakage in previously described amounts with an electrical system between a circuit (load hot and neutral to ground in parallel), and a circuit (load hot to neutral in parallel), and a (circuit load hot to hot and a load neutral to neutral in series.

The method further comprising repeating said defining step guessing which of said circuit outlets may be the next successive outlet until the middle of the circuit is determined.

The method comprising a circuit, power source, a circuit overload device, a plurality of AFCIs and one or more electrical outlets connected in parallel, one AFCI connected between said overload device and a first of said outlets said overload device connected between said power source and said one AFCI, and another AFCI connected between said first of said outlets and another of said outlets.

The method comprising a circuit, power source, a circuit overload device, a plurality of GFCIs and one or more electrical outlets connected in parallel, one GFCI connected between said overload device and a first of said outlets said overload device connected between said power source and said one AFCI, and another GFCI connected between said first of said outlets and another of said outlets.

The method comprising six test methods for utilizing an arc fault interrupter circuit tester to detect current leakage in a circuit.

The method comprising nine test methods for utilizing a ground fault interrupter circuit tester to detect current leakage in a circuit.

The method comprising two-test methods for detecting the type and severity of the current leakage.

The method comprising six test methods for utilizing an AFCI tester for detecting what part of the circuit ground fault current leakage is occurring.

The method comprising one test method for utilizing an AFCI tester for detecting what part of the circuit arc fault current leakage is occurring.

The method comprising nine test methods for utilizing a ground fault interrupter circuit tester for detecting what part of the circuit the ground fault current leakage is occurring.

The method comprising an electrical circuit troubleshooting method for isolating the circuit location of the ground fault or arc fault current leakage.

The method comprising an electrical circuit, which will be interrupted whenever there is ground fault current leakage or arc fault current leakage in previously described amounts.

The method comprising the fusing or stoppage of current leakage from a circuit neutral conductor which will be interrupted whenever there is ground fault current leakage indicated in an amount greater than 5, 20, or 30 mA. Note: In a conventional electrical wiring system, only a circuit hot is fuse protected, whereas a breaker is placed ahead of a circuit.

The method comprising the fusing or stoppage of current leakage from a circuit neutral whenever there is an arc fault amperage leakage indicated in an amount greater than 50 A.

The method comprising the disengaging of circuit neutral conductors within all the electrical breaker or fuse panels.

The method comprising the isolation if the electrical grounding system.

The method comprising the loading of circuits to perform live circuit tests.

The method comprising a check list before the start of testing.

The method comprising arc fault interrupter circuit tester and ground fault circuit tester having two or three pairs of removable tester leads with distal ends.

The method comprises circuit test method #1 whereas an arc fault interrupter circuit tester having two pairs of removable tester leads with distal ends, one pair of tester wires (black and green) are connected in series between a line hot and line neutral power source to energize the circuit tester. Whereas, for test method #1, a (load hot) tester wire (red) is connected in series between an AFCI tester, and a house circuit load hot (black). Whereas, one (load neutral) tester wire (white) connects in series from the arc fault circuit tester to a circuit (load neutral), commonly white. Whereas, circuit test method #1 indicated ground fault current leakage on circuit load hot, on switched hot leg, on appliance hot, on circuit load hot, on appliance neutral and arc fault current leakage anywhere on circuit.

The method comprises circuit test method #2 whereas an arc fault interrupter circuit tester having two pairs of removable tester leads with distal ends, one pair of line tester (black and green) are connected in series between a line hot and line neutral power source to energize the circuit tester. Whereas, for circuit test method #2, a (load hot) tester lead wire (red) is connected in series between the arc fault interrupter circuit tester, and the house circuit (load hot), commonly black. Whereas, one (load neutral) tester lead wire (white) from the arc fault circuit tester, is not connected for this test. Whereas, a house circuit load neutral (white), is disconnected from circuit for this test. Whereas, test #2 indicates ground fault current leakage on the load hot, load neutral, on switched neutral, on switch hot, on appliance hot, on appliance neutral, or arc fault current leakage anywhere on the circuit.

The method comprises circuit test method #3 whereas an arc fault interrupter circuit tester having two pairs of removable tester leads with removable distal ends, one pair of tester wires (black and green) are connected in series between a line hot and line neutral power source to energize the circuit tester. Whereas, for circuit test method #3, one removable (load hot—red) tester lead wire from arc fault circuit tester is connected to a house circuit load neutral (white). Whereas, one removable (load neutral—white) tester lead wire from arc fault circuit tester is connected to a house circuit load hot (black). Whereas, test #3 indicates ground fault current leakage on the load hot, load neutral, on switched neutral, on switch hot, on appliance hot, on appliance neutral, or arc fault current leakage anywhere on the circuit.

The method comprises circuit test method #4 whereas an arc fault interrupter circuit tester having two pairs of removable tester leads with removable distal ends, one pair of tester wires (black and green) are connected in series between a line hot and line neutral power source to energize the circuit tester. Whereas, for circuit test method #4, one removable (load hot—red) tester lead wire from arc fault circuit tester is not utilized for this test. Whereas, one removable (load neutral—white) tester lead wire from arc fault circuit tester is connected to the house circuit load (black) for this test. Whereas, the house circuit load neutral (white) is disconnected for this test. Whereas, test #4 indicates ground fault current leakage on the load hot, load neutral, on switched neutral, on switch hot, on appliance hot, on appliance neutral, or arc fault current leakage anywhere on the circuit.

The method comprises circuit test method #5 whereas an arc fault interrupter circuit tester having two pairs of removable tester leads with removable distal ends, one pair of tester wires (black and green) are connected in series between a line hot and line neutral power source to energize the circuit tester. Whereas, for test method #5, one removable (load hot—red) tester lead wire from arc fault circuit tester is connected to the house circuit load (white). Whereas, one removable (load neutral—white) tester lead wire from arc fault circuit tester is not utilized for this test. Whereas, house circuit load hot (black) is disconnected for test. Whereas, circuit test #5 indicates ground fault current leakage on the load hot, load neutral, on switch hot, on appliance hot, or arc fault current leakage anywhere on the circuit.

The method comprises circuit test method #6 whereas an arc fault interrupter circuit tester having two pairs of removable tester leads with distal ends, one pair of line tester (black and green) are connected in series between a line hot and line neutral power source to energize the circuit tester. Whereas, for circuit test method #6, a (load hot) tester lead wire (red) is connected in series between the arc fault interrupter circuit tester and the house circuit load. Whereas, the house load hot and load neutral are joined together for this test. Whereas, one (load neutral) tester lead wire (white) from the arc fault circuit tester is not connected for this test. Whereas, test #6 indicates ground fault current leakage on the load hot, load neutral, on switched neutral, on switch hot, on appliance hot, on appliance neutral, or arc fault current leakage anywhere on the circuit. Whereas, in all ground fault interrupter circuit tests (FIG. 28 through 36) electrical circuits and appliances are tested for ground fault current leakage exceeding 5 mA or 20 mA. Whereas, one pair of tester wires, a line hot (black) and line neutral (green) are connected from a ground fault interrupter circuit tester to a line-hot and line-neutral power source to energize the circuit tester. Whereas, one pair of removable tester lead wires, a load-hot (red) and a load-neutral (white) are connected between ground fault circuit tester, and a house circuit (load-hot) and a house circuit (load-neutral). Whereas, it should be noted, in all ground fault interrupter circuit tests (FIGS. 28 through 36), a mechanical ground wire is utilized for these tests.

The method comprises circuit test method #7 whereas a ground fault interrupter circuit tester having two pairs of removable tester leads with distal ends, one pair of tester wires (black and green) are connected in series between a line hot and line neutral power source to energize the circuit tester. Whereas, for circuit test method #7, a (load hot) tester wire (red) is connected in series between a GFCI tester, and a house circuit load hot (black). Whereas, one (load neutral) tester wire (white) connects in series from the ground fault circuit tester to a circuit (load neutral), commonly white. Whereas, circuit test method #7 indicates ground fault current leakage on circuit load hot, on switched hot leg, on appliance hot, on circuit load hot, on appliance neutral.

The method comprises circuit test method #8 whereas a ground fault interrupter circuit tester having two pairs of removable tester leads with distal ends, one pair of line tester (black and green) are connected in series between a line hot and line neutral power source to energize the circuit tester. Whereas, for circuit test method #8, a (load hot) tester lead wire (red) is connected in series between the ground fault interrupter circuit tester, and the house circuit (load hot) commonly black. Whereas, one (load neutral) tester lead wire (white) from the ground fault circuit tester is not connected for this test. Whereas, one (load neutral) tester lead wire (white), is disconnected from circuit for this test. Whereas, circuit test #8 indicates ground fault current leakage on the load hot, load neutral, on switched neutral, on switch hot, on appliance hot, on appliance neutral.

The method comprises circuit test method #9 whereas a ground fault interrupter circuit tester having two pairs of removable tester leads with removable distal ends, one pair of tester wires (black and green) are connected in series between a line hot and line neutral power source to energize the circuit tester. Whereas for circuit test method #9, one removable (load hot—red) tester lead wire from ground fault circuit tester is not utilized for this test. Whereas, one removable (load neutral—white) tester lead wire from ground fault circuit tester is connected to a house circuit load neutral (white). Whereas, the house circuit load hot (black) is not connected for this test. Whereas, circuit test #9 indicates ground fault current leakage on the load neutral, on switched load neutral, on appliance neutral and ground faults on circuit hotted-hots.

The method comprises circuit test method #10 whereas, a ground fault interrupter circuit tester having two pairs of removable tester leads with removable distal ends, one pair of tester wires (black and green) are connected in a series between a line hot and line neutral power source to energize the circuit tester. Whereas, for test method #10, one removable (load hot—red) tester lead wire from ground fault circuit tester is connected to a house circuit load neutral (white). Whereas, one removable (load neutral—white) tester lead wire from ground fault circuit tester is connected to a house circuit load hot (black). Whereas, circuit test #10 indicates ground fault current leakage on the load hot, load neutral, on switched hot, on appliance hot, on switched neutral, on appliance neutral, and hotted-hots.

The method comprises circuit test method #11 whereas, a ground fault interrupter circuit tester having two pairs of removable tester leads with removable distal ends, one pair of tester wires (black and green) are connected in a series between a line hot and line neutral power source to energize the circuit tester. Whereas, for circuit test method #11, one removable (load hot—red) tester lead wire from ground fault circuit tester is not utilized for this test. Whereas, one removable (load neutral—white) tester lead wire from ground fault circuit tester is connected to the house circuit load (black) for this test. Whereas, the house circuit load neutral (white) is disconnected for this test. Whereas, circuit test #11 indicates ground fault current leakage on the load hot, load neutral, on switched hot, on appliance hot, on switched neutral, on appliance neutral, and hotted-hots.

The method comprises circuit test method #12 whereas an arc fault interrupter circuit tester having two pairs of removable tester leads with distal ends, one pair of line tester (black and green) are connected in series between a line hot and line neutral power source to energize the circuit tester. Whereas, for circuit test method #12, a (load hot) tester lead wire (red) is connected in series between the arc fault interrupter circuit tester and the house circuit load. Whereas, the house load hot and load neutral are joined together for this test. Whereas, one (load neutral) tester lead wire (white) from the arc fault circuit tester is not connected for this test. Whereas, test #12 indicates ground fault current leakage on the load hot, load neutral, on switched neutral, on switch hot, on appliance hot, on appliance neutral, or arc fault current leakage anywhere on the circuit.

The method comprises circuit test method #13 whereas, a ground fault interrupter circuit tester having two pairs of removable tester leads with removable distal ends, one pair of tester wires (black and green) are connected in series between a line hot and line neutral power source to energize the circuit tester. Whereas, for test method #13, one removable (load hot—red) tester lead wire from ground fault circuit tester is connected to the house circuit load (white). Whereas, one removable (load neutral—white) tester lead wire from ground fault circuit tester is not utilized for this test. Whereas, house circuit load hot (black) is disconnected for the test. Whereas, circuit test #13 indicates ground fault current leakage on the load hot, load neutral, on switched hot, on appliance hot and ground faults on circuit hotted-hots.

The method comprises circuit test method #14 whereas, a ground fault interrupter circuit tester having two pairs of removable tester leads with removable distal ends, one pair of tester wires (black and green) are connected in series between a line hot and line neutral power source to energize the circuit tester. Whereas, for test method #14, one removable (load hot—red) tester lead wire from a ground fault circuit tester is connected to a house circuit load hot (black). Whereas, one removable (load neutral—white) tester lead wire from a ground fault circuit tester is connected to a house circuit load neutral (white). Whereas, the house circuit load mechanical ground wire (bare or green) is disconnected or not utilized for this test. Whereas, circuit test #14, ground fault current leakage should not appear for this test on circuit load hot, on switched hot leg, on appliance hot, on circuit load hot, on appliance neutral if the ground fault current leakage originates on the circuit load mechanical ground wire. Whereas, circuit test #14 is performed for purpose of isolating the source of ground fault current leakage.

The method comprises circuit test method #15 whereas, a ground fault interrupter circuit tester having two pairs of removable tester leads with removable distal ends, one pair of tester wires (black and green) are connected in series between a line hot and line neutral power source to energize the circuit tester. Whereas, for test method #15, one removable (load hot—red) tester lead wire from a ground fault circuit tester is connected to a house circuit load hot (black). Whereas, one removable (load neutral—white) tester lead wire from a ground fault circuit tester is connected to house circuit load mechanical ground wire (bare or green). Whereas, house circuit load neutral (white) is disconnected or not utilized for this test. Whereas, circuit test #15 ground fault current leakage should not appear for this test on the load hot, load neutral, on switched neutral, on switch hot, on appliance hot, on appliance neutral if the ground fault current leakage originates on the circuit load mechanical ground wire. If there is no circuit tester trip under these circumstances, one of three anomalies exist. (1) A circuit load mechanical ground wire is being used as a circuit neutral. (2) A circuit load is connected to another circuit load (a hotted hot). (3) Ground fault current leakage is exposed to a source of ground other than mechanical ground wire. Whereas, circuit test #15 is performed for the purpose of isolating the source of ground fault current leakage.

The method comprising an arc fault interrupter circuit tester, FIGS. 1, 2 having two pairs of removable test leads with removable distal ends and a ground fault interrupter circuit tester, FIGS. 3, 4, having two pairs of removable test leads with removable distal ends. Whereas, the method is a comparison test which demonstrates the potential difference between an arc fault interrupter circuit tester for detecting arc fault current leakage greater than 50 or 70 A and a ground fault circuit tester for detecting arc fault current leakage greater than 5 or 20 mA. Whereas, if an arc fault circuit tester utilizes circuit tests (FIGS. 15 through 20) display a circuit tester trip, test is then repeated by utilizing a ground fault circuit tester (FIGS. 28 through 36). Whereas, if a ground fault circuit test is clear (displaying no circuit tester trip) a logical conclusion points to an arc fault condition comprised of parallel arcing.

The method comprising a test method which utilizes an amperage probe to verify a detectable amount of circuit load current before tests are performed.

Referring now to FIGS. 49-52, an improved circuit tester including a GFCI having two pair of removable test leads with removable alligator clamp distal ends connected at the base of circuit tester in series for connecting the GFCI between an approximate 240 volt electrical circuit (load), and a single test lead connected at the base of circuit tester is series for connecting the GFCI between a circuit tester and a neutral load conductor and/or a ground wire, and an approximate 240 volt power source (line), to indicate ground fault current leakage in an amount greater than about 5 mA, an improved electrical circuit for fusing a circuit neutral conductor or mechanical ground wire which interrupts current flow on a circuit whenever there is amperage leakage about that magnitude, an electrical circuit for isolating a building's mechanical grounding system from live current electrical wiring system, an improved test method for utilizing a circuit tester to detect current leakage in a circuit, to detect the type and severity of current leakage in a circuit, a test method of utilizing the circuit tester for determining what part of a circuit the current leakage is occurring, an improved electrical trouble shooting method for isolating the circuit location of ground fault current leakage, an electrical test method for isolating a building's mechanical grounding system from the live current electrical wiring system, an electrical troubleshooting method for isolating the circuit location of the ground fault current leakage, and an electrical test method for utilizing live electrical current. The reference numerals in FIGS. 49-52 represent substantially the same elements as those described above with the reference numbers as described above multiplied by 1000, except as otherwise described.

While specific embodiments of the invention have been shown and described herein for purposes of illustration, the protection afforded by any patent which may issue upon this application is not strictly limited to the disclosed embodiments; but rather extends to all structures and arrangements which fall fairly within the scope of the claims which are appended hereto.

What is claimed is:

1. A circuit tester apparatus for testing an electrical circuit, the apparatus comprising:
    a first pair of leads connectable to a line side of the electrical circuit;
    a second pair of leads removably connectable to a load side of the electrical circuit;
    an electric component operably coupled to said first and second pair of leads;
    a first plurality of access contacts fixedly connected to said line side; and
    a second plurality of access contacts fixedly connected to said load side,
    wherein said first and second pair of leads are adapted to removably connect to said first and second plurality of access contacts to detect at least one of ground and arc fault current leakage on the electrical circuit with said electric component.

2. The circuit tester apparatus of claim 1, wherein said first pair of leads is connected to said second pair of leads.

3. The circuit tester apparatus of claim 2, wherein said first pair of leads is connected in series to said second pair of leads.

4. The circuit tester apparatus of claim 1, further comprising a third pair of leads removably connectable to said load side of the electrical circuit; and another electric component operably coupled to said third pair of leads to detect the other of ground and arc fault current leakage on the electrical circuit.

5. The circuit tester apparatus of claim 1, further comprising a housing formed of a polymer material, said housing including a plurality of openings through which said first pair of leads and said second pair of leads extend from said housing.

6. The circuit tester apparatus of claim 1, wherein said electric component comprises one of a ground and an arc fault current circuit breaker.

7. The circuit tester apparatus of claim 1, further comprising a counter to count fault instances.

8. The circuit tester apparatus of claim 7, wherein said electric component comprises one of said ground and said arc fault current circuit breaker, and said counter is a mechanical counter which counts each time said circuit breaker trips.

9. The circuit tester apparatus of claim 1, further including a signal injector connectable to said first and second access contacts and selected from the group consisting of an AC plug, an AC Voltage injector, and a DC Voltage injector.

10. The apparatus of claim 9, wherein said load side of said electrical circuit comprises a plurality of load side circuits, further including:
    a third plurality of access contacts connected to said second pair of leads,
    wherein said signal injector is connected to at least one of said third plurality of access contacts and to at least one of said first and second plurality of access contacts to operably couple said electric component to one of said plurality of load side circuits.

11. The apparatus of claim 1, further including a signal converter generating a parameter representative of said leakage current.

12. The apparatus of claim 11, further including a display showing said parameter.

13. The apparatus of claim 11, further including an alarm generating an alert when said parameter exceeds a predetermined threshold.

14. The apparatus of claim 11, further including a processor and a memory for storing said parameter.

15. The apparatus of claim 14, wherein said predetermined threshold is stored in said memory.

* * * * *